(12) United States Patent
Tsubaki

(10) Patent No.: US 7,824,836 B2
(45) Date of Patent: Nov. 2, 2010

(54) PHOTOSENSITIVE COMPOSITION AND PATTERN FORMING METHOD USING THE SAME

(75) Inventor: Hideaki Tsubaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 34 days.

(21) Appl. No.: 11/847,629

(22) Filed: Aug. 30, 2007

(65) Prior Publication Data

US 2008/0274421 A1 Nov. 6, 2008

(30) Foreign Application Priority Data

Sep. 27, 2006 (JP) ............................. 2006-263216

(51) Int. Cl.
*G03F 7/038* (2006.01)
*G03F 7/039* (2006.01)
*G03F 7/20* (2006.01)
*G03F 7/30* (2006.01)

(52) U.S. Cl. .................... 430/270.1; 430/325; 430/326; 430/905; 430/914

(58) Field of Classification Search ........................ None
See application file for complete search history.

(56) References Cited

U.S. PATENT DOCUMENTS

| 2006/0078823 A1 | 4/2006 | Kanda et al. |
| 2006/0166130 A1 | 7/2006 | Ogata et al. |
| 2007/0059639 A1 * | 3/2007 | Kanda et al. .............. 430/270.1 |
| 2007/0072118 A1 * | 3/2007 | Nishiyama et al. ....... 430/270.1 |
| 2007/0141512 A1 * | 6/2007 | Wada et al. .............. 430/270.1 |

FOREIGN PATENT DOCUMENTS

| EP | 1 645 908 A1 * | 4/2006 |
| EP | 1764652 A2 | 3/2007 |
| EP | 1795961 A1 | 6/2007 |
| JP | 5-127369 A | 5/1993 |
| JP | 6-266111 A | 9/1994 |
| JP | 10-307385 A | 11/1998 |
| JP | 2005-309376 | * 11/2005 |
| JP | 2006-243264 | 9/2006 |

OTHER PUBLICATIONS

Machine-assisted English translation of JP 2005-309376 provided by JPO.*
Machine-assisted English translation of JP2006-243264 A (Inabe et al) provided by JPO.*
Extended European Search Report dated Sep. 18, 2008.

* cited by examiner

*Primary Examiner*—Sin J. Lee
(74) *Attorney, Agent, or Firm*—Sughrue Mion, PLLC

(57) ABSTRACT

A photosensitive composition contains: a compound capable of generating an acid upon irradiation with actinic rays or radiation; a basic compound represented by the formula (I-a) as defined herein; a basic compound represented by the formula (I-b) as defined herein; and a surfactant represented by the formula (II) as defined herein.

13 Claims, 1 Drawing Sheet

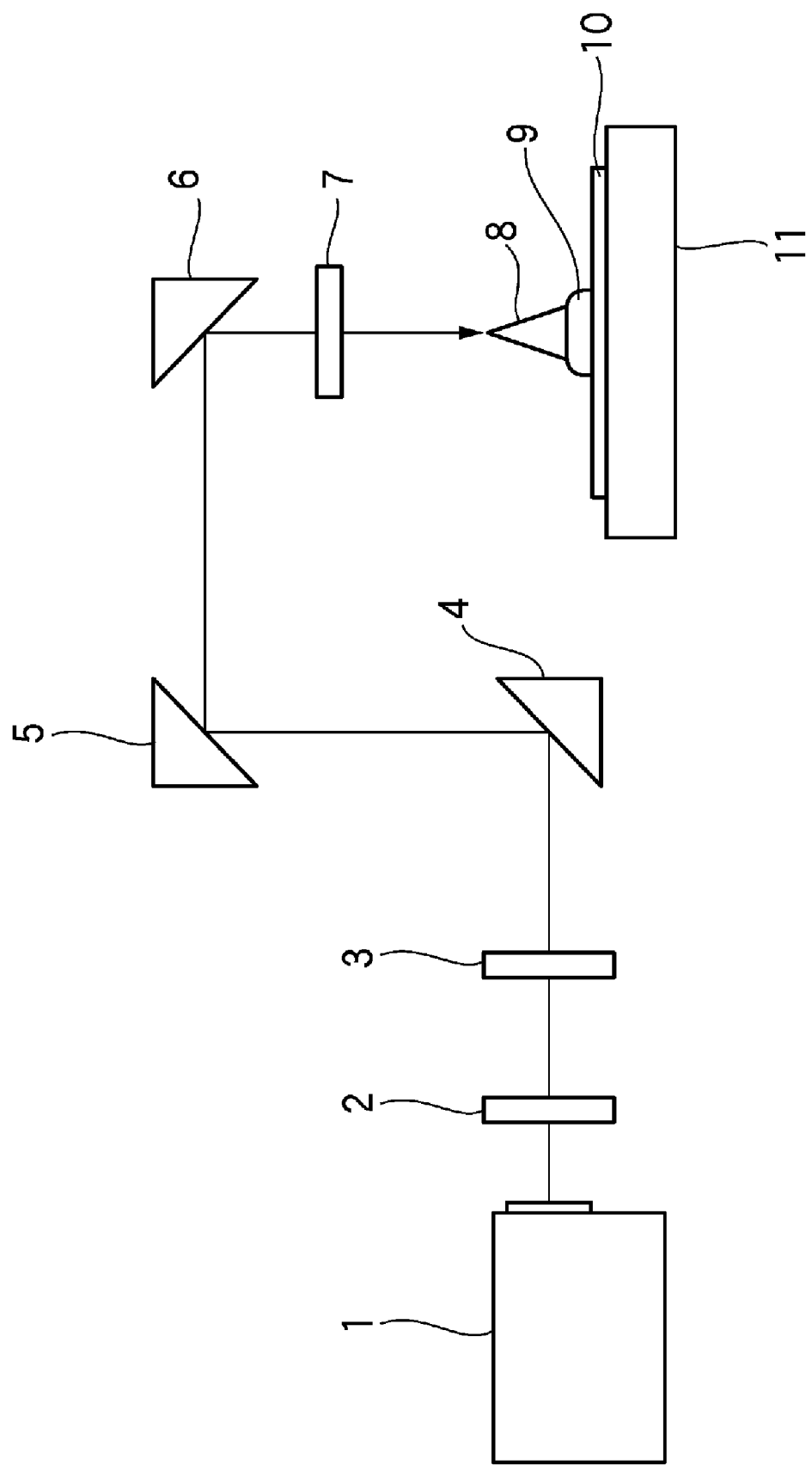

PHOTOSENSITIVE COMPOSITION AND PATTERN FORMING METHOD USING THE SAME

FIELD OF THE INVENTION

The present invention relates to a photosensitive composition for use in the production of a semiconductor such as IC, in the production of a circuit board for liquid crystal, thermal head and the like, and in other photofabrication processes, and a pattern forming method using the photosensitive composition. More specifically, the present invention relates to a photosensitive composition suitable for fine processing of a semiconductor device, where a short-wavelength light energy ray such as far ultraviolet ray, X-ray and electron beam is used, and a pattern forming method using the photosensitive composition.

BACKGROUND OF THE INVENTION

The chemical amplification resist composition is a pattern forming material capable of forming a pattern on a substrate by producing an acid in the exposed area upon irradiation with actinic rays or radiation such as far ultraviolet light and through a reaction using this acid as the catalyst, changing the solubility in a developer between the area irradiated with actinic rays or radiation and the non-irradiated area.

In the case of using a KrF excimer laser as the exposure light source, a resin having small absorption in the region of 248 nm and having a basic skeleton of poly(hydroxystyrene) is predominantly used as the main component, and this is an excellent system capable of forming a good pattern with high sensitivity and high resolution as compared with the conventional naphthoquinonediazide/novolak resin system.

In the case of using a light source of emitting light at a shorter wavelength, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, a resist containing a resin having an alicyclic hydrocarbon structure has been developed for use with an ArF excimer laser.

Furthermore, it has been found that the performance can be enhanced by incorporating a surfactant into the above-described resin having an alicyclic hydrocarbon structure. For example, radial unevenness (striation) is prevented by adding a fluorine-containing surfactant to a positive photoresist composition as described in JP-A-10-307385 (the term "JP-A" as used herein means an "unexamined published Japanese patent application").

Also, as for the basic compound which is a main constituent component of the chemical amplification-type resist composition, various compounds have been found, and photosensitive compositions containing anilines, imidazoles, pyridines or ammonia as the basic compound are disclosed, for example, in JP-A-5-127369 and JP-A-6-266111.

However, in view of integrated performance as the resist, an appropriate combination of the resin, photo-acid generator, basic compound, surfactant, solvent and the like used is actually very difficult to find out, and moreover, it is strongly demanded to satisfy both the resolution performance and the development defect performance.

Here, the development defect indicates troubles in general detected, for example, by the surface defect inspection apparatus (e.g., KLA-2360) of KLA-Tencor Corp. when the resist pattern after development is observed from right above, and examples of this trouble include post-developing scum, foam, dust, bridging between sections of the resist pattern, color unevenness and deposit. The development defect may adversely affect the formation and the like of a fine semiconductor device.

SUMMARY OF THE INVENTION

An object of the present invention is to provide a photosensitive composition ensuring that even in the formation of a fine pattern of approximately from several tens to several hundreds nm, the development defect is reduced and the focus margin is wide (that is, the variation in the line width due to fluctuation of the focal position is small), and a pattern forming method using the photosensitive composition.

As a result of various studies, the present inventors have found that when a compound represented by formula (I-a) and a compound represented by formula (I-b) are used in combination as basic compounds and a compound represented by formula (II) is used as a surfactant, the film loss of the resist is suppressed and this enables enlargement of the focus margin and reduction in the development defect.

The present invention has the following constructions and by virtue of these constructions, the above-described object of the present invention is attained.

(1) A photosensitive composition comprising:

(A) a compound capable of generating an acid upon irradiation with actinic rays or radiation, (B1) a basic compound represented by formula (I-a), (B2) a basic compound represented by formula (I-b), and (H) a surfactant represented by formula (II):

wherein $R^1$, $R^2$ and $R^3$ each independently represents a hydrogen atom, an alkyl group, a cycloalkyl group, an aryl group or a heteroaryl group, and at least one of $R^1$, $R^2$ and $R^3$ have a polar group;

wherein $R^4$, $R^5$ and $R^6$ each independently represents a hydrogen atom, an alkyl group, a cycloalkyl group or an aryl group, and $R^4$, $R^5$ and $R^6$ all have no polar group;

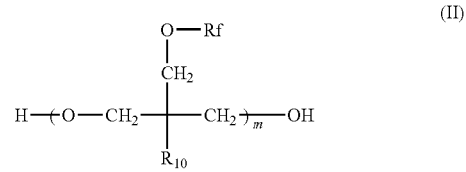

wherein $R_{10}$ represents a hydrogen atom or an alkyl group,

Rf represents a fluoroalkyl group or a fluoroalkylcarbonyl group, and m represents an integer of 1 to 50.

(2) The photosensitive composition as described in (1) above, which further comprises (C) a resin capable of decomposing under the action of an acid to increase the solubility in an alkali developer.

(3) The photosensitive composition as described in (1) above, which further comprises (D) a resin soluble in an alkali developer and an acid crosslinking agent capable of crosslinking with (D) the resin soluble in an alkali developer, under the action of an acid.

(4) The photosensitive composition as described in any one of (1) to (3) above, wherein (B1) the basic compound represented by formula (I-a) is a compound represented by formula (I-a1):

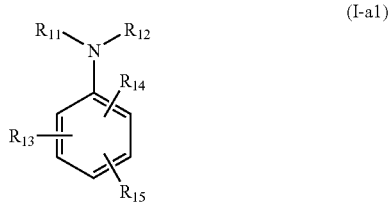

wherein $R^{11}$ and $R^{12}$ each independently represents a hydrogen atom, an alkyl group, a cycloalkyl group, an aryl group or a heteroaryl group, $R^{13}$, $R^{14}$ and $R^{15}$ each independently represents a hydrogen atom, an alkyl group, a cycloalkyl group or an aryl group, and at least one of $R^{11}$, $R^{12}$, $R^{13}$, $R^{14}$ and $R^{15}$ have a polar group.

Furthermore, preferred embodiments of the present invention are as follows.

(5) The positive photosensitive composition as described in (2) above, wherein the resin (C) has a hydroxystyrene structural unit.

(6) The positive photosensitive composition as described in (2) above, wherein the resin (C) contains a repeating unit having a monocyclic or polycyclic alicyclic hydrocarbon structure.

(7) The positive photosensitive composition as described in (2) above, wherein the resin (C) is a resin which contains a repeating unit having an alcoholic hydroxyl group and decomposes under the action of an acid to increase the solubility in an alkali developer.

(8) The photosensitive composition as described in (7) above, wherein the repeating unit having an alcoholic hydroxyl group, contained in the resin (C), has a monohydroxyadamantane structure, a dihydroxyadamantane structure or a trihydroxyadamantane structure.

(9) The photosensitive composition as described in (2) above, wherein the resin (C) is a resin containing a repeating unit having a lactone structure.

(10) The photosensitive composition as described in (2) above, wherein the resin (C) is a resin containing at least one kind of a methacrylic acid ester-based repeating unit and at least one kind of an acrylic acid ester-based repeating unit.

(11) The positive photosensitive composition as described in (2) above, wherein the resin (C) has a fluorine atom in the main chain or the side chain.

(12) The positive photosensitive composition as described in (11) above, wherein the resin (C) has a hexafluoro-2-propanol structure.

(13) The positive photosensitive composition as described in any one of (2) and (5) to (12) above, which further comprises (F) a dissolution inhibiting compound capable of decomposing under the action of an acid to increase the solubility in an alkali developer and having a molecular weight of 3,000 or less.

(14) The positive photosensitive composition as described in any one of (1) to (3) and (5) to (13) above, which further comprises (G) at least one kind of a surfactant out of a fluorine-containing surfactant and a silicon-containing surfactant.

(15) The positive photosensitive composition as described in (6) above, wherein the resin (C) contains at least one kind of a repeating unit selected from a repeating unit comprising 2-alkyl-2-adamantyl(meth)acrylate and a repeating unit comprising dialkyl(1-adamantyl)methyl(meth)acrylate, at least one kind of a repeating unit having a lactone structure, and at least one kind of a repeating unit having a hydroxyl group.

(16) The positive photosensitive composition as described in (15) above, wherein the resin (C) further contains a repeating unit having a carboxy group.

(17) The positive photosensitive composition as described in (2) above, wherein the resin (C) contains at least one kind of a repeating unit comprising 2-alkyl-2-adamantyl(meth) acrylate or dialkyl(1-adamantyl)methyl(meth)acrylate, and at least one kind of a repeating unit having a hydroxystyrene structure.

(18) A pattern forming method comprising steps of forming a photosensitive film from the photosensitive composition described in any one of (1) to (17), and exposing and developing the photosensitive film.

The photosensitive composition of the present invention ensures reduced development defect and wide focus margin even in the formation of a fine pattern of approximately from several tens to several hundreds nm, so that a good fine pattern can be produced with high productivity.

BRIEF DESCRIPTION OF THE DRAWING

The drawing is a schematic view of the two-beam interference exposure testing apparatus.

DESCRIPTION OF NUMERICAL REFERENCES

1 Laser
2 Diaphragm
3 Shutter
4, 5, 6 Reflecting mirrors
7 Condenser lens
8 Prism
9 Immersion liquid
10 Wafer with antireflection film and resist film
11 Wafer stage

DETAILED DESCRIPTION OF THE INVENTION

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The positive photosensitive composition, preferably the positive resist composition, of the present invention generally comprises a resin capable of decomposing under the action of an acid to increase the solubility in an alkali developer and, if desired, further comprises a dissolution inhibiting compound capable of decomposing under the action of an acid to increase the solubility in an alkali developer and having a molecular weight of 3,000 or less.

The negative photosensitive composition, preferably the negative resist composition, of the present invention generally comprises a resin soluble in an alkali developer and an acid crosslinking agent capable of crosslinking with the alkali developer-soluble resin under the action of an acid.

[1] Compound Capable of Generating an Acid Upon Irradiation with Actinic Rays or Radiation (Component A)

The photosensitive composition of the present invention comprises a compound capable of generating an acid upon irradiation with actinic rays or radiation. As regards such an acid generator, a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist and the like, or a mixture thereof may be appropriately selected and used.

Examples thereof include diazonium salt, phosphonium salt, sulfonium salt, iodonium salt, imidosulfonate, oxime sulfonate, diazodisulfone, disulfone and o-nitrobenzyl sulfonate.

Also, a compound where the above-described group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Among the compounds capable of decomposing upon irradiation with actinic rays or radiation to generate an acid, which may be used in combination, the compounds represented by the following formulae (ZI), (ZII) and (ZIII) are preferred.

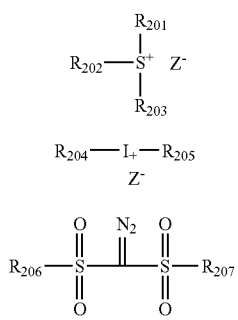

In formula (ZI), $R_{201}$, $R_{202}$ and $R_{203}$ each independently represents an organic group.

$Z^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes the organic anions represented by the following formulae AN1 to AN4:

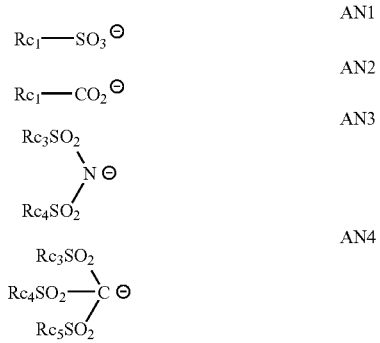

In the formulae, $Rc_1$ represents an organic group.

The organic group of $Rc_1$ includes an organic group having a carbon number of 1 to 30 and is preferably an alkyl or aryl group which may be substituted, or a group where a plurality of these groups are connected through a single bond or a linking group such as —O—, —$CO_2$—, —S—, —$SO_3$— and —$SO_2N(Rd_1)$—.

$Rd_1$ represents a hydrogen atom or an alkyl group and may form a ring structure with the alkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably replaced by a hydrogen atom, and the number of hydrogen atoms is preferably larger than the number of fluorine atom. The absence of a perfluoroalkyl group having a carbon number of 5 or more enables reduction in the toxicity to ecology.

The most preferred embodiment of $Rc_1$ is a group represented by the following formula.

$$Rc_7\text{-}Ax\text{-}Rc_6\text{-}$$

$Rc_6$ is a perfluoroalkylene group having a carbon number of 4 or less, preferably from 2 to 4, more preferably 2 or 3, or a phenylene group substituted by from 3 to 5 fluorine atoms and/or from 1 to 3 fluoroalkyl groups.

Ax is a linking group (preferably a single bond, —O—, —$CO_2$—, —S—, —$SO_3$— or —$SO_2N(Rd_1)$—). $Rd_1$ represents a hydrogen atom or an alkyl group and may combine with $Rc_7$ to form a ring structure.

$Rc_7$ is a hydrogen atom, a fluorine atom, a linear or branched, monocyclic or polycyclic alkyl group which may be substituted, or an aryl group which may be substituted. The alkyl group and the aryl group, which each may be substituted, preferably contain no fluorine atom as the substituent.

$Rc_3$, $Rc_4$ and $Rc_5$ each represents an organic group.

The preferred organic groups for $Rc_3$, $Rc_4$ and $Rc_5$ are the same as the preferred organic groups in $Rc_1$.

$Rc_3$ and $Rc_4$ may combine to form a ring.

The group formed after $Rc_3$ and $Rc_4$ are combined includes an alkylene group and an arylene group and is preferably a perfluoroalkylene group having a carbon number of 2 to 4. When $Rc_3$ and $Rc_4$ combine to form a ring, the acidity of the acid generated upon irradiation with light increases and this is preferred because the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed after two members out of $R_{201}$ to $R_{203}$ are combined includes an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear, branched or cyclic alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group and alkyl group of $R_{201}$ to $R_{203}$ each may have, as the substituent, an alkyl group (for example, an alkyl group having a carbon number of 1 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear, branched or cyclic alkyl group having a carbon number of 1 to 12 or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group as $R_{201}$ to $R_{203}$ may be linear, branched or cyclic and is preferably a linear or branched alkyl group having a carbon number of 1 to 10 (e.g., methyl, ethyl, propyl, butyl, pentyl) or a cyclic alkyl group having a carbon number of 3 to 10 (e.g., cyclopentyl, cyclohexyl, norbornyl).

The 2-oxoalkyl group as $R_{201}$ to $R_{203}$ may be linear, branched or cyclic and is preferably a group having >C=O at the 2-position of the above described alkyl group.

The alkoxy group in the alkoxycarbonylmethyl group as $R_{201}$ to $R_{203}$ is preferably an alkyl group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

Two members out of $R_{201}$ to $R_{203}$ may combine to form a ring structure, and the ring may contain an oxygen atom, a sulfur atom, an ester bond, an amide bond or a carbonyl group. The group formed after two members out of $R_{201}$ to $R_{203}$ are combined includes an alkylene group (e.g., butylene, pentylene).

The compound (ZI-3) is a compound represented by the following formula (ZI-3), and this is a compound having a phenacylsulfonium salt structure.

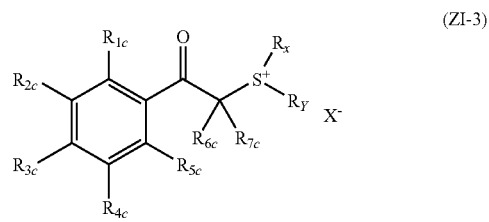

(ZI-3)

$R_{1c}$ to $R_{5c}$ each independently represents a hydrogen atom, an alkyl group, an alkoxy group or a halogen atom.

$R_{6c}$ and $R_{7c}$ each represents a hydrogen atom or an alkyl group.

$R_x$ and $R_y$ each independently represents an alkyl group, a 2-oxoalkyl group, an alkoxycarbonylmethyl group, an allyl group or a vinyl group.

Any two or more members out of $R_{1c}$ to $R_{5c}$ or a pair of $R_x$ and $R_y$ may combine with each other to form a ring structure, and the ring structure may contain an oxygen atom, a sulfur atom, an ester bond or an amide bond.

The alkyl group as $R_{1c}$ to $R_{5c}$ may be linear, branched or cyclic and includes, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl) and a cyclic alkyl group having a carbon number of 3 to 8 (e.g., cyclopentyl, cyclohexyl).

The alkoxy group as $R_{1c}$ to $R_{5c}$ may be linear, branched or cyclic and includes, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, or linear or branched pentoxy) and a cyclic alkoxy group having a carbon number of 3 to 8 (e.g., cyclopentyloxy, cyclohexyloxy).

A compound where any one of $R_{1c}$ to $R_{5c}$ is a linear, branched or cyclic alkyl group or a linear, branched or cyclic alkoxy group is preferred, and a compound where the sum of carbon numbers of $R_{1c}$ to $R_{5c}$ is from 2 to 15 is more preferred. By virtue of this construction, the solubility in a solvent is more enhanced and generation of particles during storage is suppressed.

Examples of the alkyl group as $R_x$ and $R_y$ include the same as those of the alkyl group as $R_{1c}$ to $R_{5c}$.

Examples of the 2-oxoalkyl group include a group having >C=O at the 2-position of the alkyl group as $R_{1c}$ to $R_{5c}$.

Examples of the alkoxy group in the alkoxycarbonylmethyl group are the same as those of the alkoxy group as $R_{1c}$ to $R_{5c}$.

Examples of the group formed after $R_x$ and $R_y$ are combined include a butylene group and a pentylene group.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, or an alkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be linear, branched or cyclic and is preferably a linear or branched alkyl group having a carbon number of 1 to 10 (e.g., methyl, ethyl, propyl, butyl, pentyl) or a cyclic alkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $Z^-$ in formula (ZI).

Among the compounds capable of decomposing upon irradiation with actinic rays or radiation to generate an acid, which may be used in combination, the compounds represented by the following formulae (ZIV), (ZV) and (ZVI) also preferred.

$$Ar_3-SO_2-SO_2-Ar_4 \quad \text{ZIV}$$

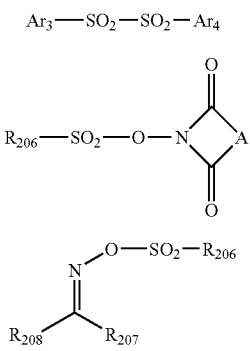

In formulae (ZIV) to (ZVI), $Ar_3$ and $Ar_4$ each independently represents a substituted or unsubstituted aryl group.

$R_{206}$ represents a substituted or unsubstituted alkyl group or a substituted or unsubstituted aryl group.

$R_{207}$ and $R_{208}$ each represents a substituted or unsubstituted alkyl group, a substituted or unsubstituted aryl group, or an electron-withdrawing group. $R_{207}$ is preferably a substituted or unsubstituted aryl group.

$R_{208}$ is preferably an electron-withdrawing group, more preferably a cyano group or a fluoroalkyl group.

A represents a substituted or unsubstituted alkylene group, a substituted or unsubstituted alkenylene group or a substituted or unsubstituted arylene group.

Among the compounds capable of decomposing upon irradiation with actinic rays or radiation to generate an acid, the compounds represented by formulae (ZI) to (ZIII) are preferred, the compounds represented by formula (ZI) are more preferred, and the compounds represented by formulae (ZI-1) to (ZI-3) are most preferred.

Furthermore, a compound capable of generating an acid represented by any one of the following formulae AC1 to AC3 upon irradiation with actinic rays or radiation is preferred.

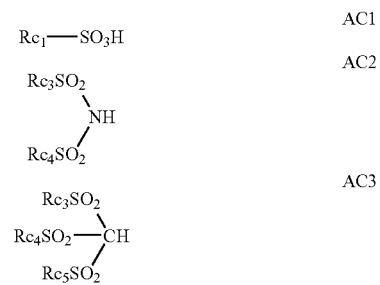

That is, the most preferred embodiment of the component (A) is a compound where in the structure of formula (ZI), $X^-$ is an anion selected from AN1, AN3 and AN4.

Out of the compounds capable of decomposing upon irradiation with actinic rays or radiation, particularly preferred examples are set forth below.

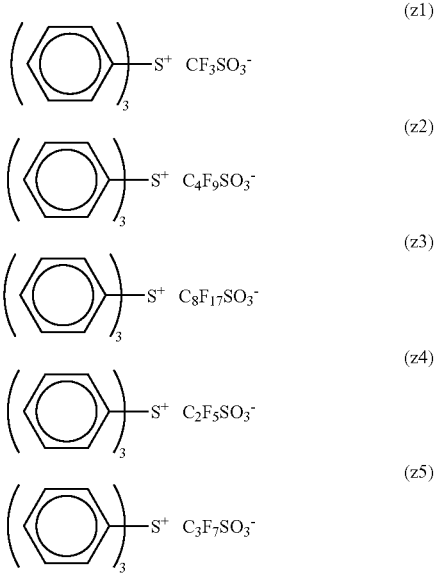

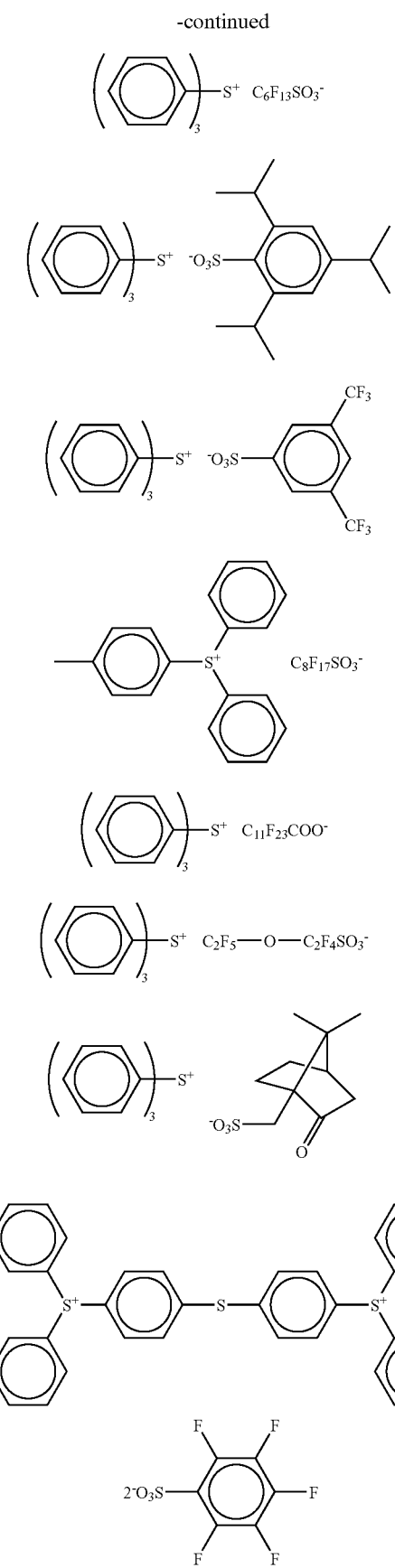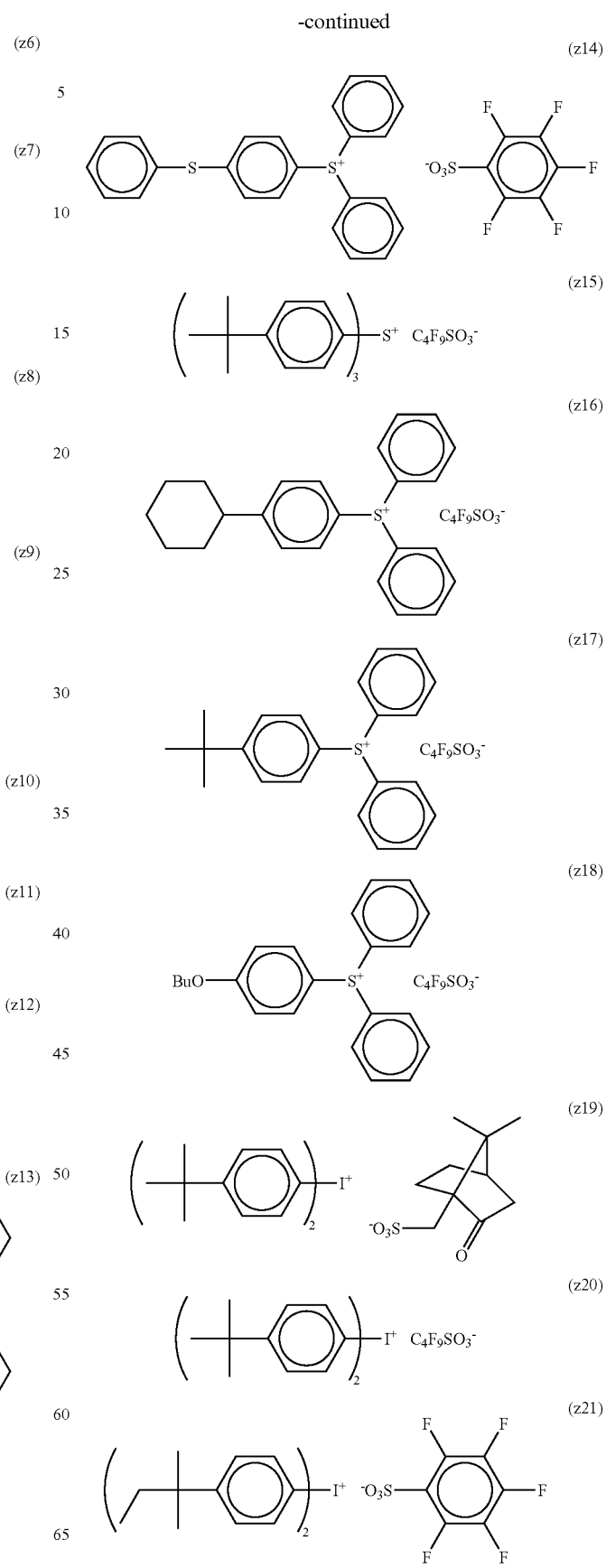

-continued
(z22) 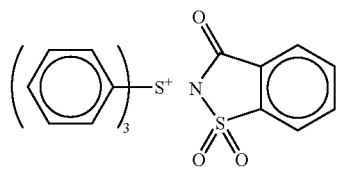
(z23) 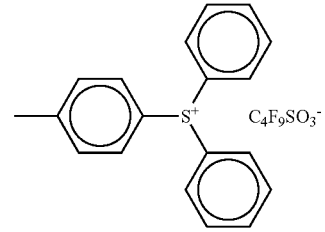
(z24) 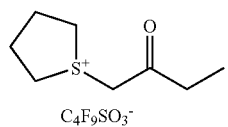
(z25) 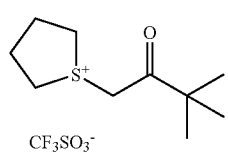
(z26) 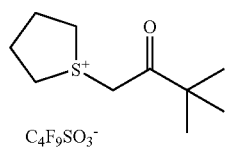
(z27) 
(z28) 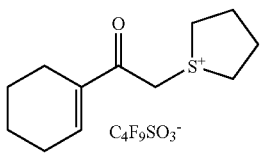
(z29) 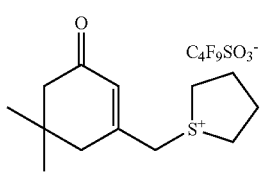
(z30) 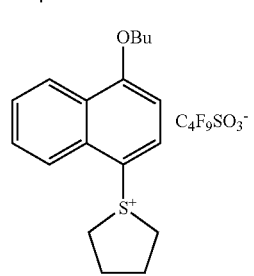
-continued
(z31) 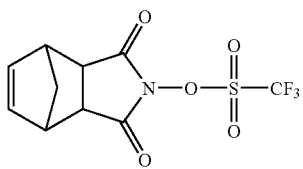
(z32) 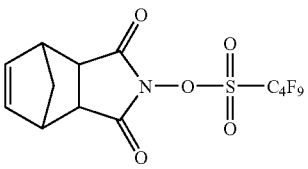
(z33) 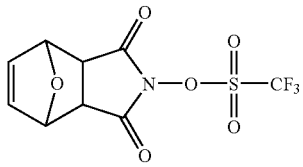
(z34) 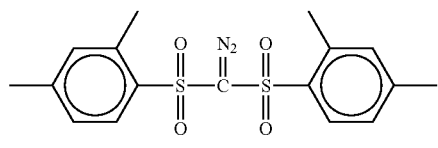
(z35) 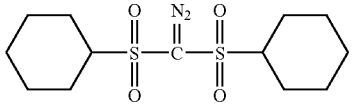
(z36) 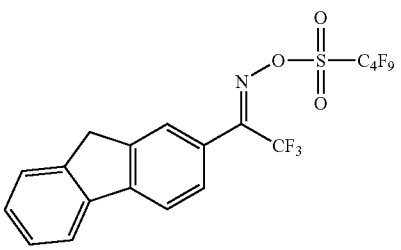
(z37) 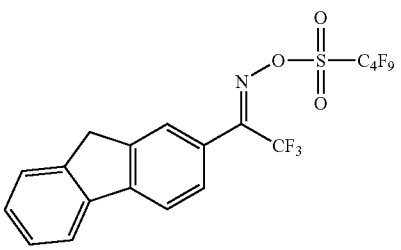
(z38) 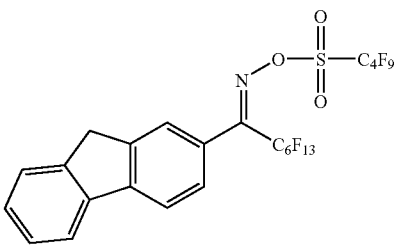
(z39) 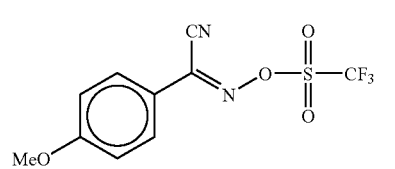

-continued
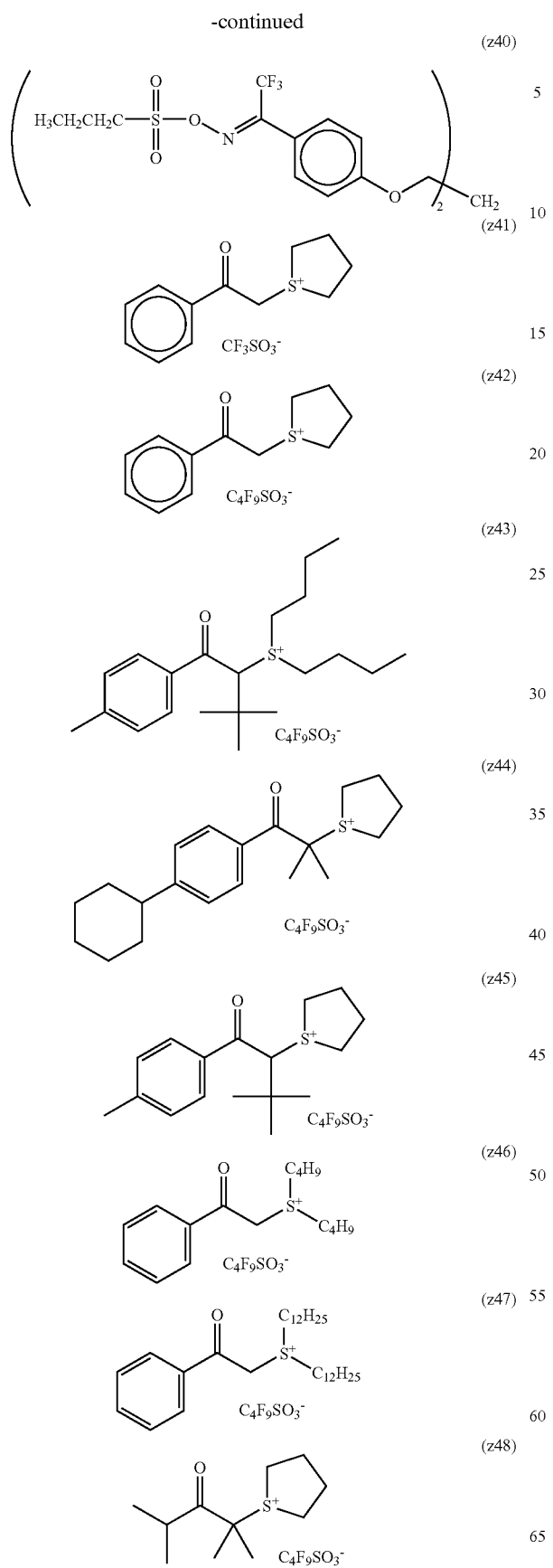
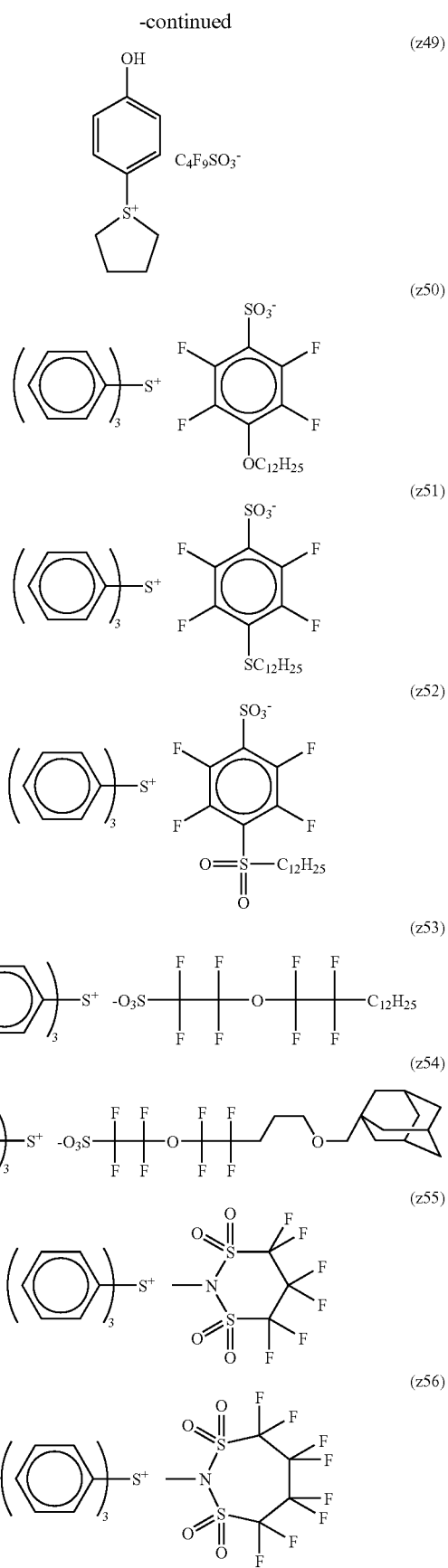

-continued (z57) 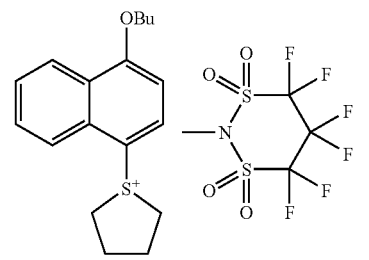

(z58) 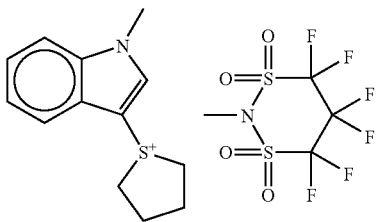

(z59) 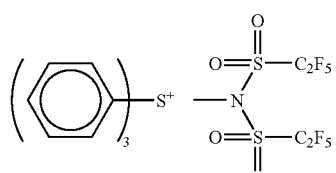

(z60) 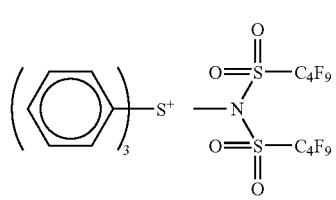

(z61) 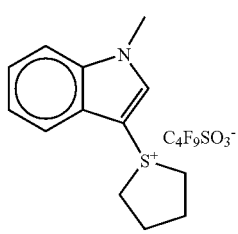

(z62) 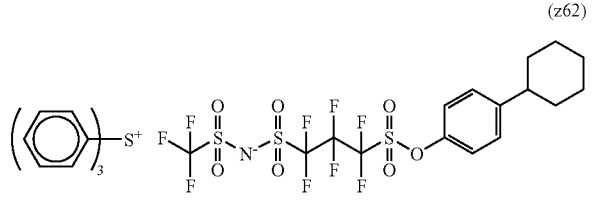

(z63) 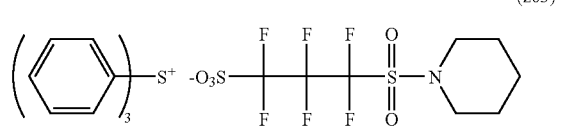

(z64) 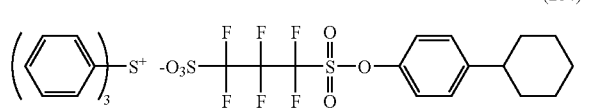

-continued (z65) 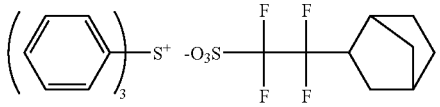

(z66) 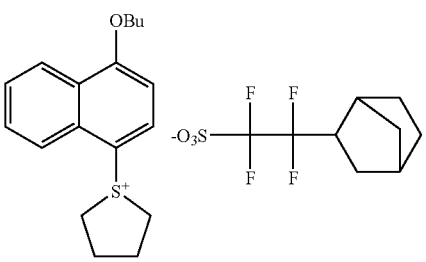

(z67) 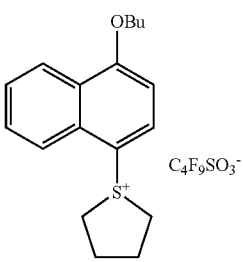

One acid generator may be used alone, or two or more kinds of acid generators may be used in combination, In the case of using two or more kinds of acid generators in combination, compounds capable of generating two or more different organic acids with the total number of atoms except for hydrogen atom being 2 or more are preferably combined.

The content of the acid generator in the composition is preferably from 0.1 to 20 mass %, more preferably from 0.5 to 10 mass %, still more preferably from 1 to 7 mass %, based on the entire solid content of the photosensitive composition.

[2] (B) Basic Compound

The photosensitive composition of the present invention comprises a basic compound (B1) represented by formula (I-a) and a basic compound (B2) represented by formula (I-b).

(I-a)

In formula (I-a), $R^1$, $R^2$ and $R^3$ each independently represents a hydrogen atom, an alkyl group, a cycloalkyl group, an aryl group or a heteroaryl group, and at least one of $R^1$, $R^2$ and $R^3$ have a polar group.

The alkyl group of $R^1$, $R^2$ and $R^3$ in formula (I-a) is preferably a linear or branched alkyl group having a carbon number of 1 to 20, and examples thereof include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an i-propyl group, an i-butyl group, a sec-butyl group, a tert-butyl group and a tert-dodecyl group.

The cycloalkyl group of $R^1$, $R^2$ and $R^3$ is preferably a cycloalkyl group having a carbon number of 3 to 20, and examples thereof include a cyclobutyl group, a cyclopentyl group and a cyclohexyl group.

The alkyl group and cycloalkyl group of $R^1$, $R^2$ and $R^3$ are preferably a linear alkyl group having a carbon number of 1 to 10 and a cycloalkyl group having a carbon number of 4 to 8.

The aryl group of $R^1$, $R^2$ and $R^3$ is preferably an aryl group having a carbon number of 6 to 15, and examples thereof include a phenyl group, a toluoyl group, a benzyl group, a methylbenzyl group, a xylyl group, a mesityl group, a naphthyl group and an anthryl group.

The heteroaryl group of $R^1$, $R^2$ and $R^3$ is a group containing one or more heteroatoms such as sulfur atom, oxygen atom and nitrogen atom in the above-described aryl group, and examples thereof include a pyridyl group, an imidazolyl group, a morpholinyl group, a piperidinyl group and a pyrrolidinyl group.

The alkyl group, cycloalkyl group, aryl group and heteroaryl group of $R^1$, $R^2$ and $R^3$ each may be substituted, and at least one or more members out of $R^1$, $R^2$ and $R^3$ contain a polar group.

The polar group as used herein means a group having a heteroatom and at least one or more halogen atoms, and examples of the heteroatom include a nitrogen atom, an oxygen atom and a sulfur atom. Preferred examples of such a polar group include a hydroxyl group, an ester group, an ether group, a carbonyl group, a cyano group, an acetal group, an alkoxy group, an alkoxycarbonyl group, an acyloxy group, an amino group and a hexafluoroisopropanol group. Among these, an ether group, a cyano group and a hydroxyl group are more preferred. At least one or more of these substituents are contained in the compound represented by formula (I-a). The compound represented by formula (I-a) preferably contains from 1 to 9 polar groups, more preferably from 1 to 6 polar groups.

The preferred basic compound represented by formula (I-a) includes an aliphatic amine compound and an aniline compound each having a polar group. Of these, an aniline compound represented by formula (I-a1) is more preferred. In the formula, $R^{11}$ and $R^{12}$ have the same meanings as $R^1$ and $R^2$ in formula (I-a). $R^{13}$, $R^{14}$ and $R^{15}$ each independently represents a hydrogen atom, a linear, branched or cyclic, substituted or unsubstituted alkyl group having a carbon number of 1 to 6, or a substituted or unsubstituted aryl group, and examples thereof include a hydrogen atom, a methyl group, an ethyl group, an n-propyl group, an n-butyl group, an n-pentyl group, an n-hexyl group, a i-propyl group, an i-butyl group, a sec-butyl group, a tert-butyl group, a cyclobutyl group, a cyclopentyl group, a cyclohexyl group and a phenyl group.

Specific preferred examples of the aliphatic amine compound having a polar group include:

a hydroxyl group-substituted primary amine such as ethanolamine, a hydroxyl group-substituted secondary amine, a hydroxyl group-substituted tertiary amine such as triethanolamine, N-methyldiethanolamine and N-octyldiethanolamine, an amine containing an ether bond in the chain, such as tris(methoxyethyl)amine and tris(methoxyethoxyethyl)amine, and a cyano group-substituted tertiary amine such as tris(cyanoethyl)amine.

Specific preferred examples of the aniline compound represented by formula (I-a1) include:

N,N-dihydroxyalkylanilines (e.g., N-phenyldiethanolamine, N-(4-methylphenyl)diethanolamine, N-phenyldipropanolamine, N-(4-methylphenyl)dipropanolamine), cyanoalkylanilines (e.g., N-cyanoethylaniline, N,N-biscyanoethylaniline, N-methyl-N-cyanoethylaniline), alkoxyalkylanilines (e.g., N,N-bis(methoxyethylaniline), N,N-bis(ethoxyethyl)aniline, N-phenylmorpholine), and anilines having a substituent on the aromatic ring (e.g., 2,6-dinitroaniline, 2-aminobiphenyl, pentafluoroaniline, 2-hydroxyaniline). Among these, N,N-dihydroxyalkylanilines are more preferred.

The basic compound (B2) represented by formula (I-b) is described below.

In formula (I-b), $R^4$, $R^5$ and $R^6$ each independently represents a hydrogen atom, an alkyl group, a cycloalkyl group or an aryl group, and $R^4$, $R^5$ and $R^6$ all have no polar group.

The alkyl group of $R^4$, $R^5$ and $R^6$ in formula (I-b) is preferably a linear or branched alkyl group having a carbon number of 1 to 20, and examples thereof include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an i-propyl group, an i-butyl group, a sec-butyl group, a tert-butyl group and a tert-dodecyl group.

The cycloalkyl group of $R^4$, $R^5$ and $R^6$ is preferably a cycloalkyl group having a carbon number of 3 to 20, and examples thereof include a cyclobutyl group, a cyclopentyl group and a cyclohexyl group.

The alkyl group and cycloalkyl group of $R^4$, $R^5$ and $R^6$ are preferably a linear alkyl group having a carbon number of 1 to 10 and a cycloalkyl group having a carbon number of 4 to 8.

The aryl group of $R^4$, $R^5$ and $R^6$ is preferably an aryl group having a carbon number of 6 to 15, and examples thereof include a phenyl group, a toluoyl group, a benzyl group, a methylbenzyl group, a xylyl group, a mesityl group, a naphthyl group and an anthryl group. The aryl group may be substituted, and the substituent is preferably an alkyl group having a carbon number of 1 to 3, more preferably a methyl group.

The preferred basic compound represented by formula (I-b) includes an aliphatic amine compound and an aniline compound each having no polar group.

The aliphatic amine compound includes primary, secondary and tertiary aliphatic amine compounds and is preferably a tertiary aliphatic amine compound where $R^4$, $R^5$ and $R^6$ all are an alkyl group or a cycloalkyl group.

In the case where $R^4$, $R^5$ and $R^6$ are a hydrogen atom, an alkyl group or a cycloalkyl group, the sum of carbon numbers of $R^4$, $R^5$ and $R^6$ is preferably 6 or more, more preferably 10 or more, still more preferably 12 or more. By adjusting the carbon number, a good profile is obtained.

Specific preferred examples of the aliphatic amine compound include:

a primary aliphatic amine such as hexylamine, octylamine, dodecylamine, cyclohexylamine and adamantylamine, a secondary aliphatic amine such as diisopropylamine, dibutylamine, dihexylamine, dicyclohexylamine, dioctylamine and didodecylamine, and a tertiary aliphatic amine such as triethylamine, tripropylamine, tributylamine, tripentylamine, trihexylamine, trioctylamine, tridodecylamine, dicyclohexylmethylamine, dicyclohexylethylamine, diisopropylethylamine and dioctylmethylamine.

The basic compound (B1) and basic compound (B2) may be a compound synthesized by a known method or may be a commercial product available, for example, from Wako Pure Chemical Industries, Ltd., Aldrich, Lancaster and Fluka.

The amount used of the basic compound (B) of the present invention is, in terms of the total amount of the basic compound (B1) and basic compound (B2), usually from 0.001 to 10 mass %, preferably from 0.01 to 5 mass %, more preferably from 0.05 to 1.0 mass %, based on the entire solid content of the photosensitive composition. When the amount used is from 0.001 to 10 mass %, the effect by the addition of the components above can be satisfactorily obtained and at the same time, the tendency to cause reduction in the sensitivity or worsened developability of the non-exposed area can be successfully prevented.

The content ratio [(B1):(B2)] between the basic compounds (B1) and (B2) is preferably from 1:99 to 99:1, more preferably from 5:95 to 95:5, and most preferably from 20:80 to 80:20.

According to the present invention, it is considered that by virtue of using a blend of a basic compound (B1) having introduced thereinto a polar group and a basic compound (B2) not having a polar group, the remaining property of the basic compound in the film (boiling point) and the ability of controlling the abundance distribution and acid diffusion in the film thickness direction (hydrophilicity) can be adjusted and in turn, uniform reaction of PAG necessary for the pattern formation with an acid-dissociating group in the resin and suppressed film loss of the pattern can be realized, as a result, good development defect performance and wide focus margin can be attained in the photoresist where these basic compounds are blended. Incidentally, when a polar group is introduced into a basic compound, volatilization of the basic compound from the film is suppressed due to increase in the boiling point, or the performance of inhibiting the acid diffusion is enhanced due to the presence of a polar group near the nitrogen atom working as an acid trap site

[3] (H) Basic Compound Used in Combination

The photosensitive composition of the present invention may further contain, other than the basic compound (B), another basic compound (hereinafter referred to as "a combined basic compound").

The preferred structure of the combined basic compound includes structures represented by the following formulae (A) to (C).

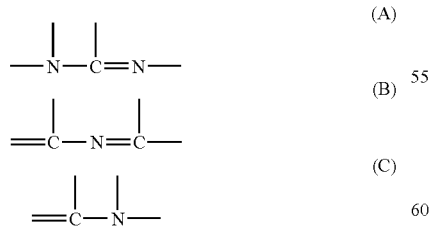

Preferred examples of the compound include guanidine, aminopyrrolidine, pyrazole, pyrazoline, piperazine, aminomorpholine, aminoalkylmorpholine and piperidine, which may have a substituent. More preferred examples of the compound include a compound having a diazabicyclo, onium hydroxide, onium carboxylate or pyridine structure, an imidazole derivative, a pyrrole derivative, and an oxazole derivative.

Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a 2-oxoalkyl group-containing sulfonium hydroxide, specifically, triphenylsulfonium hydroxide, tris(tert-butylphenyl)sulfonium hydroxide, bis(tert-butylphenyl)iodoniumhydroxide, phenacylthiophenium hydroxide and 2-oxopropylthiophenium hydroxide. Examples of the compound having an onium carboxylate structure include a compound where the anion moiety of the compound having an onium hydroxide structure is converted into a carboxylate, such as acetate, adamantane-1-carboxylate and perfluoroalkyl carboxylate. Examples of the compound having a pyridine structure include pyridine and 2-phenylpyridine. Examples of the imidazole derivative include imidazole, 4-methylimidazole, phenylbenzimidazole and 5,6-dimethylbenzimidazole. Examples of the pyrrole derivative include pyrrole, 2H-pyrrole, 1-methylpyrrole, 2,4-dimethylpyrrole and N-methylpyrrole.

One combined basic compound is used alone, or two or more kinds of combined basic compounds are used in combination.

The amount used of the combined basic compound is preferably equimolar or less to the basic compound (B).

The amount used of the combined basic compound is usually from 0.001 to 10 mass %, preferably from 0.01 to 5 mass %, based on the solid content of the photosensitive composition.

[4] (H) Surfactant Represented by Formula (II)

The photosensitive composition of the present invention comprises a surfactant represented by formula (II) (hereinafter sometimes referred to as a "surfactant of the component (H)" or a "surfactant (H)").

Examples of the commercial product for the surfactant of the component (H) include PF636, PF656, PF6320 and PF6520 (all produced by OMNOVA); and FTX-204D, 208G, 218G, 230G, 204D, 208D, 212D, 218, 222D, 720C and 740C (all produced by NEOS Co., Ltd.).

Specific preferred examples of the surfactant of the component (H) are described below, but the present invention is not limited thereto.

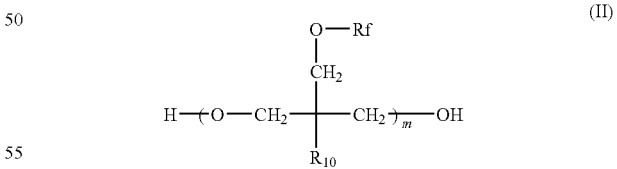

In formula (II), $R_{10}$ represents a hydrogen atom or an alkyl group,

Rf represents a fluoroalkyl group or a fluoroalkylcarbonyl group, and m represents an integer of 1 to 50.

Examples of the fluoroalkyl group of Rf in formula (II) include —$CF_3$, —$C_2F_5$, —$C_4F_9$, —$CH_2CF_3$, —$CH_2C_2F_5$, —$CH_2C_3F_7$, —$CH_2C_4F_9$, —$CH_2C_6F_{13}$, —$C_2H_4CF_3$, —$C_2H_4C_2F_5$, —$C_2H_4C_4F_9$, —$C_2H_4C_6F_{13}$, —$C_2H_4C_8F_{17}$, —$CH_2CH(CH_3)CF_3$, —$CH_2CH(CF_3)_2$, —$CH_2CF(CF_3)_2$, —CH$_2$CH(CF$_3$)$_2$, —CF$_2$CF(CF$_3$)OCF$_3$, —CF$_2$CF(CF$_3$)OC$_3$F$_7$, —C$_2$H$_4$OCF$_2$CF(CF$_3$)OCF$_3$, —C$_2$H$_4$OCF$_2$CF(CF$_3$)OC$_3$F$_7$ and —C(CF$_3$)=C(CF(CF$_3$)$_2$)$_2$.

Examples of the fluoroalkylcarbonyl group of Rf include —COCF$_3$, —COC$_2$F$_5$, —COC$_3$F$_7$, —COC$_4$F$_9$, —COC$_6$F$_{13}$ and —COC$_8$F$_{17}$.

The alkyl group as R$_{10}$ is preferably an alkyl group having a carbon number of 1 to 10, more preferably from 1 to 5.

Specific examples of the surfactant represented by formula (II) are set forth below, but the present invention is not limited thereto.

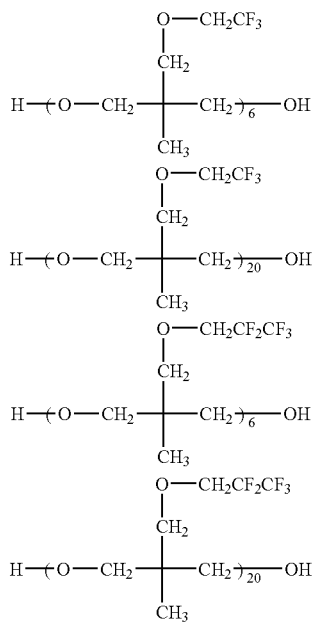

The amount used of the surfactant (H) represented by formula (II) is preferably from 0.0001 to 0.7 mass %, more preferably from 0.001 to 0.5 mass %, still more preferably from 0.01 to 0.3 mass %, based on the entire amount of the photosensitive composition (excluding the solvent).

In the present invention, another surfactant may be used in combination with the surfactant (H) above.

The ratio of the surfactant (H) to the another surfactant used is, in terms of the mass ratio (surfactant (H)/other surfactant), preferably from 60/40 to 99/1, more preferably from 70/30 to 99/1.

Examples of the another surfactant which can be used in combination include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Examples of the commercially available surfactant therefor include a fluorine-containing or silicon-containing surfactant, such as EFtop EF301 and EF303 (produced by Shin-Akita Kasei K. K.); Florad FC430, 431 and 4430 (produced by Sumitomo 3M Inc.); Megafac F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); and Eftop EF121, EF122A, EF122B, RF122C, EF125M, EF135M, EF351, 352, EF801, EF802 and EF601 (produced by JEMCO Inc.). In addition, polysiloxane polymer KP-341 (produced by Shin-Etsu Chemical Co., Ltd.) may also be used.

As for the surfactant, other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of a C$_6$F$_{13}$ group-containing acrylate (or methacrylate) with a (poly(oxyalkylene))acrylate (or methacrylate), a copolymer of a C$_6$F$_{13}$ group-containing acrylate (or methacrylate) with a (poly(oxyethylene))acrylate (or methacrylate) and a (poly(oxypropylene))acrylate (or methacrylate), a copolymer of a C$_8$F$_{17}$ group-containing acrylate (or methacrylate) with a (poly(oxyalkylene))acrylate (or methacrylate), and a copolymer of a C$_8$F$_{17}$ group-containing acrylate (or methacrylate) with a (poly(oxyethylene)) acrylate (or methacrylate) and a (poly(oxypropylene))acrylate (or methacrylate).

Also, a surfactant other than the fluorine-containing and/or silicon-containing surfactant may be used in combination. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene•epolyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

[5] (C) Resin Capable of Decomposing Under the Action of an Acid to Increase the Solubility in an Alkali Developer The resin capable of decomposing under the action of an acid to increase the solubility in an alkali developer (sometimes referred to as a "resin (C)"), which is used in the photosensitive composition of the present invention, is a resin having a group capable of decomposing under the action of an acid (hereinafter sometimes referred to as an "acid-decomposable group"), in ether one or both of the main chain and the side chain of the resin. Of these, a resin having an acid-decomposable group in the side chain is preferred.

The group capable of decomposing under the action of an acid is preferably a group resulting from replacement of the hydrogen atom of a —COOH or —OH group by a group which desorbs by the effect of an acid.

Examples of the group which desorbs by the effect of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, $R_{36}$ to $R_{39}$ each independently represents an alkyl group, a cycloalkyl group, an aryl group, an aralkyl group or an alkenyl group, and $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

In the present invention, the acid-decomposable group is an acetal group or a tertiary ester group.

In the case where such a group capable of decomposing under the action of an acid is bonded as a side chain, the matrix resin is an alkali-soluble resin having a —OH or —COOH group in the side chain. Examples thereof include an alkali-soluble resin described below.

The alkali dissolution rate of the alkali-soluble resin is preferably 170 Å/sec or more, more preferably 330 Å/sec or more, as measured (at 23° C.) in 0.261N tetramethyl-ammonium hydroxide (TMAH).

From this standpoint, the alkali-soluble resin is preferably an alkali-soluble resin having a hydroxystyrene structural unit, such as an o-, m- or p-poly(hydroxy-styrene), a copolymer thereof, a hydrogenated poly(hydroxystyrene), a halogen- or alkyl-substituted poly(hydroxystyrene), a partially O-alkylated or O-acylated poly-(hydroxystyrene), a styrene-hydroxystyrene copolymer, an α-methylstyrene-hydroxystyrene copolymer and a hydrogenated novolak resin.

Preferred examples of the repeating unit having an acid-decomposable group for use in the present invention include a tert-butoxycarbonyloxystyrene, a 1-alkoxyethoxystyrene and a tertiary alkyl(meth)acrylate. Among these, a 2-alkyl-2-adamantyl (meth)acrylate and a dialkyl(1-adamantyl)methyl (meth)acrylate are more preferred.

The resin (C) for use in the present invention can be obtained by reacting an acid-decomposable group precursor with an alkali-soluble resin or copolymerizing an acid-decomposable group-bonded alkali-soluble resin monomer with various monomers, and this is disclosed in European Patent 254853, JP-A-2-25850, JP-A-3-223860 and JP-A-4-251259.

Specific examples of the resin (C) for use in the present invention are set forth below, but the present invention is limited thereto:
p-tert-butoxystyrene/p-hydroxystyrene copolymer,
p-(tert-butoxycarbonyloxy)styrene/p-hydroxystyrene copolymer,
p-(tert-butoxycarbonylmethyloxy)styrene/p-hydroxystyrene copolymer,
4-(tert-butoxycarbonylmethyloxy)-3-methylstyrene/4-hydroxy-3-methylstyrene copolymer,
p-(tert-butoxycarbonylmethyloxy)styrene/p-hydroxystyrene (10% hydrogenated) copolymer,
m-(tert-butoxycarbonylmethyloxy)styrene/m-hydroxystyrene copolymer,
o-(tert-butoxycarbonylmethyloxy)styrene/o-hydroxystyrene copolymer,
p-(cumyloxycarbonylmethyloxy)styrene/p-hydroxystyrene copolymer,
cumyl methacrylate/methyl methacrylate copolymer,
4-tert-butoxycarbonylstyrene/dimethyl maleate copolymer,
benzyl methacrylate/tetrahydropyranyl methacrylate copolymer,
p-(tert-butoxycarbonylmethyloxy)styrene/p-hydroxystyrene/styrene copolymer,
p-tert-butoxystyrene/p-hydroxystyrene/fumaronitrile copolymer,
tert-butoxystyrene/hydroxyethyl methacrylate copolymer,
styrene/N-(4-hydroxyphenyl)maleimide/N-(4-tert-butoxycarbonyloxyphenyl)maleimide copolymer,
p-hydroxystyrene/tert-butyl methacrylate copolymer,
styrene/p-hydroxystyrene/tert-butyl methacrylate copolymer,
p-hydroxystyrene/tert-butyl acrylate copolymer,
styrene/p-hydroxystyrene/tert-butyl acrylate copolymer,
p-(tert-butoxycarbonylmethyloxy)styrene/p-hydroxystyrene/N-methylmaleimide copolymer,
tert-butyl methacrylate/1-adamantylmethyl methacrylate copolymer,
p-hydroxystyrene/tert-butyl acrylate/p-acetoxystyrene copolymer,
p-hydroxystyrene/tert-butyl acrylate/p-(tert-butoxycarbonyloxy)styrene copolymer, and
p-hydroxystyrene/tert-butyl acrylate/p-(tert-butoxycarbonylmethyloxy)styrene copolymer,

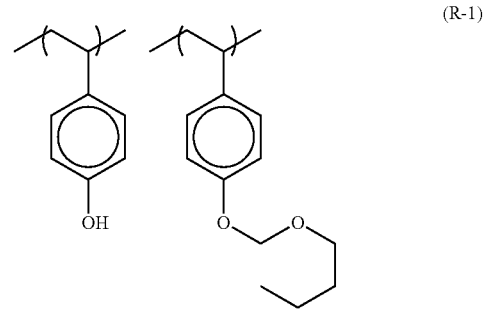

(R-1)

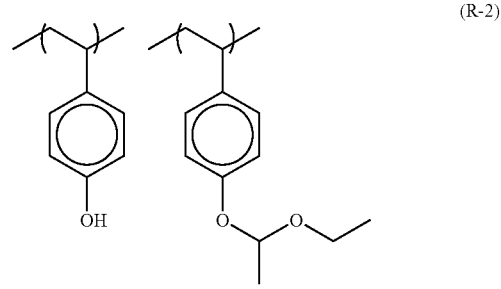

(R-2)

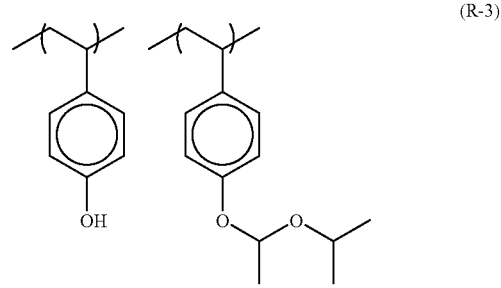

(R-3)

-continued
(R-4)
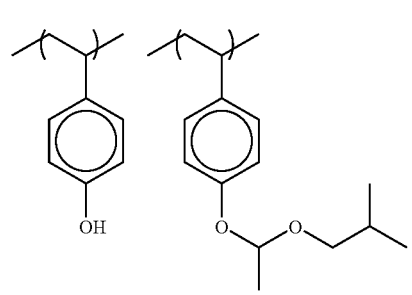
(R-5)
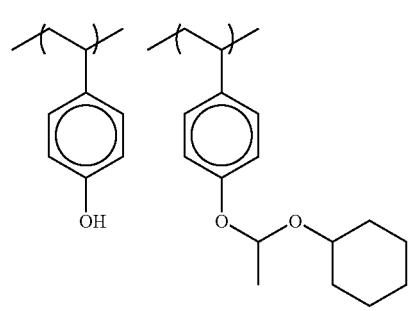
(R-6)
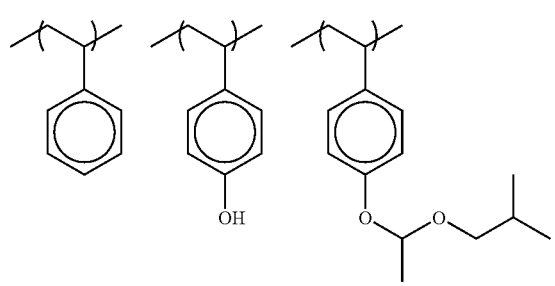
(R-7)
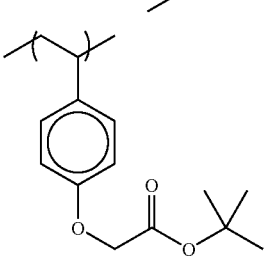
-continued
(R-8)
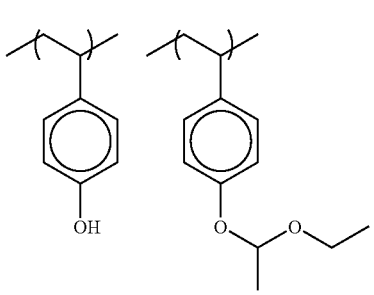
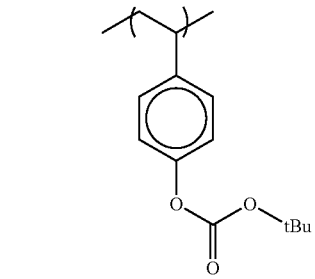
(R-9)
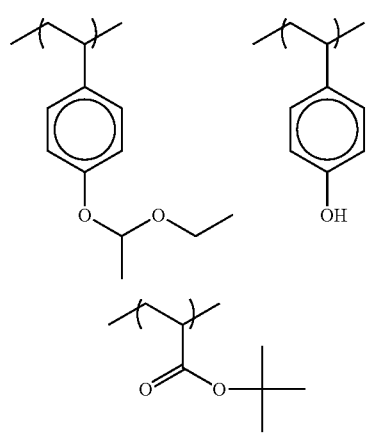
(R-10)
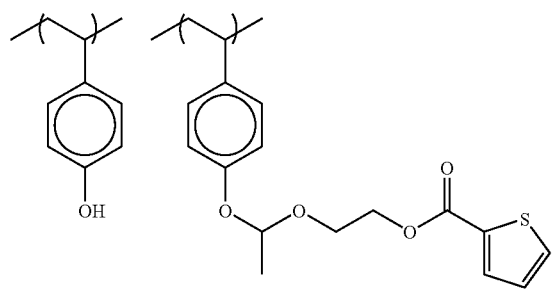
(R-11)
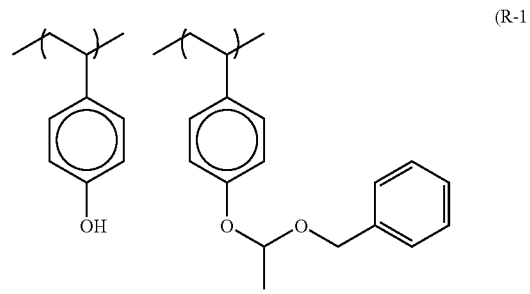

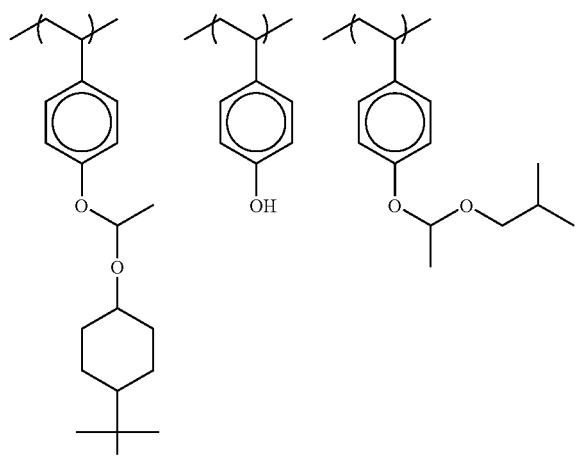
(R-12)
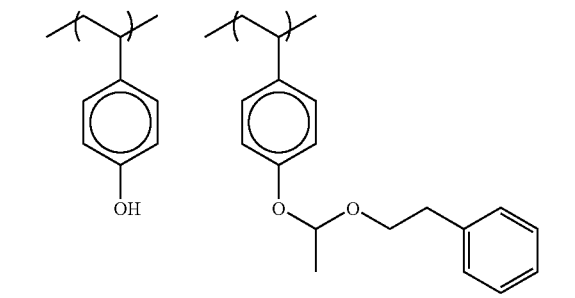
(R-13)
(R-14)
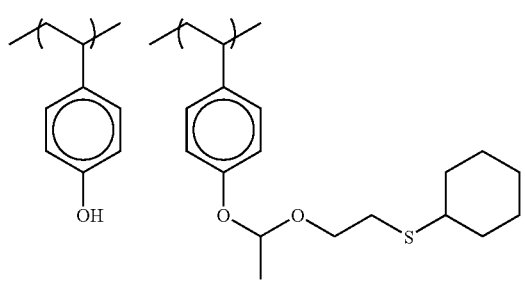
(R-15)
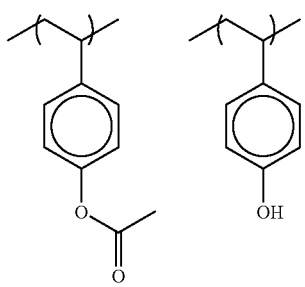
(R-16)
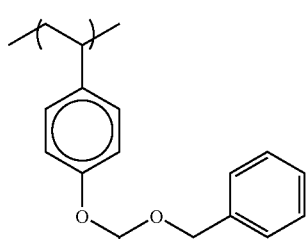
(R-17)

-continued
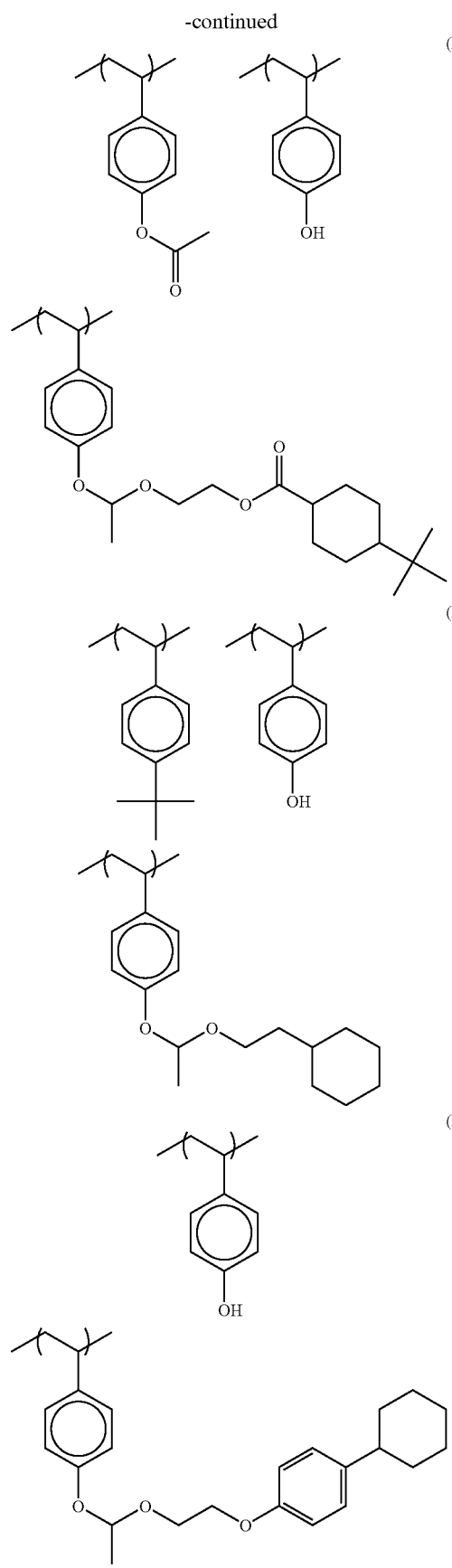
(R-18)
(R-19)
(R-20)
-continued
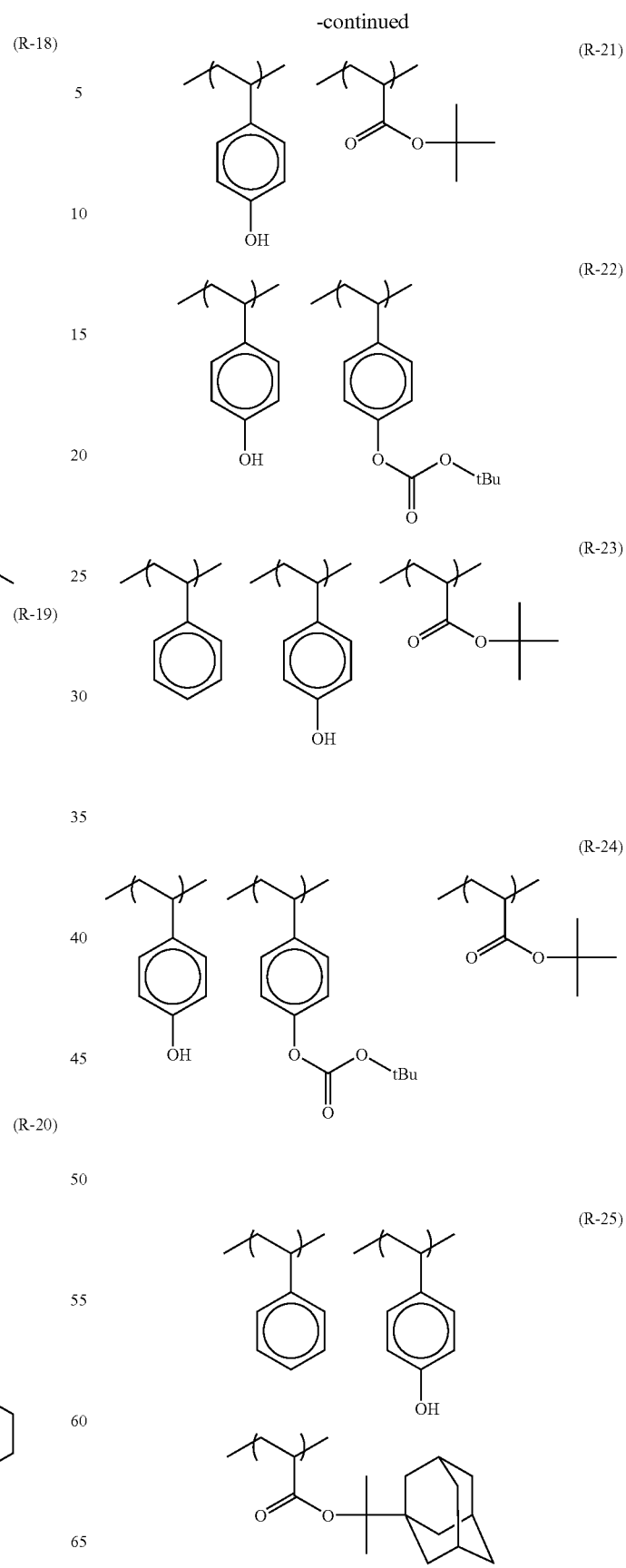
(R-21)
(R-22)
(R-23)
(R-24)
(R-25)

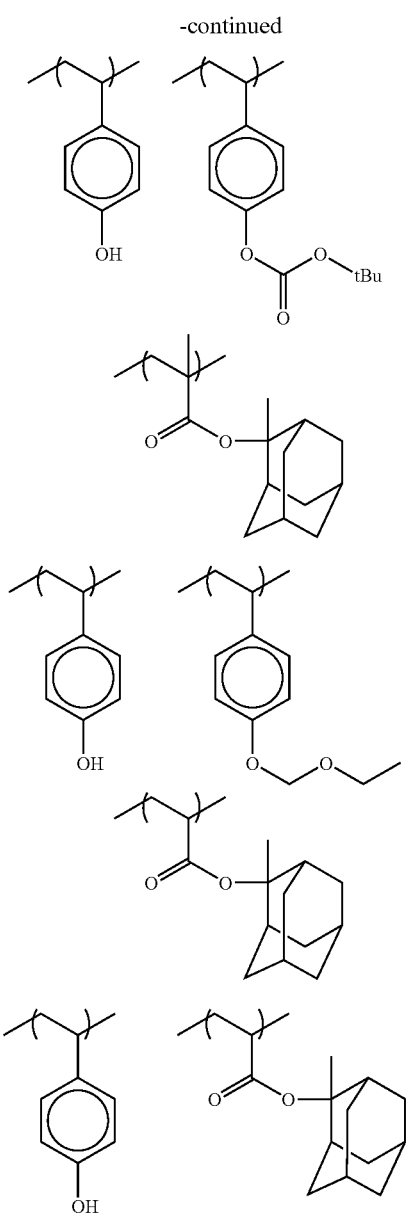

In these specific examples, "tBu" indicates a tert-butyl group.

The content of the group capable of decomposing under the action of an acid is expressed by B/(B+S) using the number (B) of acid-decomposable groups in the resin and the number (S) of alkali-soluble groups not protected by a group which desorbs by the effect of an acid. The content is preferably from 0.01 to 0.7, more preferably from 0.05 to 0.50, still more preferably from 0.05 to 0.40.

In the case of irradiating the positive photosensitive composition of the present invention with ArF excimer laser light, the resin (C) is preferably a resin having a monocyclic or polycyclic alicyclic hydrocarbon structure and undergoing decomposition under the action of an acid to increase the solubility in an alkali developer.

The resin having a monocyclic or polycyclic alicyclic hydrocarbon structure and undergoing decomposition under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pV) and a repeating unit represented by the following formula (II-AB):

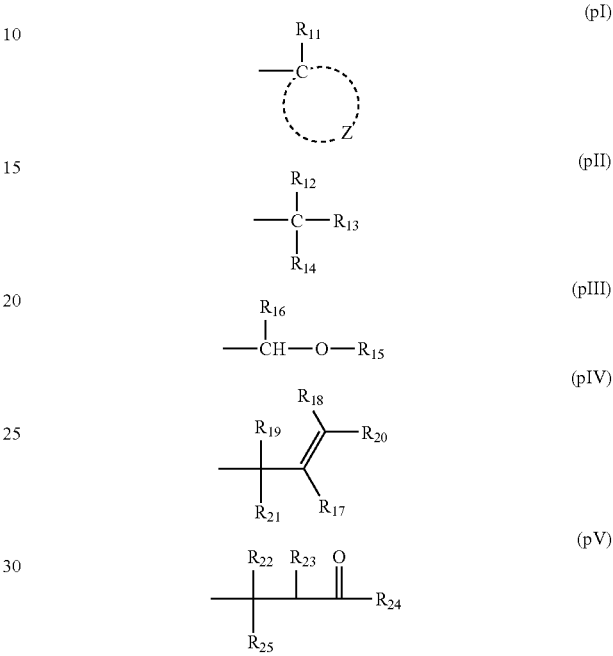

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents a linear or branched alkyl group or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group or a cycloalkyl group, provided that at least one of $R_{17}$ to $R_{21}$ represents a cycloalkyl group and that either one of $R_{19}$ and $R_{21}$ represents a linear or branched alkyl group or a cycloalkyl group.

$R_{22}$ to $R_{25}$ each independently represents a hydrogen atom, a linear or branched alkyl group or a cycloalkyl group, provided that at least one of $R_{22}$ to $R_{25}$ represents a cycloalkyl group. $R_{23}$ and $R_{24}$ may combine with each other to form a ring.

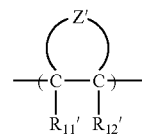

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB1) or (II-AB2):

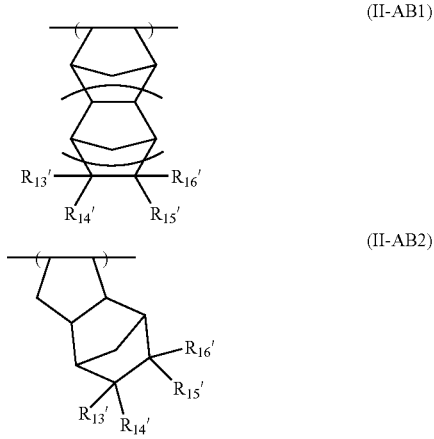

In formulae (II-AB1) and (II-AB2), $R_{13}'$ to $R_{16}'$ each independently represents a hydrogen atom, a halogen atom, a cyano group, —COOH, —COOR$_5$, a group capable of decomposing under the action of an acid, —C(=O)—X—A'—R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ is preferably a linear or branched alkyl group having a carbon number of 1 to 4, and examples thereof include a methyl group, an ethyl group, a n-propyl group, an isopropyl group, an n-butyl group, an isobutyl group and a sec-butyl group.

The cycloalkyl group of $R_{12}$ to $R_{25}$ and the cycloalkyl group formed by Z together with the carbon atom may be monocyclic or polycyclic. Specific examples thereof include a group having a monocyclo, bicyclo, tricyclo or tetracyclo structure or the like with a carbon number of 5 or more. The carbon number thereof is preferably from 6 to 30, more preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl group and cycloalkyl group each may further have a substituent. Examples of the substituent which the alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). Among these, preferred is a structure where the hydrogen atom of a carboxylic acid group or a sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

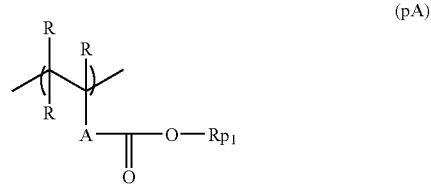

In formula (pA), R represents a hydrogen atom, a halogen atom or a linear or branched alkyl group having a carbon number of 1 to 4, and the plurality of R's may be the same or different.

A represents a single bond, or a sole group or a combination of two or more groups, selected from the group consisting of an alkylene group, an ether group, a thioether group, a carbonyl group, an ester group, an amido group, a sulfonamido group, a urethane group and a urea group. A is preferably a single bond.

$Rp_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below, but the present invention is not limited thereto.

(In the formulae, Rx represents H, CH$_3$, CF$_3$ or CH$_2$OH, and Rxa and Rxb each represents an alkyl group having a carbon number of 1 to 4.)

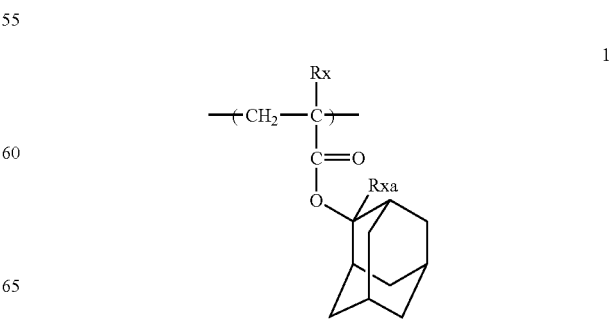

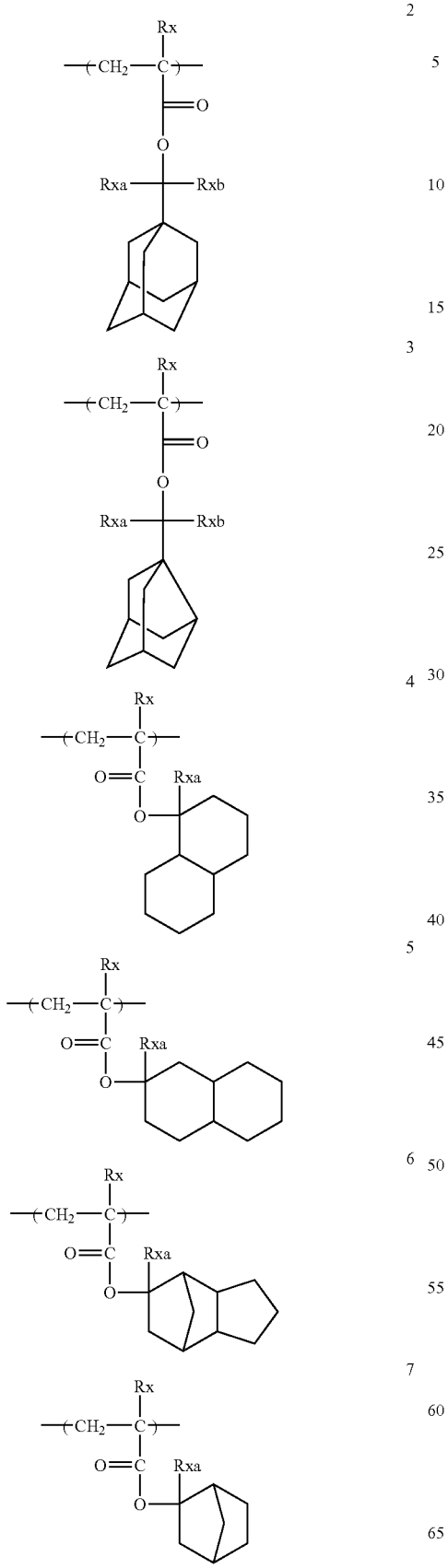
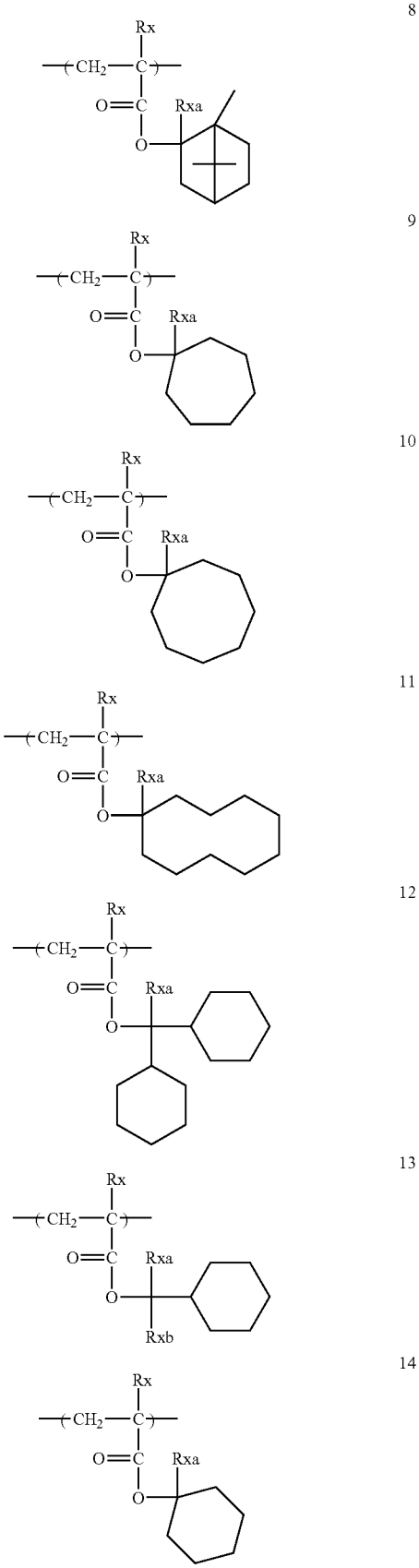

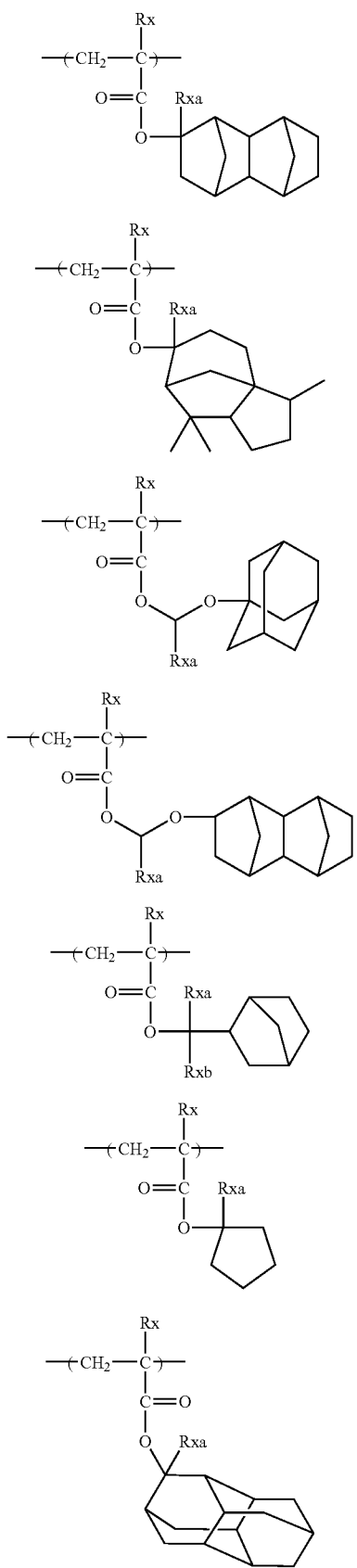
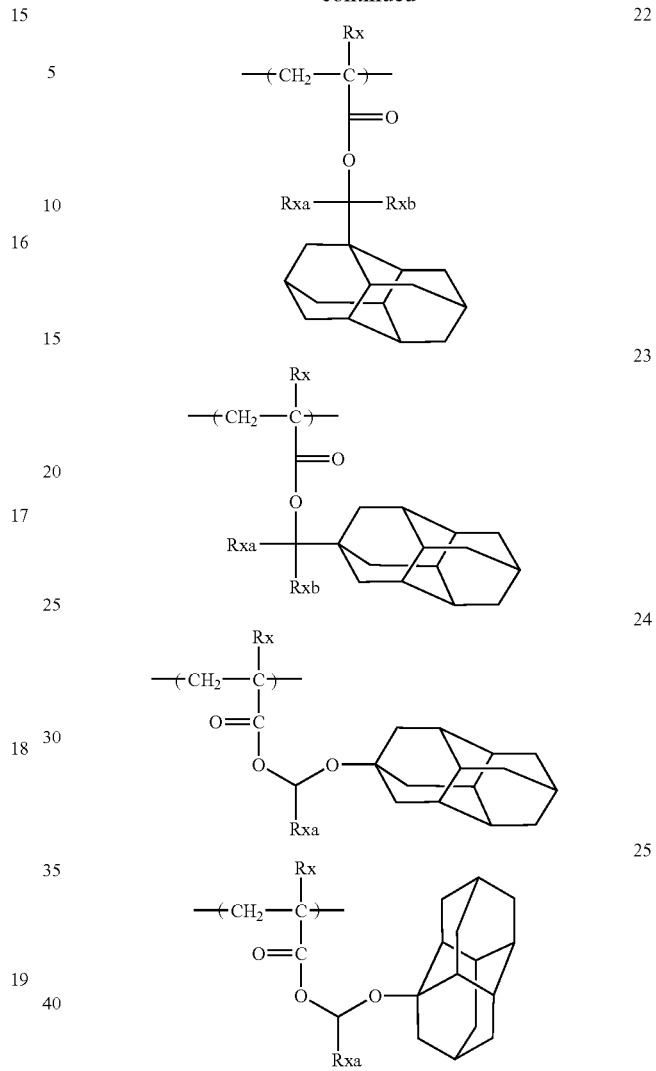

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of $Z'$ for forming an alicyclic structure is an atomic group for forming a repeating unit having an alicyclic hydrocarbon structure which may have a substituent. In particular, an atomic group for forming a repeating unit having a crosslinked alicyclic hydrocarbon structure is preferred.

Examples of the skeleton of the alicyclic hydrocarbon formed are the same as those of the cycloalkyl group of $R_{12}$ to $R_{25}$ in formulae (pI) to (pV).

The skeleton of the alicyclic hydrocarbon structure may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may become the substituents of an atomic group for forming an alicyclic hydrocarbon structure in formula (II-AB) or an atomic group Z for forming a crosslinked alicyclic hydrocarbon structure.

Specific examples of the repeating units represented by formulae (II-AB1) and (II-AB2) are set forth below, but the present invention is not limited to these specific examples.

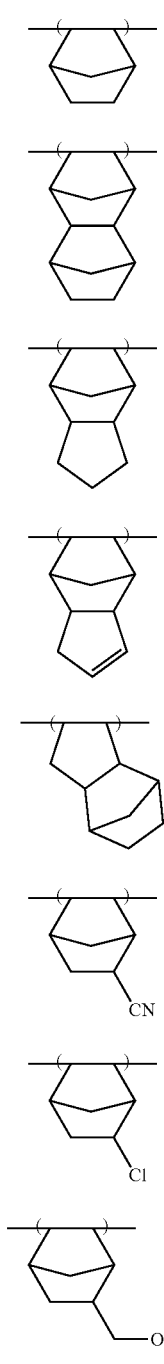

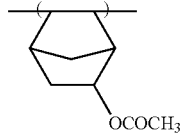

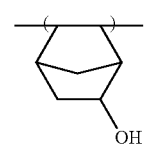

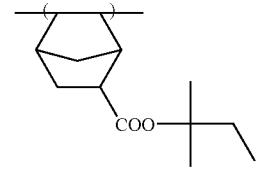

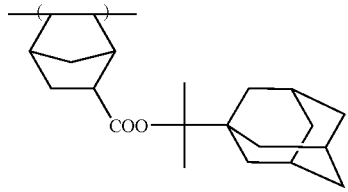

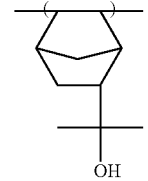

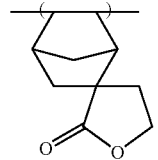

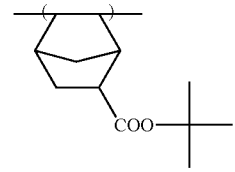

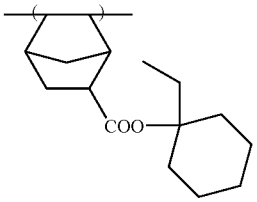

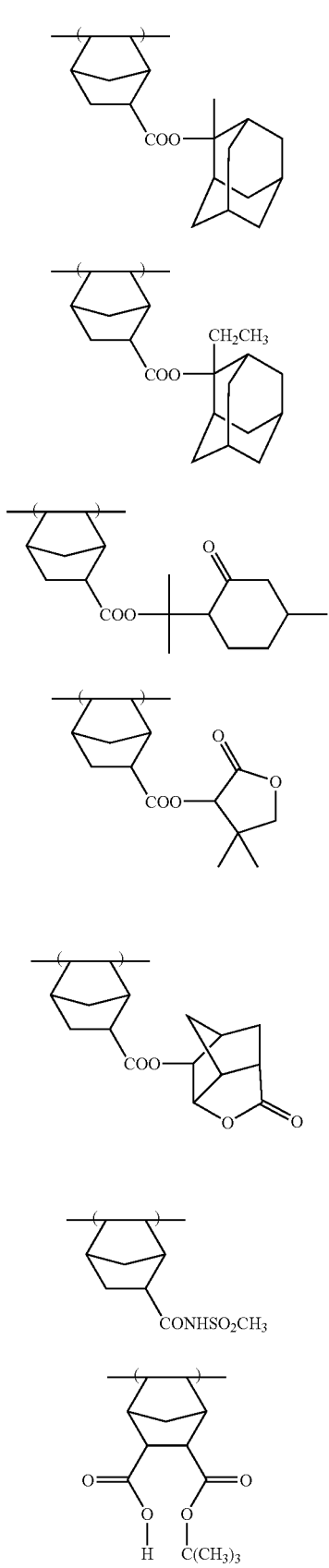
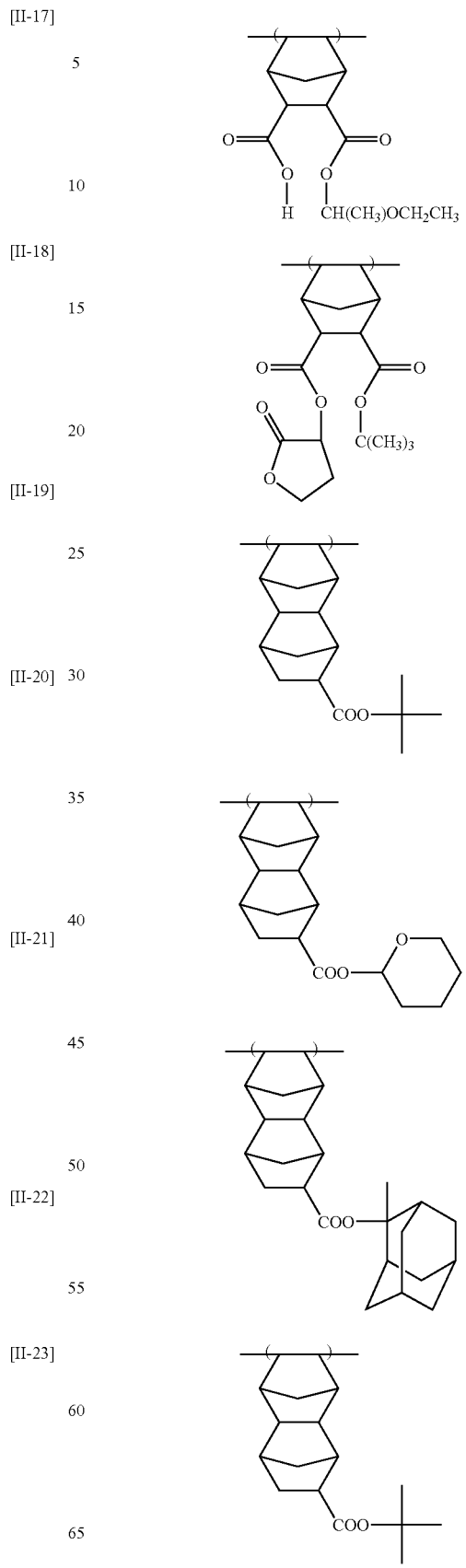

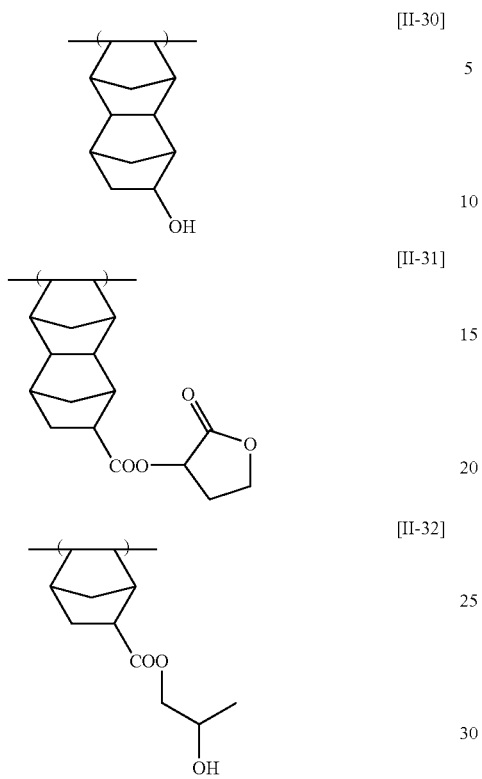

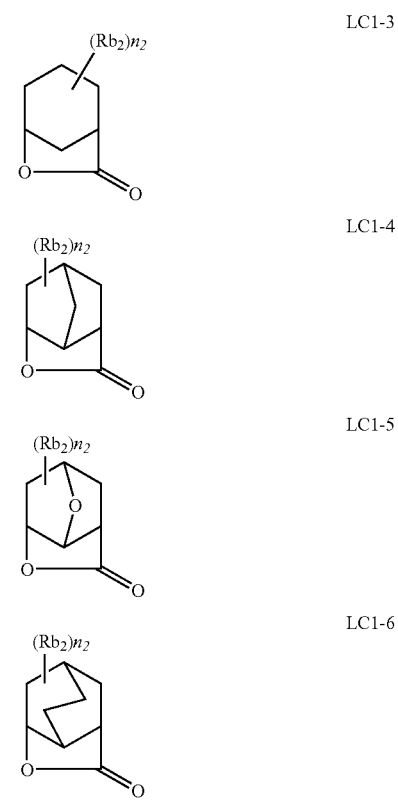

The alicyclic hydrocarbon-based acid-decomposable resin for use in the present invention preferably has a repeating unit containing a group having a lactone structure. As for the group having a lactone structure, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. Th group having a lactone structure is more preferably a group having a lactone structure represented by any one of the following formulae (LC-1-1) to (LC1-16). The group having a lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

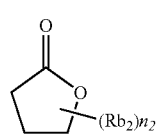

LC1-1

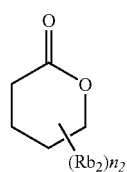

LC1-2

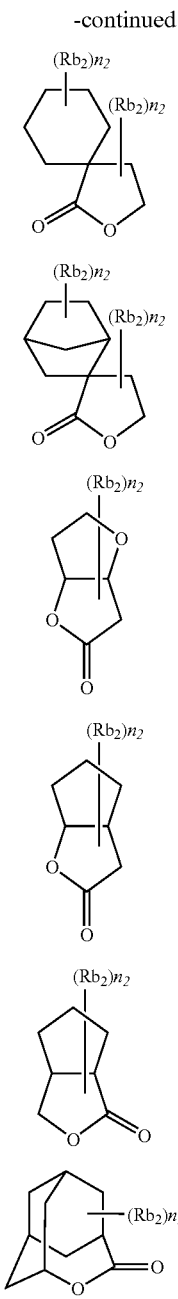

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

The repeating unit containing a group having a lactone structure represented by any one of formulae (LC1-1) to (LC1-16) includes a repeating unit where at least one of $R_{13}$' to $R_{16}$' in formula (II-AB1) or (II-AB2) is a group having a lactone structure represented by any one of formulae (LC1-1) to (LC1-16) (for example, $R_5$ of —$COOR_5$ is a group having a lactone structure represented by any one of formulae (LC1-1) to (LC1-16)), and a repeating unit represented by the following formula (AI):

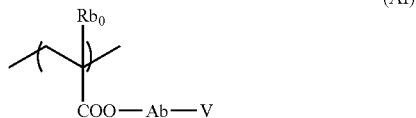

In formula (AI), $Rb_0$ represents a hydrogen atom, a halogen atom or an alkyl group having a carbon number of 1 to 4. Examples of the substituent which the alkyl group of $Rb_0$ may have include a hydroxyl group and a halogen atom.

The halogen atom of $Rb_0$ includes a fluorine atom, a chlorine atom, a bromine atom and an iodine atom.

$Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group comprising a combination thereof.

Ab is preferably a single bond or a linking group represented by —$Ab_1$—$CO_2$—. $Ab_1$ is a linear or branched alkylene group or a monocyclic or polycyclic cycloalkylene group, preferably a methylene group, an ethylene group, a cyclohexylene group, an adamantyl group or a norbornyl group.

V represents a group having a lactone structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

(In the formulae, Rx is H, $CH_3$, $CH_2OH$ or $CF_3$.)

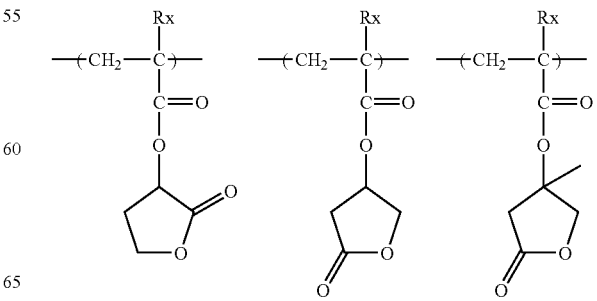

-continued
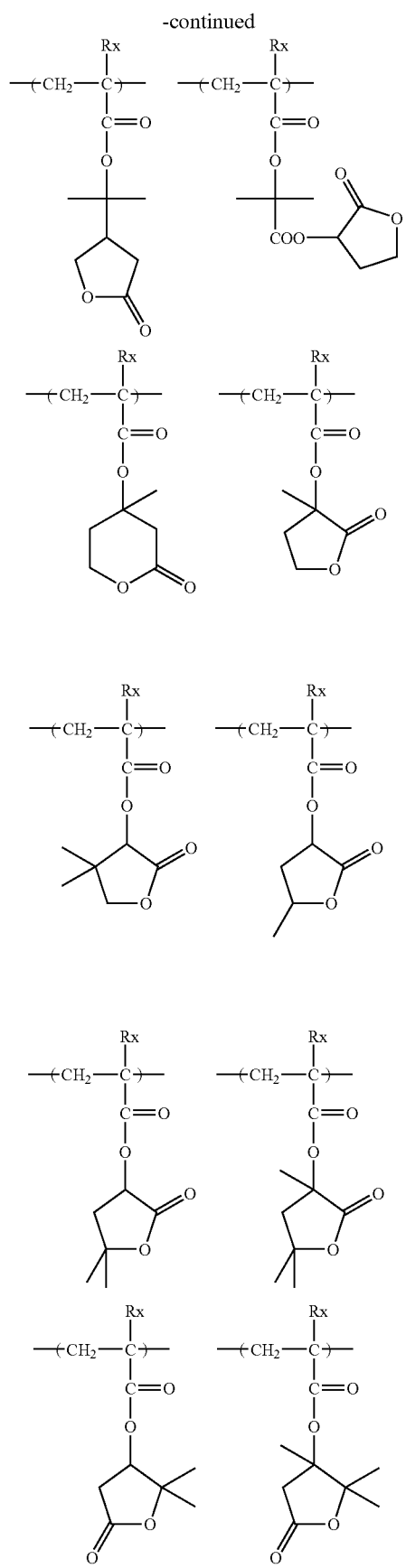
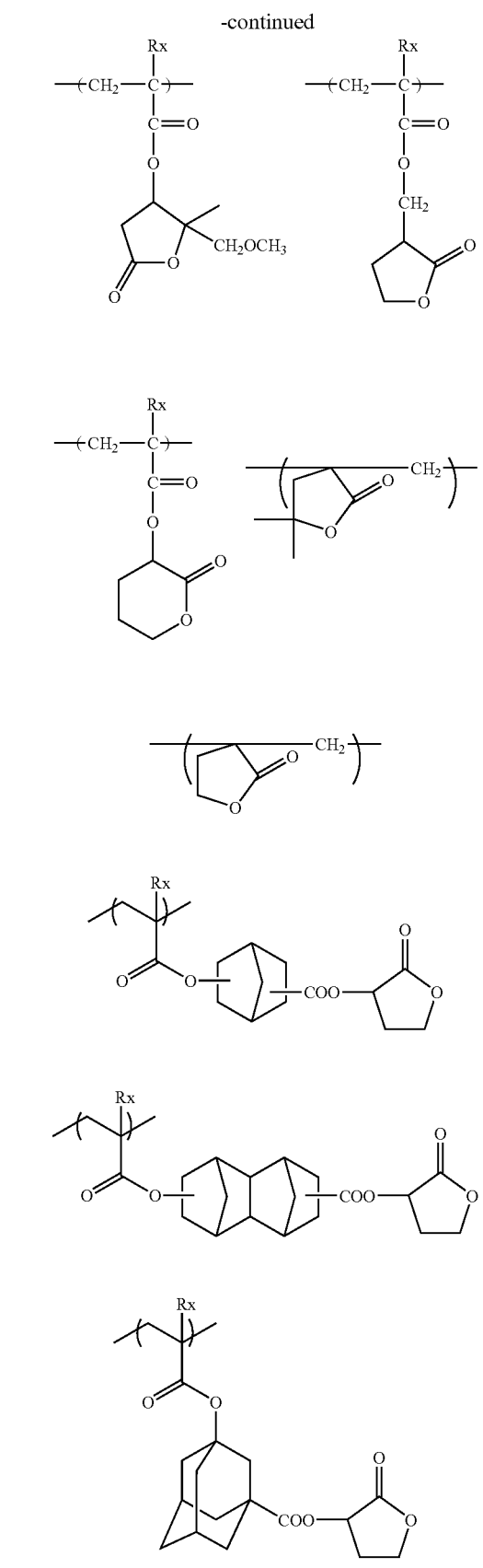

51
(In the formulae, Rx is H, CH₃, CH₂OH or CF₃.)
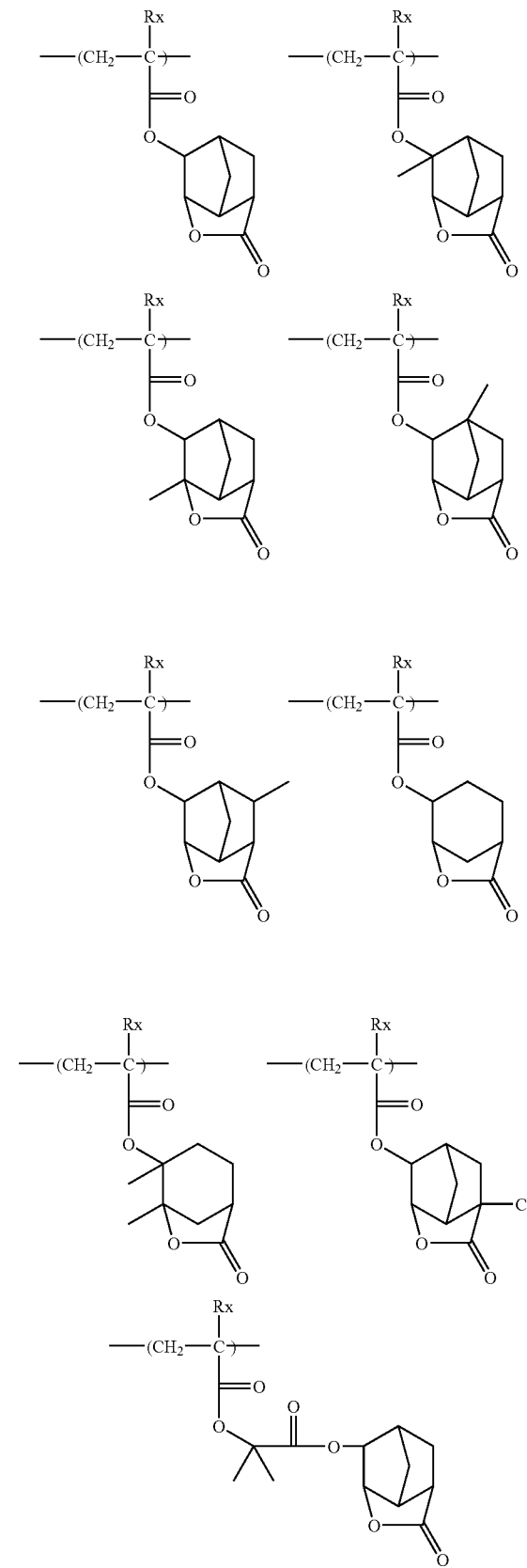
52
-continued
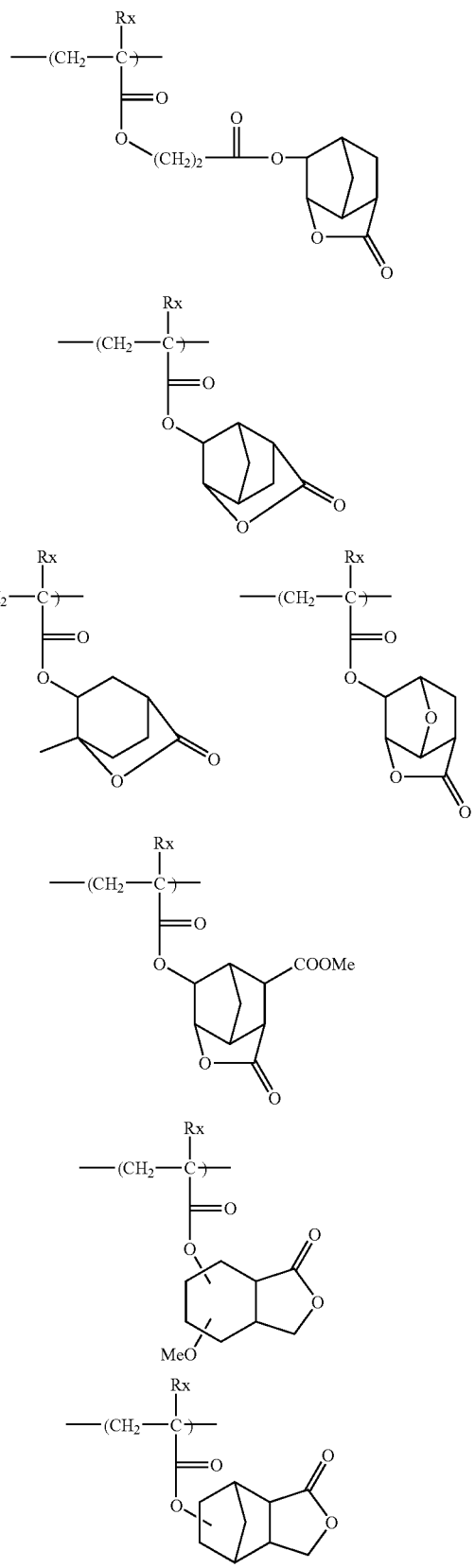

-continued
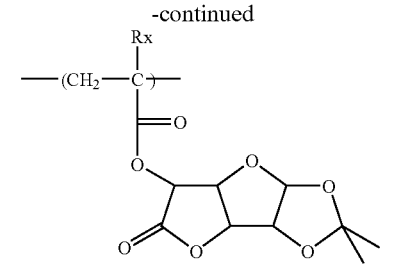
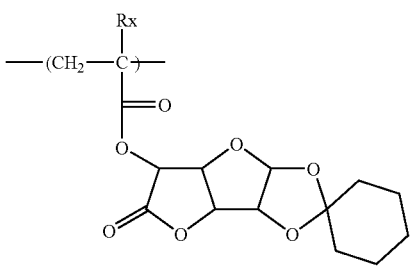
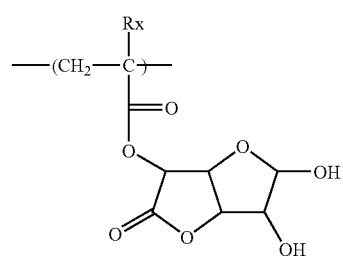
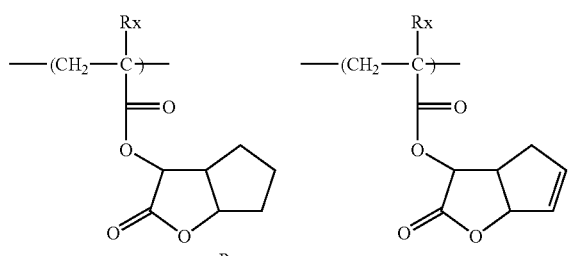
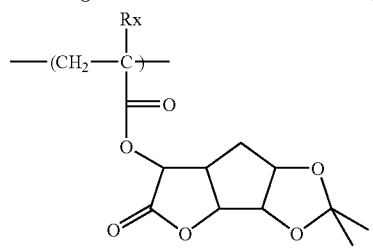
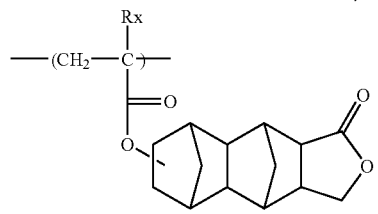
(In the formulae, Rx is H, CH₃, CH₂OH or CF₃.)
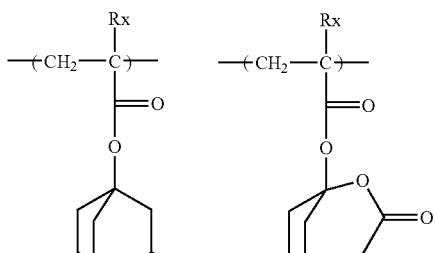
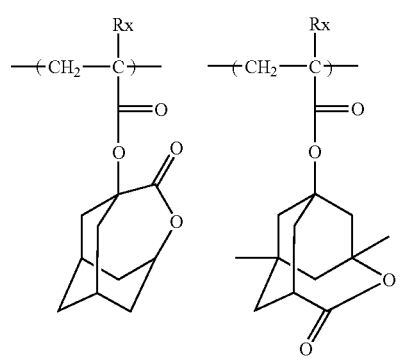
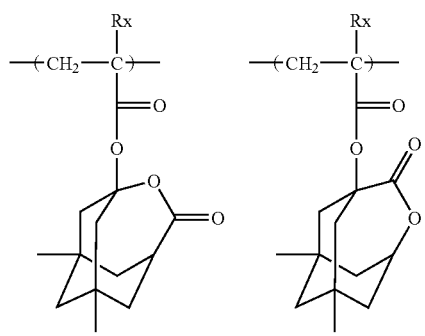
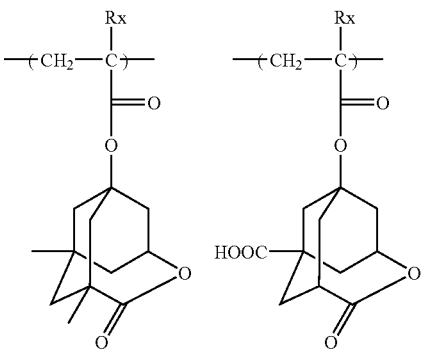

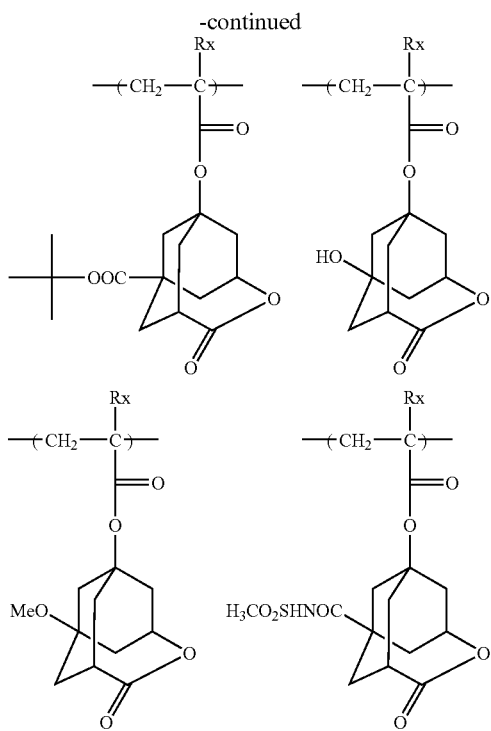

The alicyclic hydrocarbon-based acid-decomposable resin for use in the present invention preferably has a repeating unit containing a group having an alicyclic hydrocarbon structure substituted by a polar group. By virtue of this repeating unit, the adhesion to substrate and the affinity for developer are enhanced. The alicyclic hydrocarbon structure of the alicyclic hydrocarbon structure substituted by a polar group is preferably an adamantyl group, a diamantyl group or a norbornane group. The polar group is preferably a hydroxyl group or a cyano group. The group having an alicyclic hydrocarbon structure substituted by a polar group is preferably a group represented by any one of the following formulae (VIIa) to (VIId):

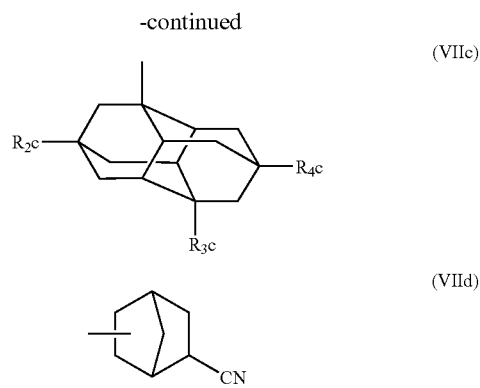

(VIIa)

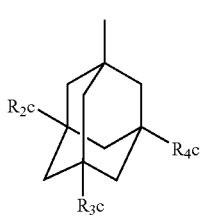

(VIIb)

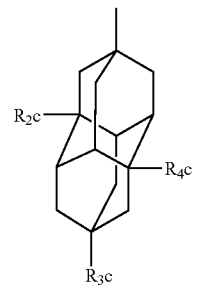

(VIIc)

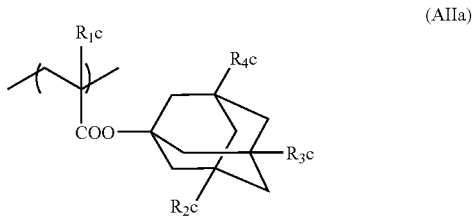

(VIId)

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a group represented by any one of formulae (VIIa) to (VIId) includes a repeating unit where at least one of $R_{13}'$ to $R_{16}'$ in formula (II-AB1) or (II-AB2) has a group represented by any one of formulae (VIIa) to (VIId) (for example, $R_5$ of —$COOR_5$ is a group represented by any one of formulae (VIIa) to (VIId)), and repeating units represented by the following formulae (AIIa) to (AIId):

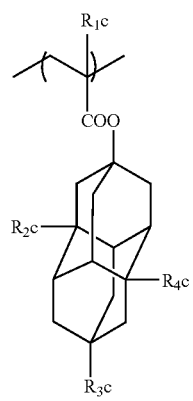

(AIIa)

(AIIb)

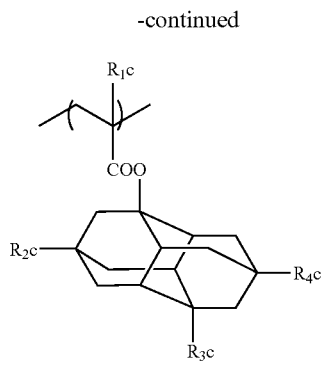

(AIIc)

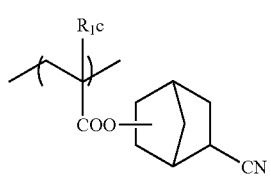

(AIId)

In formulae (AIIa) to (AIId), $R_{1c}$ represents a hydrogen atom, a methyl group, a trifluoromethyl group or a hydroxymethyl group.

specific examples of the repeating units represented by formulae (AIIa) to (AIId) are set forth below, but the present invention is not limited thereto.

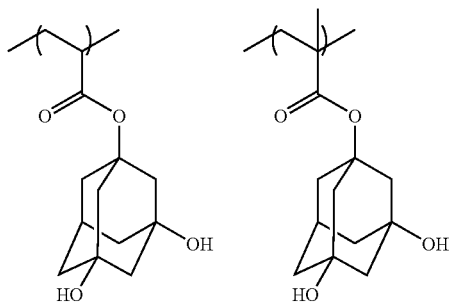

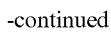

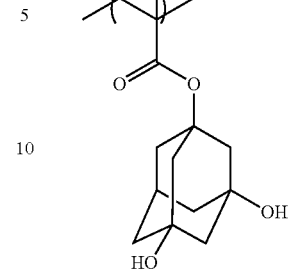

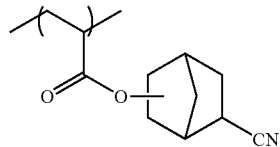

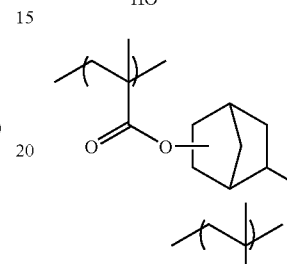

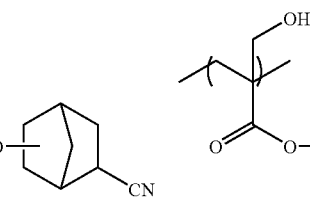
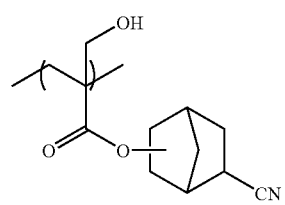

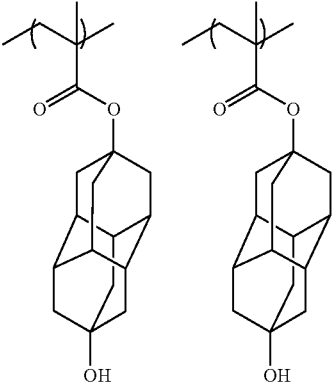

The alicyclic hydrocarbon-based acid-decomposable resin for use in the present invention may contain a repeating unit represented by the following formula (VIII):

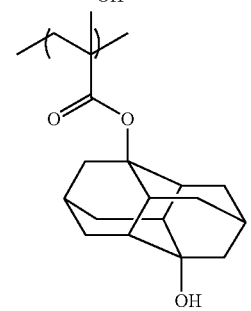

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

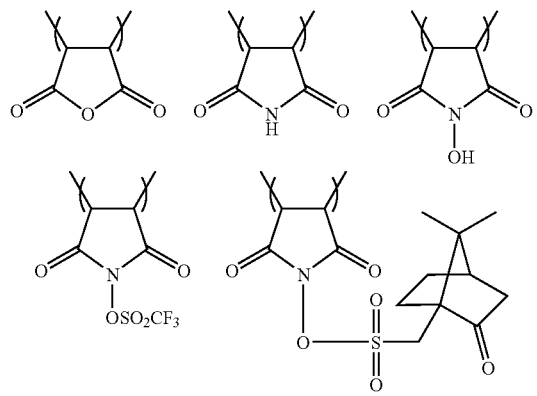

The alicyclic hydrocarbon-based acid-decomposable resin for use in the present invention preferably contains a repeating unit having an alkali-soluble group, more preferably a repeating unit having a carboxyl group. By virtue of containing such a repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is particularly preferred.

The alicyclic hydrocarbon-based acid-decomposable resin for use in the present invention may further contain a repeating unit having from 1 to 3 groups represented by following formula (F1). By virtue of this repeating unit, the line edge roughness performance is enhanced.

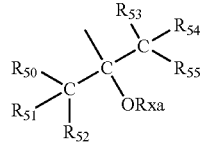

(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rxa represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rxa is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

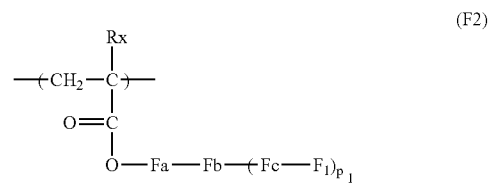

(F2)

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a group represented by formula (F1) are set forth below, but the present invention is not limited thereto.

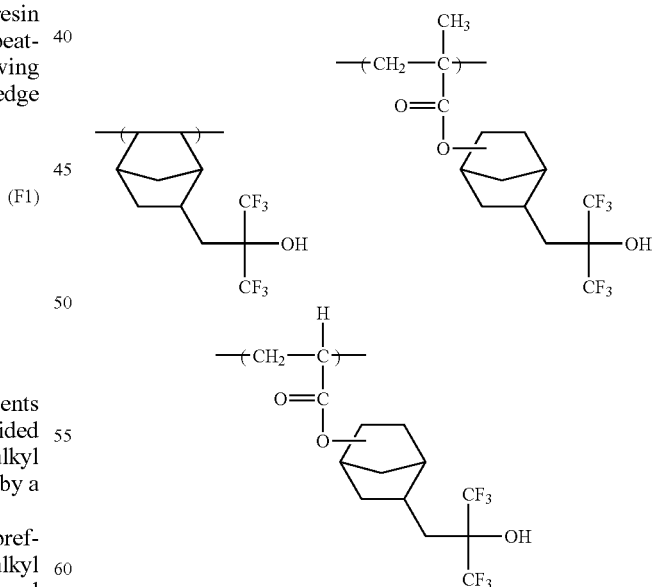

The alicyclic hydrocarbon-based acid-decomposable resin for use in the present invention may further contain a repeating unit having an alicyclic hydrocarbon structure and not exhibiting acid decomposability. By containing such a repeating unit, the dissolving out of low molecular components from the photosensitive film to the immersion liquid at the immersion exposure can be reduced. Examples of this repeating unit include 1-adamantyl(meth)acrylate, tricyclodecanyl (meth)acrylate and cyclohexyl(meth)acrylate.

The alicyclic hydrocarbon-based acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably a resin containing a (meth)acrylate repeating unit having a structure represented by any one of formulae (pI) to (pV), and (2) a resin containing a repeating unit represented by formula (II-AB) (main chain type).

The resin of (2) further includes:

(3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit based on the monomer as the further copolymerization component in the resin can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the composition of the present invention for exposure with ArF, the resin preferably has no aromatic group in view of transparency to ArF light.

The alicyclic hydrocarbon-based acid-decomposable resin for use in the present invention is preferably a resin where all repeating units are composed of a (meth)acrylate repeating unit. In this case, the repeating units may be all a methacrylate, all an acrylate, or a methacrylate/acrylate mixture, but the content of the acrylate repeating unit is preferably 50 mol % or less based on all repeating units. The alicyclic hydrocarbon-based acid-decomposable resin is more preferably a ternary copolymerization polymer comprising from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having an alicyclic hydrocarbon structure substituted by a polar group, or a quaternary copolymerization polymer additionally comprising from 0 to 20 mol % of other repeating units.

In particular, the resin is preferably a ternary copolymerization polymer comprising from 20 to 50 mol % of the repeating unit having an acid-decomposable group represented by any one of the following formulae (ARA-1) to (ARA-5), from 20 to 50 mol % of the repeating unit having a lactone group represented by any one of the following formulae (ARL-1) to (ARL-6), and from 5 to 30 mol % of the repeating unit having an alicyclic hydrocarbon structure substituted by a polar group represented by any one of the following formulae (ARH-1) to (ARH-3), or a quaternary copolymerization polymer further comprising from 5 to 20 mol % of the repeating unit containing a carboxyl group or a structure represented by formula (F1) and the repeating unit having an alicyclic hydrocarbon structure and not exhibiting acid decomposability.

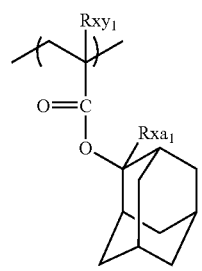

ARA-1

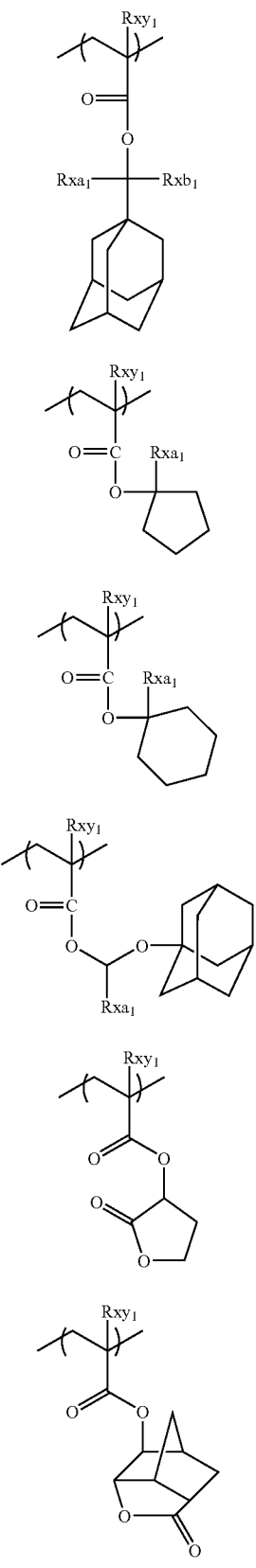

-continued

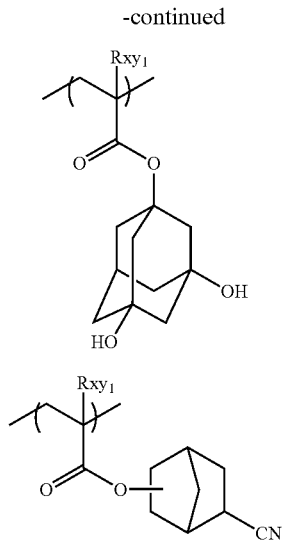

ARH-2

ARH-3

In the formulae,

Rxy$_1$ represents a hydrogen atom or a methyl group, and

Rxa$_1$ and Rxb$_1$ each independently represents a methyl group or an ethyl group.

The alicyclic hydrocarbon-based acid-decomposable resin for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the photosensitive composition of the present invention. By the use of this solvent, production of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobis-dimethylvaleronitrile and dimethyl 2,2'-azobis(2-methylpropionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

In the case of using the composition of the present invention for the upper resist of a multilayer resist, the resin (C) preferably has a silicon atom.

As for the resin having a silicon atom and capable of decomposing under the action of an acid to increase the solubility in an alkali developer, a resin having a silicon atom at least in either the main chain or the side chain can be used. Examples of the resin having a siloxane structure in the side chain of the resin include a copolymer of an olefin-based monomer having a silicon atom in the side chain and a (meth) acrylic acid-based monomer having a maleic anhydride and an acid-decomposable group in the side chain.

The resin having a silicon atom is preferably a resin having a trialkylsilyl structure or a monocyclic or polycyclic siloxane structure, more preferably a resin containing a repeating unit having a structure represented by any one of the following formulae (SS-1) to (SS-4), still more preferably a resin containing a (meth)acrylic acid ester-based, vinyl-based or acryl-based repeating unit having a structure represented by any one of formulae (SS-1) to (SS-4).

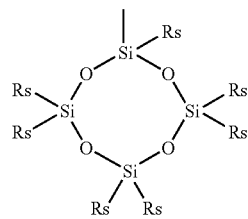

SS-1

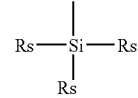

SS-2

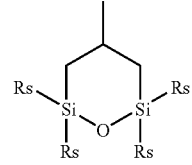

SS-3

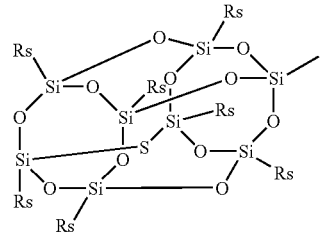

SS-4

In formulae (SS-1) to (SS-4), Rs represents an alkyl group having a carbon number of 1 to 5, preferably a methyl group or an ethyl group.

The resin having a silicon atom is preferably a resin containing two or more different silicon atom-containing repeating units, more preferably a resin containing both (Sa) a repeating unit having from 1 to 4 silicon atoms and (Sb) a repeating unit having from 5 to 10 silicon atoms, still more preferably a resin containing at least one repeating unit having a structure represented by any one of formulae (SS-1) to (SS-3) and a repeating unit having a structure represented by formula (SS-4).

In the case of irradiating the positive photosensitive composition of the present invention with F$_2$ excimer laser light, the resin (C) is preferably a resin having a structure that a fluorine atom is substituted to the main chain and/or the side chain of the polymer skeleton, and being capable of decomposing under the action of an acid to increase the solubility in an alkali developer (hereinafter sometimes referred to as a "fluorine group-containing resin"), more preferably a resin containing a hydroxyl group with the 1-position being substituted by a fluorine atom or a fluoroalkyl group or containing a group where the hydroxyl group with the 1-position being substituted by a fluorine atom or a fluoroalkyl group is protected by an acid-decomposable group, and most preferably a resin having a hexafluoro-2-propanol structure or a structure where the hydroxyl group of hexafluoro-2-propanol is protected by an acid-decomposable group. By virtue of introducing a fluorine atom, the transparency to far ultraviolet light, particularly $F_2$ (157 nm) light, can be enhanced.

Preferred examples of the fluorine group-containing resin include a resin having at least one repeating unit represented by the following formulae (FA) to (FG):

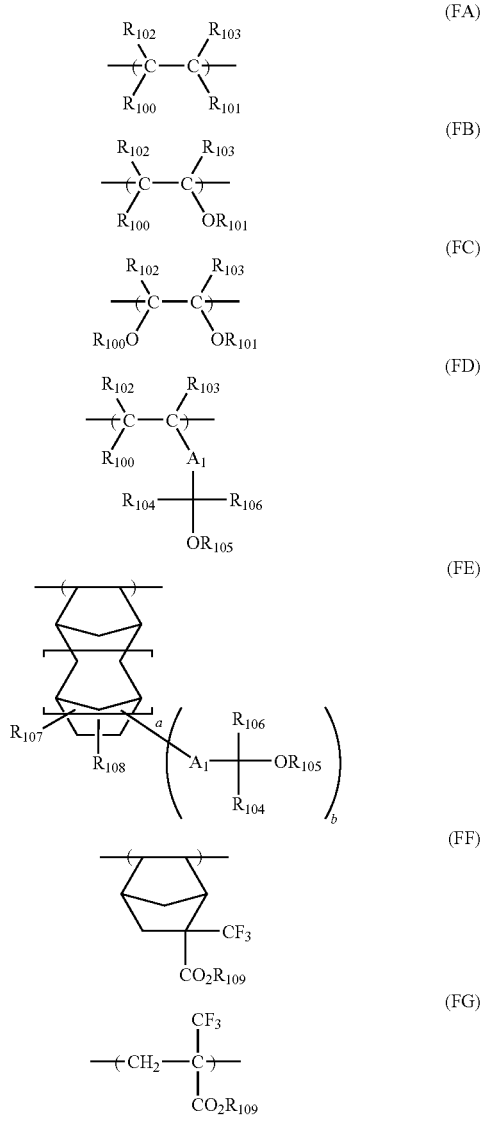

In these formulae, $R_{100}$ to $R_{103}$ each represents a hydrogen atom, a fluorine atom, an alkyl group or an aryl group.

$R_{104}$ and $R_{106}$ each is a hydrogen atom, a fluorine atom or an alkyl group, and at least either one of $R_{104}$ and $R_{106}$ is a fluorine atom or a fluoroalkyl group. $R_{104}$ and $R_{106}$ are preferably both a trifluoromethyl group.

$R_{105}$ is a hydrogen atom, an alkyl group, a cycloalkyl group, an acyl group, an alkoxycarbonyl group or a group capable of decomposing under the action of an acid.

$A_1$ is a single bond, a divalent linking group such as linear, branched or cyclic alkylene group, alkenylene group, arylene group, —OCO—, —COO— and —CON($R_{24}$)—, or a linking group comprising a plurality of members out of these groups. $R_{24}$ is a hydrogen atom or an alkyl group.

$R_{107}$ and $R_{108}$ each is a hydrogen atom, a halogen atom, an alkyl group, an alkoxy group, an alkoxycarbonyl group or a group capable of decomposing under the action of an acid.

$R_{109}$ is a hydrogen atom, an alkyl group, a cycloalkyl group or a group capable of decomposing under the action of an acid.

b is 0, 1 or 2.

In formulae (FA) and (FC), $R_{100}$ and $R_{101}$ may form a ring through an alkylene group (having a carbon number of 1 to 5) which may be substituted by fluorine.

The repeating units represented by formulae (FA) to (FG) each contains at least one fluorine atom, preferably 3 or more fluorine atoms, per one repeating unit.

In formulae (FA) to (FG), the alkyl group is, for example, an alkyl group having a carbon number of 1 to 8, and specific preferred examples thereof include a methyl group, an ethyl group, a propyl group, an n-butyl group, a sec-butyl group, a hexyl group, a 2-ethylhexyl group and an octyl group.

The cycloalkyl group may be monocyclic or polycyclic. The monocyclic type is a cycloalkyl group having a carbon number of 3 to 8, and preferred examples thereof include a cyclopropyl group, a cyclopentyl group, a cyclohexyl group, a cycloheptyl group and a cyclooctyl group. The polycyclic type is a cycloalkyl group having a carbon number of 6 to 20, and preferred examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. In these monocyclic or polycyclic cycloalkyl groups, the carbon atom may be substituted by a heteroatom such as oxygen atom.

The fluoroalkyl group is, for example, a fluoroalkyl group having a carbon number of 1 to 12, and specific preferred examples thereof include a trifluoromethyl group, a perfluoroethyl group, a perfluoropropyl group, a perfluorobutyl group, a perfluorohexyl group, a perfluorooctyl group, a perfluorooctylethyl group and a perfluorododecyl group.

The aryl group is, for example, an aryl group having a carbon number of 6 to 15, and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The alkoxy group is, for example, an alkoxy group having a carbon number of 1 to 8, and specific preferred examples thereof include a methoxy group, an ethoxy group, an n-propoxy group, an iso-propoxy group, a butoxy group, a pentoxy group, an allyloxy group and an octoxy group.

The acyl group is, for example, an acyl group having a carbon number of 1 to 10, and specific preferred examples thereof include a formyl group, an acetyl group, a propanoyl group, a butanoyl group, a pivaloyl group, an octanoyl group and a benzoyl group.

The alkoxycarbonyl group is preferably a secondary alkoxycarbonyl group, more preferably a tertiary alkoxycarbonyl group, such as i-propoxycarbonyl group, tert-butoxycarbonyl group, tert-amyloxycarbonyl group and 1-methyl-1-cyclohexyloxycarbonyl group.

Examples of the halogen atom include a fluorine atom, a chlorine atom, a bromine atom and an iodine atom.

The alkylene group is preferably an alkylene group having a carbon number of 1 to 8, such as methylene group, ethylene group, propylene group, butylene group, hexylene group and octylene group.

The alkenylene group is preferably an alkenylene group having a carbon number of 2 to 6, such as ethenylene group, propenylene group and butenylene group.

The cycloalkylene group is preferably a cycloalkylene group having a carbon number of 5 to 8, such as cyclopentylene group and cyclohexylene group.

The arylene group is preferably an arylene group having a carbon number of 6 to 15, such as phenylene group, tolylene group and naphthylene group.

These groups each may have a substituent, and examples of the substituent include those having an active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

Here, the alkyl group, cycloalkyl group and aryl group include those described above, and the alkyl group may be further substituted by a fluorine atom or a cycloalkyl group.

Examples of the group capable of decomposing under the action of an acid to show alkali solubility, which is contained in the fluorine group-containing resin of the present invention, include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) and —COO—C($R_{36}$)($R_{37}$)(O$R_{39}$).

$R_{36}$ to $R_{39}$ each represents an alkyl group, a cycloalkyl group, an aryl group, an aralkyl group or an alkenyl group, and $R_{01}$ and $R_{02}$ each represents a hydrogen atom, an alkyl group, a cycloalkyl group, an alkenyl group (e.g., vinyl, allyl, butenyl, cyclohexenyl), an aralkyl group (e.g., benzyl, phenethyl, naphthylmethyl) or an aryl group.

Specific preferred examples include an ether or ester group of tertiary alkyl group, such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group; an acetal or acetal ester group such as 1-alkoxy-1-ethoxy group and tetrahydropyranyl group; a tert-alkylcarbonate group; and a tert-alkylcarbonylmethoxy group.

Specific examples of the repeating structural units represented by formulae (FA) to (FG) are set forth below, but the present invention is not limited thereto.

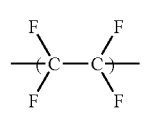
(F-1)

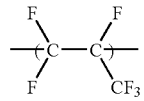
(F-2)

-continued

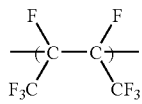
(F-3)

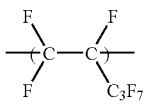
(F-4)

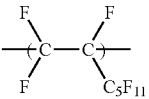
(F-5)

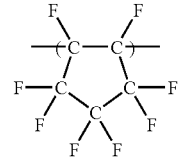
(F-6)

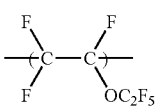
(F-7)

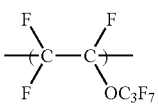
(F-8)

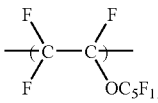
(F-9)

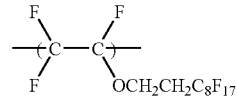
(F-10)

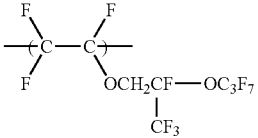
(F-11)

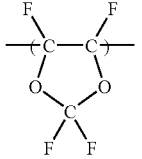
(F-12)

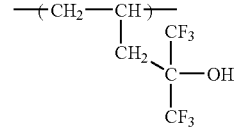
(F-13)

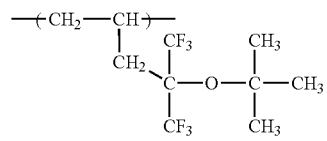
(F-14)

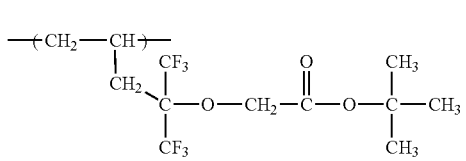
(F-15)
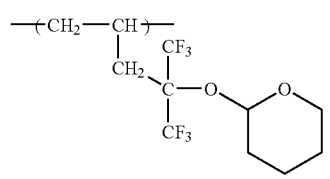
(F-16)
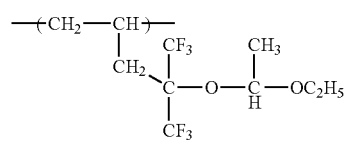
(F-17)
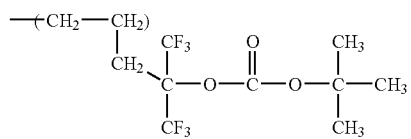
(F-18)
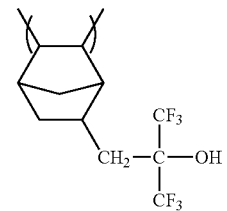
(F-19)
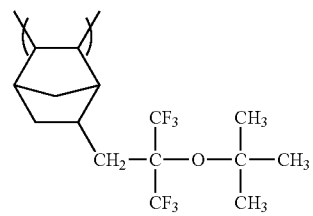
(F-20)
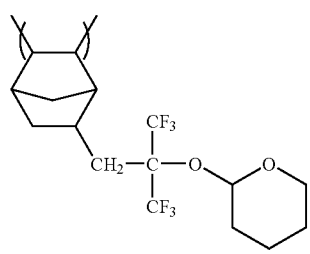
(F-21)
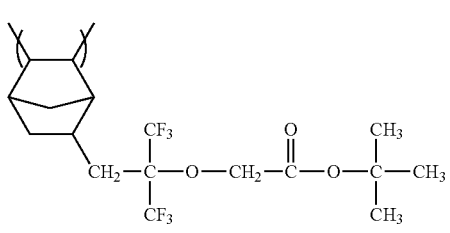
(F-22)
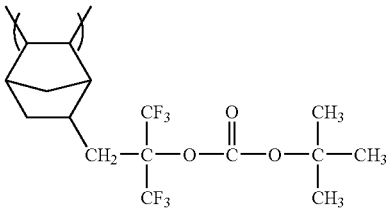
(F-23)
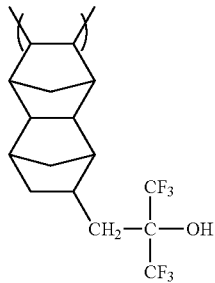
(F-24)
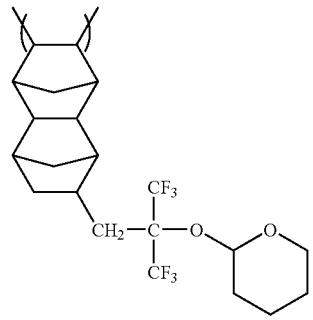
(F-25)
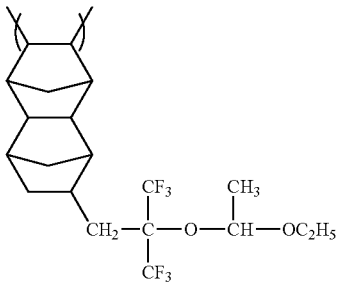
(F-26)
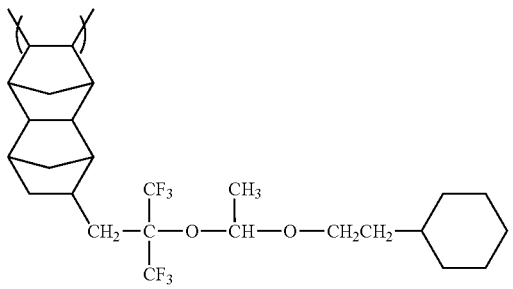
(F-27)

(F-28)
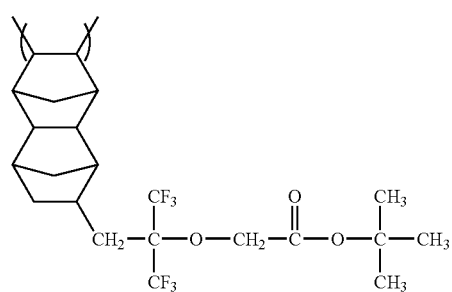
(F-29)
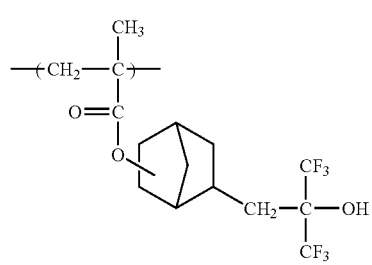
(F-30)
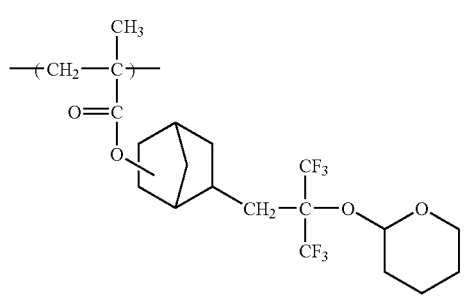
(F-31)
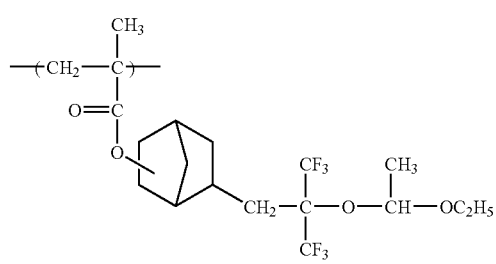
(F-32)
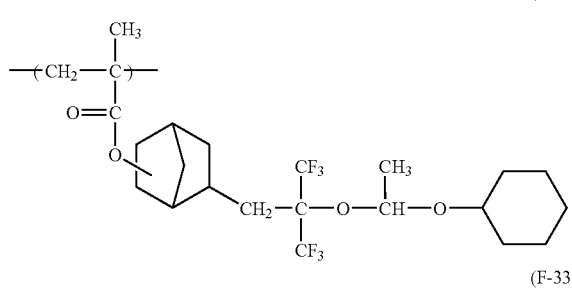
(F-33)
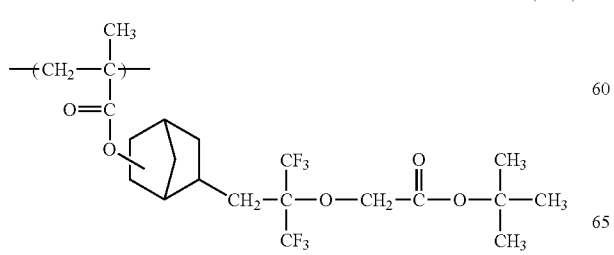
(F-34)
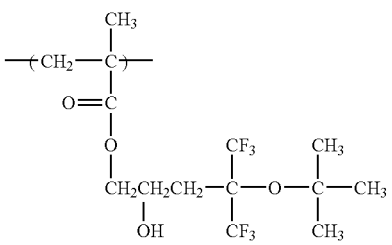
(F-35)
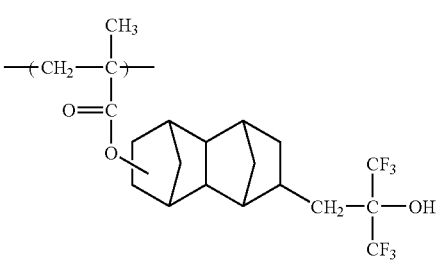
(F-36)
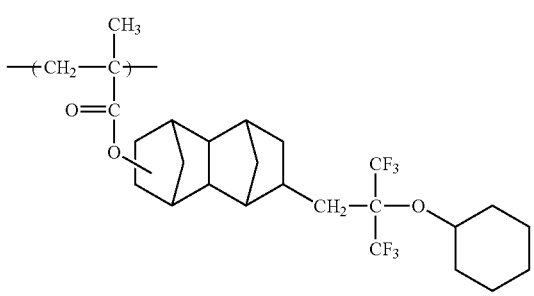
(F-37)
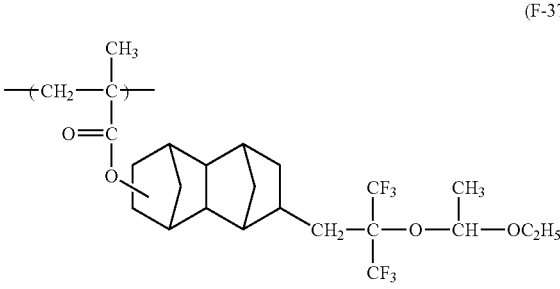
(F-38)
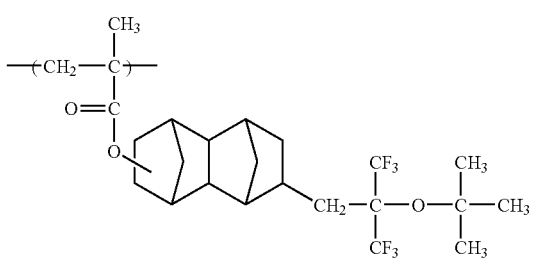
(F-39)
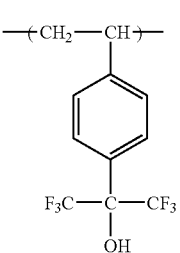

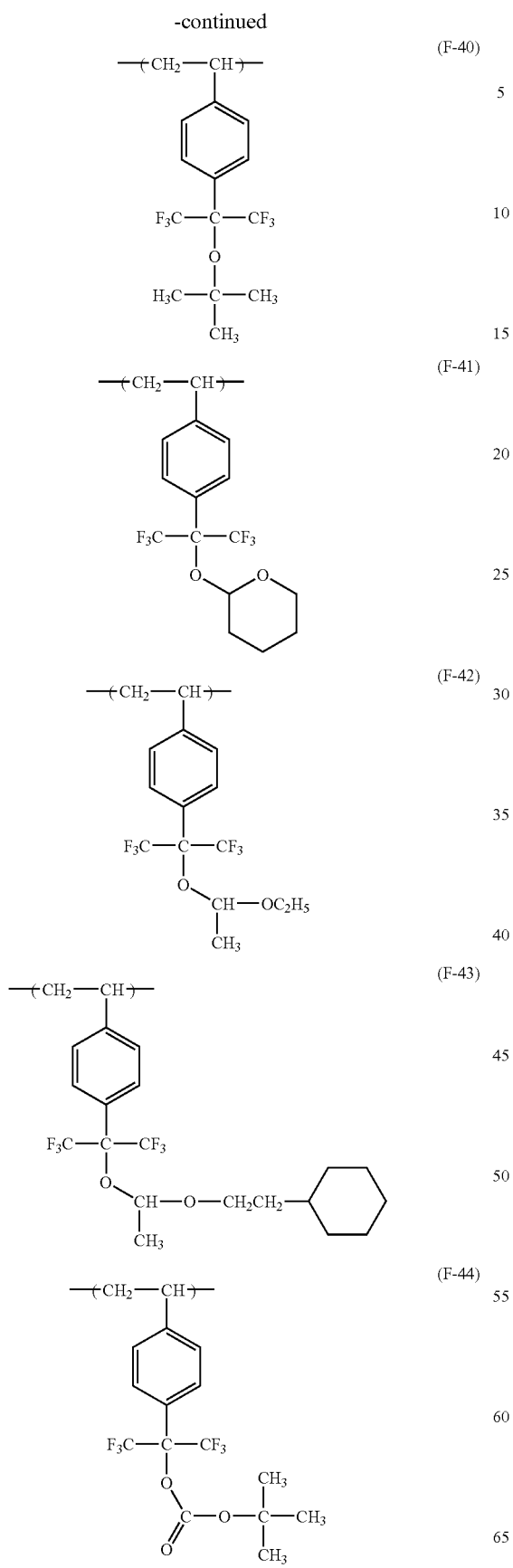
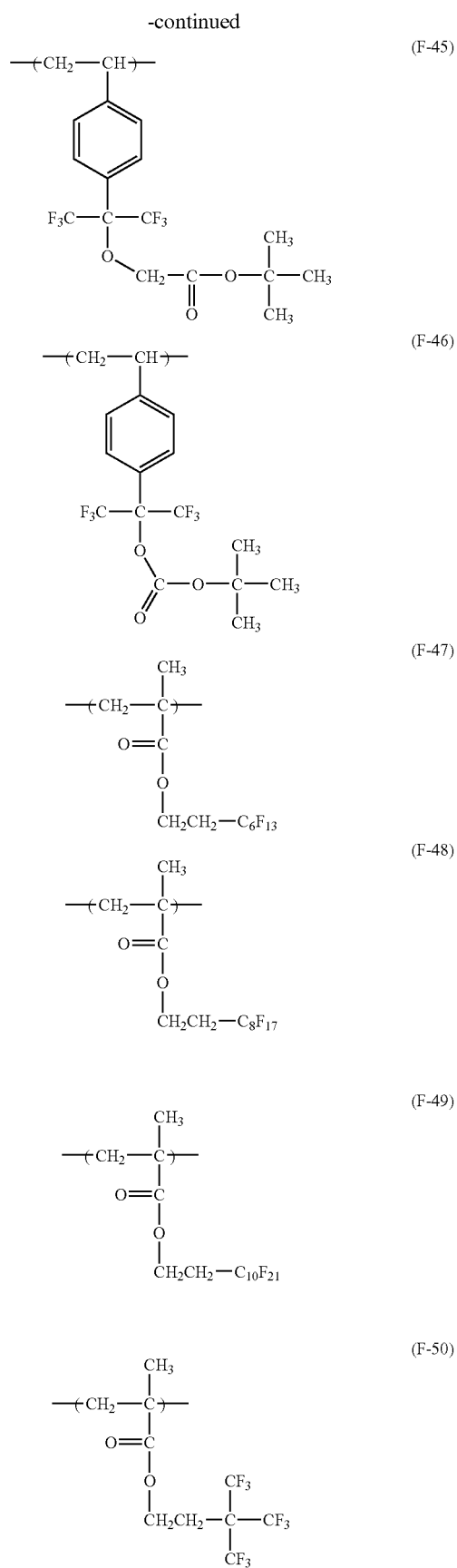

-continued
(F-51)
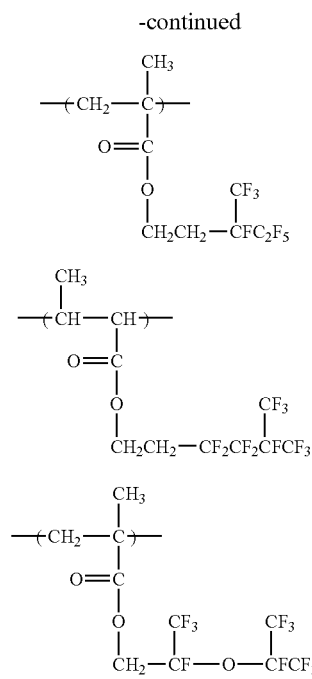
(F-52)
(F-53)
(F-54)
(F-55)
(F-56)
-continued
(F-57)
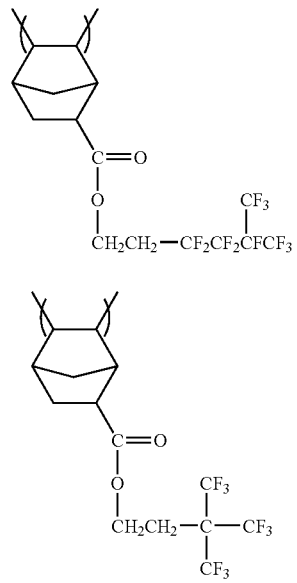
(F-58)
(F-59)
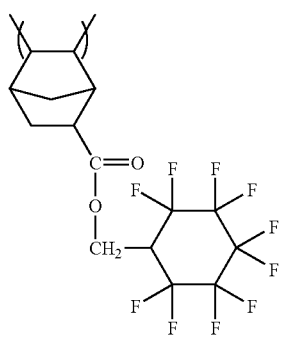
(F-60)
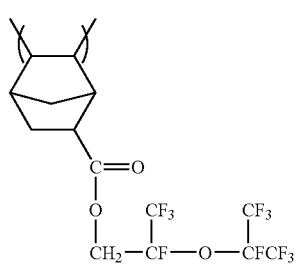
(F-61)
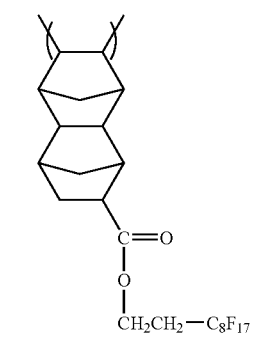

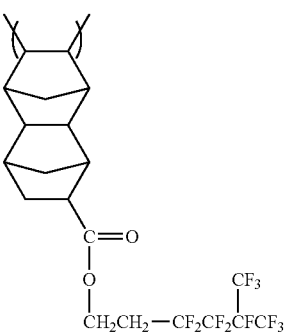

(F-62)

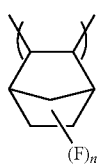

(F-63)

n = 8

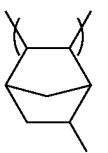

(F-64)

(F-65)

The total content of the repeating units represented by formulae (FA) to (FG) is generally from 10 to 80 mol %, preferably from 30 to 70 mol %, more preferably from 35 to 65 mol %, based on all repeating units constituting the resin.

In the fluorine group-containing resin for use in the present invention, in addition to the above-described repeating structural units, other polymerizable monomers may be copolymerized for the purpose of enhancing the performance of the resist of the present invention.

Examples of the copolymerization monomer which can be used include a compound having one addition-polymerizable unsaturated bond selected from acrylic acid esters other than those described above, acrylamides, methacrylic acid esters, methacrylamides, allyl compounds, vinyl ethers, vinyl esters, styrenes and crotonic acid esters.

From the standpoint of increasing the dry etching resistance, controlling the alkali solubility and enhancing the adhesion to substrate, the fluorine group-containing resin preferably contains other repeating units as a copolymerization component in addition to the fluorine atom-containing repeating unit above. Preferred examples of the other repeating unit include:

1) a repeating unit having an alicyclic hydrocarbon structure represented by any one of formulae (pI) to (pV) and formula (II-AB), specifically, repeating units 1 to 23 and repeating units [II-1] to [II-32], preferably repeating units 1 to 23 where Rx is $CF_3$;

2) a repeating unit having a lactone structure represented by any one of formulae (Lc) and (V-1) to (V-5), specifically, repeating units shown above, particularly, repeating units having a group represented by any one of formulae (Lc) and (V-1) to (V-4); and 3) a repeating unit derived from a maleic anhydride, a vinyl ether or a vinyl compound having a cyano group, represented by the following formula (XV), (XVI) or (XVII), specifically, repeating units (C-1) to (C-15). These repeating units each may or may not contain a fluorine atom.

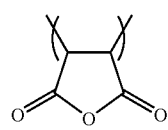

(XV)

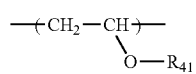

(XVI)

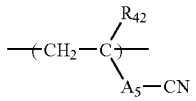

(XVII)

In these formulae, $R_{41}$ represents an alkyl group, a cycloalkyl group, an aralkyl group or an aryl group, and the alkyl group of $R_{41}$ may be substituted by an aryl group.

$R_{42}$ represents a hydrogen atom, a halogen atom, a cyano group or an alkyl group.

$A_5$ represents a single bond, a divalent alkylene, alkenylene, cycloalkylene or arylene group, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represents a single bond or a divalent alkylene, alkenylene, cycloalkylene or arylene group which may have an ether group, an ester group, an amide group, a urethane group or a ureido group.

$R_{24}$ represents a hydrogen atom, an alkyl group, a cycloalkyl group, an aralkyl group or an aryl group.

Examples of each substituent are the same as those described above for the substituents of formulae (FA) to (FG).

Specific examples of the repeating structural units represented by formulae (XV) to (XVII) are set forth below, but the present invention is not limited thereto.

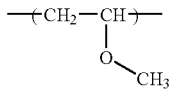

(C-1)

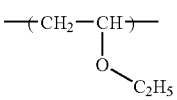

(C-2)

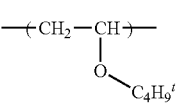

(C-3)

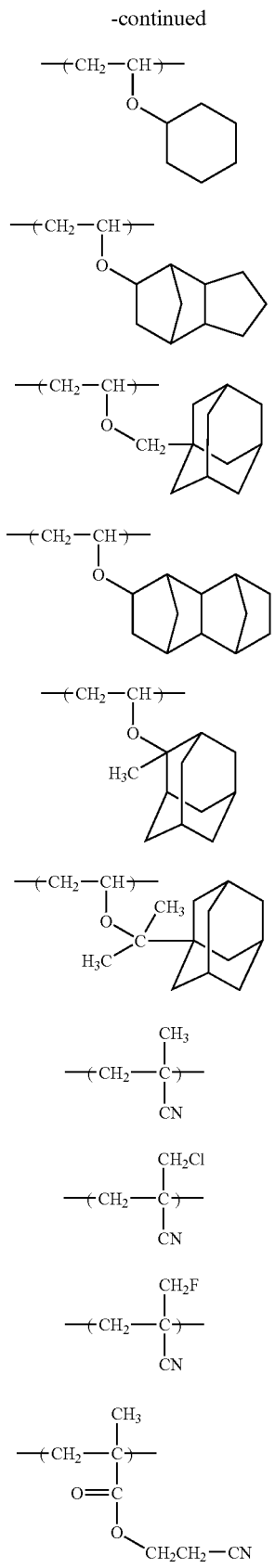

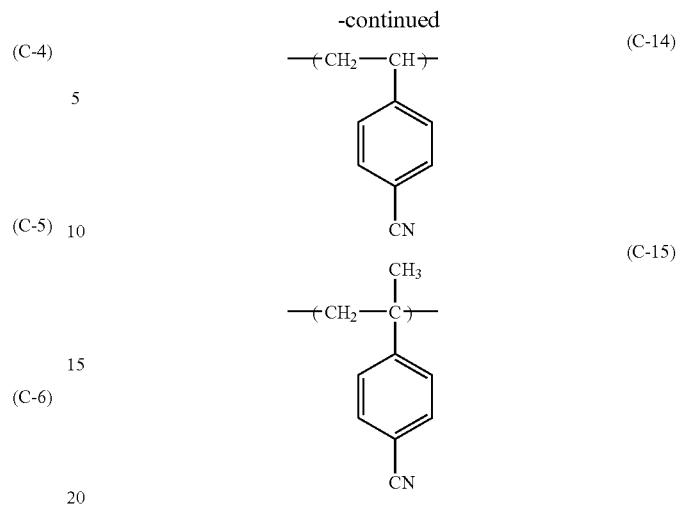

The total amount of the repeating unit represented by any one of formulae (XV) to (XVII) and the other repeating unit is generally from 0 to 70 mol %, preferably from 10 to 60 mol %, more preferably from 20 to 50 mol %, based on all repeating units constituting the resin.

The fluorine group-containing resin may contain an acid-decomposable group in any repeating unit.

The content of the repeating unit having an acid-decomposable group is preferably from 10 to 70 mol %, more preferably from 20 to 60 mol %, still more preferably from 30 to 60 mol %, based on all repeating units.

The fluorine group-containing resin can be synthesized by radical polymerization nearly in the same manner as the alicyclic hydrocarbon-based acid-decomposable resin.

The weight average molecular weight of the resin (C) for use in the present invention is preferably from 1,000 to 200,000 in terms of polystyrene as measured by the GPC method. When the weight average molecular weight is 1,000 or more, heat resistance and dry etching resistance can be elevated and when the weight average molecular weight is 200,000 or less, developability can be enhanced and at the same time, by virtue of very low viscosity, the film-forming property can be enhanced.

In the photosensitive composition of the present invention, the blending amount of the resin (C) in the entire composition is preferably from 40 to 99.9 mass %, more preferably from 50 to 99.9 mass %, based on the entire solid content.

[6] (D) Resin Soluble in an Alkali Developer (Hereinafter Sometimes Referred to as a "Component (D)" or "Alkali-Soluble Resin")

The alkali dissolution rate of the alkali-soluble resin is preferably 20 Å/sec or more, more preferably 200 Å/sec or more, as measured (at 23° C.) in 0.261N tetramethylammonium hydroxide (TMAH).

Examples of the alkali-soluble resin for use in the present invention include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, 5 to 30 mol % being O-methylated, O-(1-methoxy)ethylated, O-(1-ethoxy)ethylated, O-2-tetrahydropyranylated or O-(tert-butoxycarbonyl)methylated) or O-acylated (for example, 5 to 30 mol % being o-acylated or O-(tert-butoxy) carbonylated), a styrene-maleic anhydride copolymer, a styrene-hydroxystyrene copolymer, an α-methylstyrene-hydroxystyrene copolymer, a carboxyl group-containing methacrylic resin including a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer, and an α-methylstyrene-hydroxystyrene copolymer.

The novolak resin can be obtained by subjecting a predetermined monomer as the main component to addition condensation with aldehydes in the presence of an acidic catalyst.

The weight average molecular weight of the alkali-soluble resin is 2,000 or more, preferably from 5,000 to 200,000, more preferably from 5,000 to 100,000.

Here, the weight average molecular weight is defined as a polystyrene-reduced value measured by gel permeation chromatography.

In the present invention, two or more kinds of these alkali-soluble resins (D) may be used in combination.

The amount used of the alkali-soluble resin is from 40 to 97 mass %, preferably from 60 to 90 mass %, based on the entire solid content of the photosensitive composition.

[7] (E) Acid Crosslinking Agent Capable of Crosslinking with the Alkali-Soluble Resin Above Under the Action of an Acid (Hereinafter Sometimes Referred to as a "Component (E)" or a "Crosslinking Agent")

In the negative photosensitive composition of the present invention, a crosslinking agent is used.

The crosslinking agent may be any compound as long as it brings about crosslinking of the resin soluble in an alkali developer under the action of an acid, but the following compounds (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The alkoxymethyl group is preferably an alkoxymethyl group having a carbon number of 6 or less, and the acyloxymethyl group is preferably an acyloxymethyl group having a carbon number of 6 or less.

Among these crosslinking agents, particularly preferred compounds are set forth below.

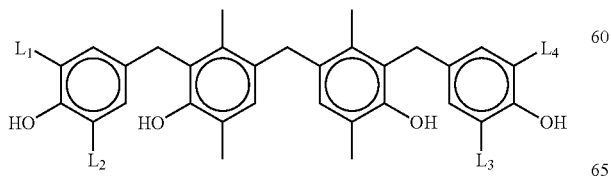

-continued

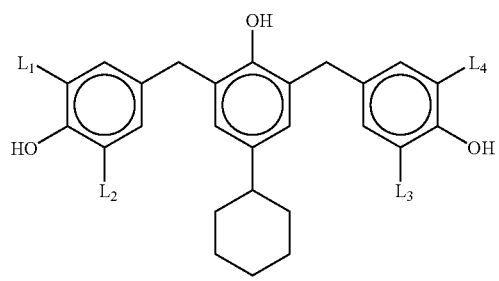

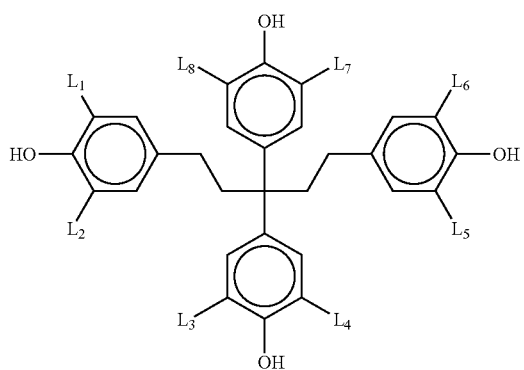

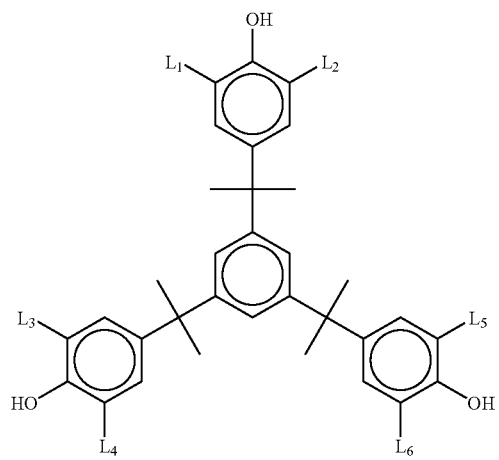

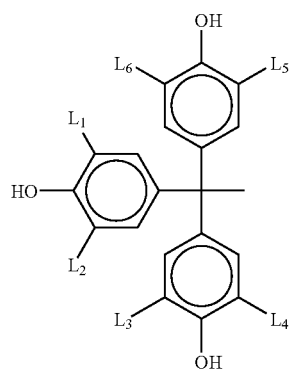

-continued

[chemical structures shown]

In the formulae, $L_1$ to $L_8$, which may be the same or different, each represents a hydrogen atom, a hydroxymethyl group, a methoxymethyl group, an ethoxymethyl group or an alkyl group having a carbon number of 1 to 6.

The crosslinking agent is usually used in an amount of 3 to 70 mass %, preferably from 5 to 50 mass %, based on the solid content of the negative photosensitive composition.

[8] (F) Dissolution Inhibiting Compound Capable of Decomposing under the Action of an Acid to Increase the Solubility in an Alkali Developer and Having a Molecular Weight of 3,000 or Less (Hereinafter Sometimes Referred to as a "Dissolution Inhibiting Compound")

In order to prevent reduction in the transparency to light at 220 nm or less, the dissolution inhibiting compound is preferably an alicyclic or aliphatic compound containing an acid-decomposable group, such as acid-decomposable group-containing cholic acid derivative described in *Proceeding of SPIE*, 2724, 355 (1996). Examples of the acid-decomposable group and alicyclic structure are the same as those described above for the alicyclic hydrocarbon-based acid-decomposable resin.

In the case where the photosensitive composition of the present invention is exposed with a KrF excimer laser or irradiated with electron beams, the dissolution inhibiting compound is preferably a compound containing a structure that the phenolic hydroxyl group of a phenol compound is replaced by an acid-decomposable group. The phenol compound is preferably a phenol compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the photosensitive composition.

Specific examples of the dissolution inhibiting compound are set forth below, but the present invention is not limited thereto.

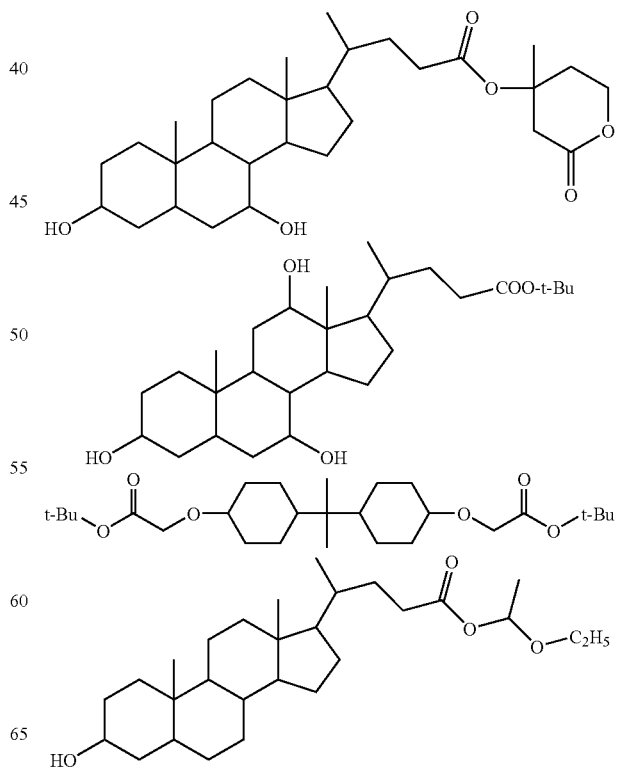

-continued

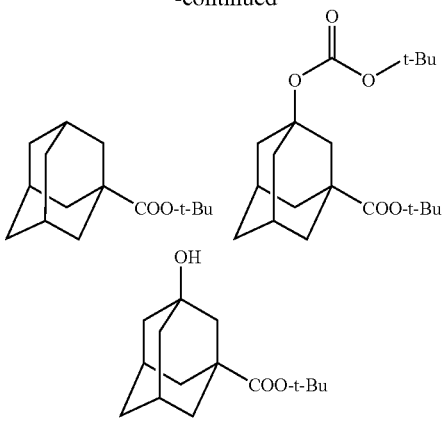

[9] Solvent

The photosensitive composition of the present invention is used by dissolving respective components in a predetermined organic solvent.

Examples of the solvent which can be used include an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, the solvent may be a sole solvent or a mixture of solvents. A mixed solvent prepared by mixing two or more kinds of solvents selected from a solvent having a hydroxyl group in the structure, a solvent having an ester or lactone structure in the structure, and a solvent having a ketone structure in the structure is preferably used. By this use, production of particles during storage of the resist solution can be reduced.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent having an ester or lactone structure include propylene glycol monomethyl ether acetate, ethyl ethoxypropionate, γ-butyrolactone and butyl acetate. Among these, propylene glycol monomethyl ether acetate and ethyl ethoxypropionate are preferred, and propylene glycol monomethyl ether acetate is most preferred.

Examples of the solvent having a ketone structure include 2-heptanone and cyclohexanone, with cyclohexanone being preferred.

The preferred combination in the mixed solvent is a combination of a solvent having a hydroxyl group and a solvent having an ester structure, or a combination of a solvent having a ketone structure and a solvent having an ester structure.

The mixing ratio (by mass) between the solvent having a hydroxyl group and the solvent having an ester structure is usually from 1/99 to 99/1, preferably from 5/95 to 95/5, more preferably from 20/80 to 80/20, still more preferably from 20/80 to 60/40.

The mixing ratio (by mass) between the solvent having a ketone structure and the solvent having an ester structure is usually from 1/99 to 99/1, preferably from 5/95 to 95/5, more preferably from 20/80 to 80/20, still more preferably from 20/80 to 60/40.

<Other Additives>

If desired, the photosensitive composition of the present invention may further contain, for example, a dye, a plasticizer, a surfactant other than the component above, a photosensitizer, and a compound capable of accelerating the solubility in a developer.

The compound capable of accelerating the dissolution in a developer, which can be used in the present invention, is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin (C). When the amount added is from 2 to 50 mass %, worsening of development residue or deformation of pattern at the development can be prevented.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the fluorine- and/or silicon-containing surfactant above may also be added. Specific examples thereof include a nonionic surfactant such as polyoxyethylene alkyl ethers, polyoxyethylene alkylallyl ethers, polyoxyethylene•epolyoxypropylene block copolymers, sorbitan fatty acid esters and polyoxyethylene sorbitan fatty acid esters.

One of these surfactants may be added alone, or some species thereof may be added in combination.

[10] Pattern Forming Method

The photosensitive composition of the present invention is used by dissolving respective components in a predetermined organic solvent, preferably the mixed solvent above, and coating the obtained solution on a predetermined support as follows.

For example, the photosensitive composition is coated on a substrate (e.g., silicon/silicon dioxide-coated substrate) as used in the production of a precision integrated circuit device, by an appropriate coating method such as spinner or coater.

After the coating, the photosensitive film is irradiated with actinic rays or radiation through a predetermined mask, baked and developed, whereby a good resist pattern can be obtained. Examples of the actinic ray include infrared light, visible light, ultraviolet light, far ultraviolet light, X-ray and electron beam, but the actinic ray is preferably far ultraviolet light at a wavelength of 250 nm or less, more preferably 220 nm or less, specifically, KrF excimer laser light (248 nm), ArF excimer laser light (193 nm), $F_2$ excimer laser light (157 nm), X-ray of electron beam, and most preferably ArF excimer laser light or $F_2$ excimer laser light. In the present invention, X-ray and electron beam are also included in the actinic ray.

In the development step, an alkali developer is used as follows. The alkali developer which can be used is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited to the following Examples.

<Resin (C)>

The structures and molecular weights of the resin (C) are shown below.

(1) 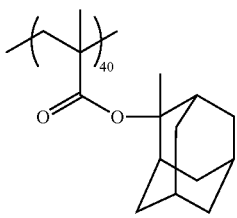 Mw = 9700
Mw/Mn = 1.81

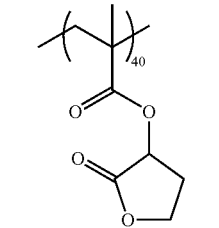

(2) 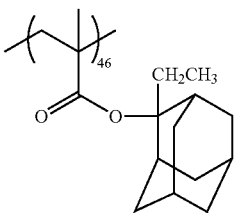 Mw = 9400
Mw/Mn = 1.78

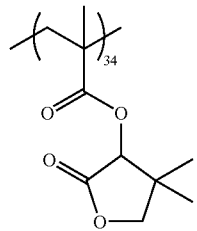

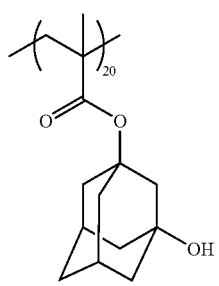

(3) 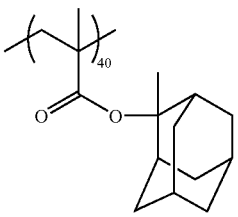 Mw = 13700
Mw/Mn = 1.89

(4) Mw = 10300
Mw/Mn = 1.90

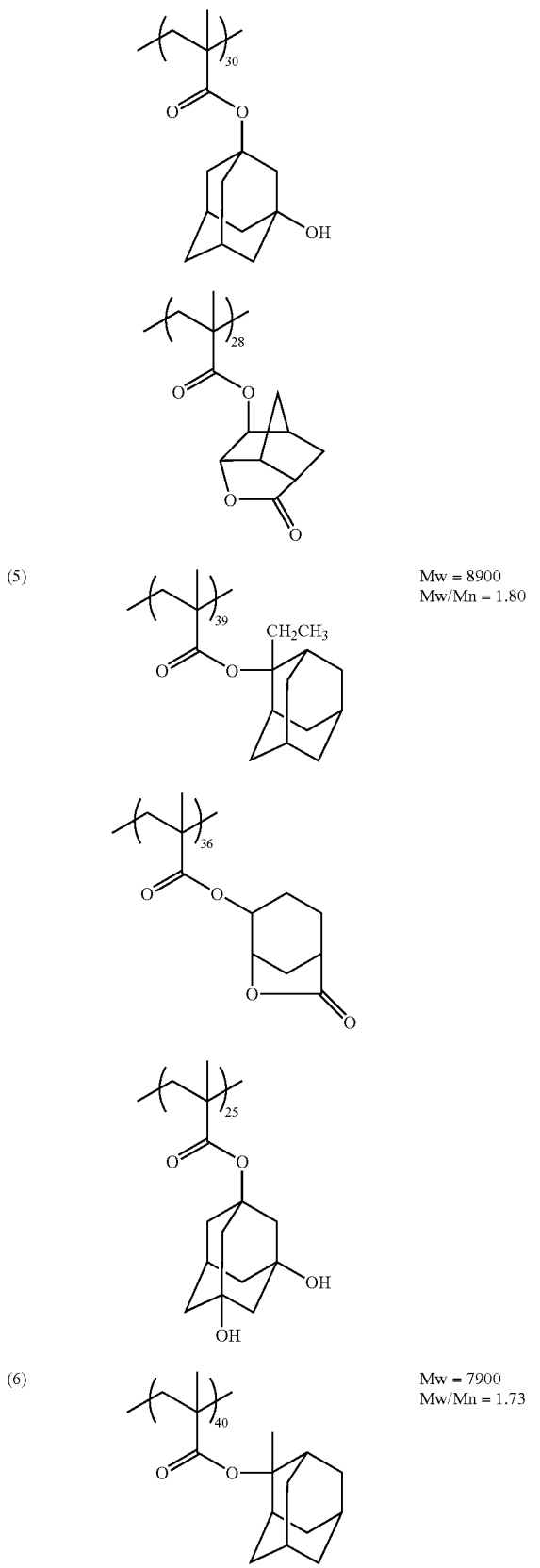
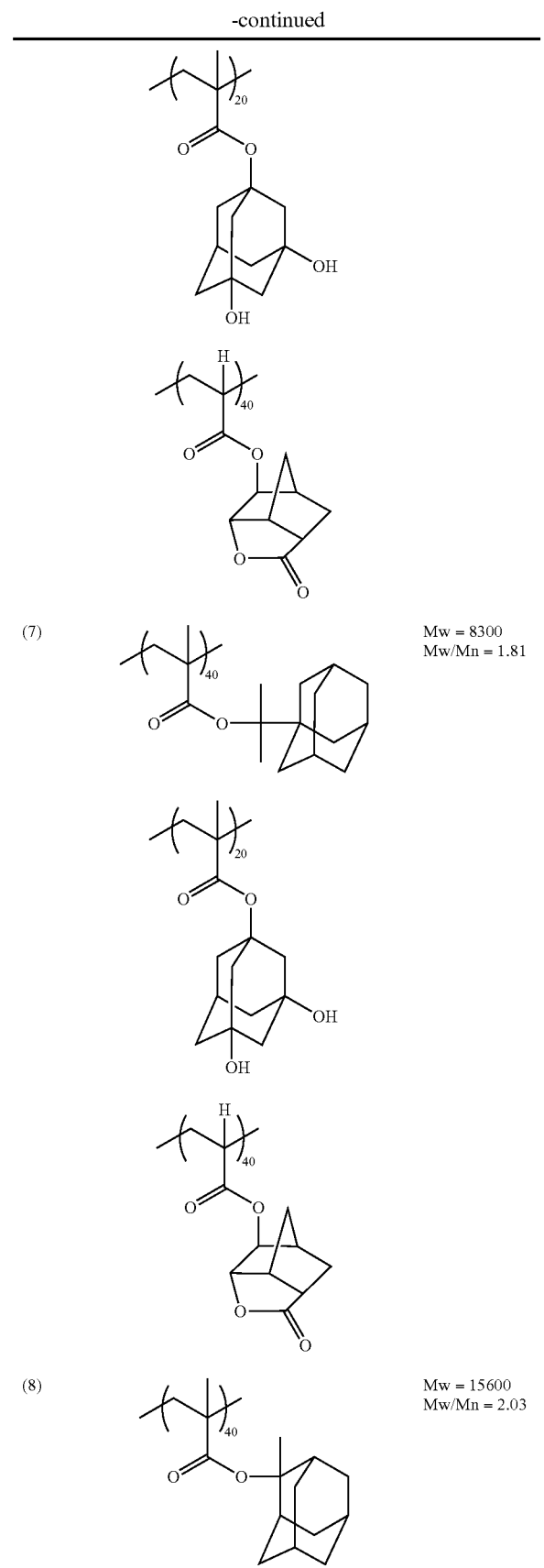

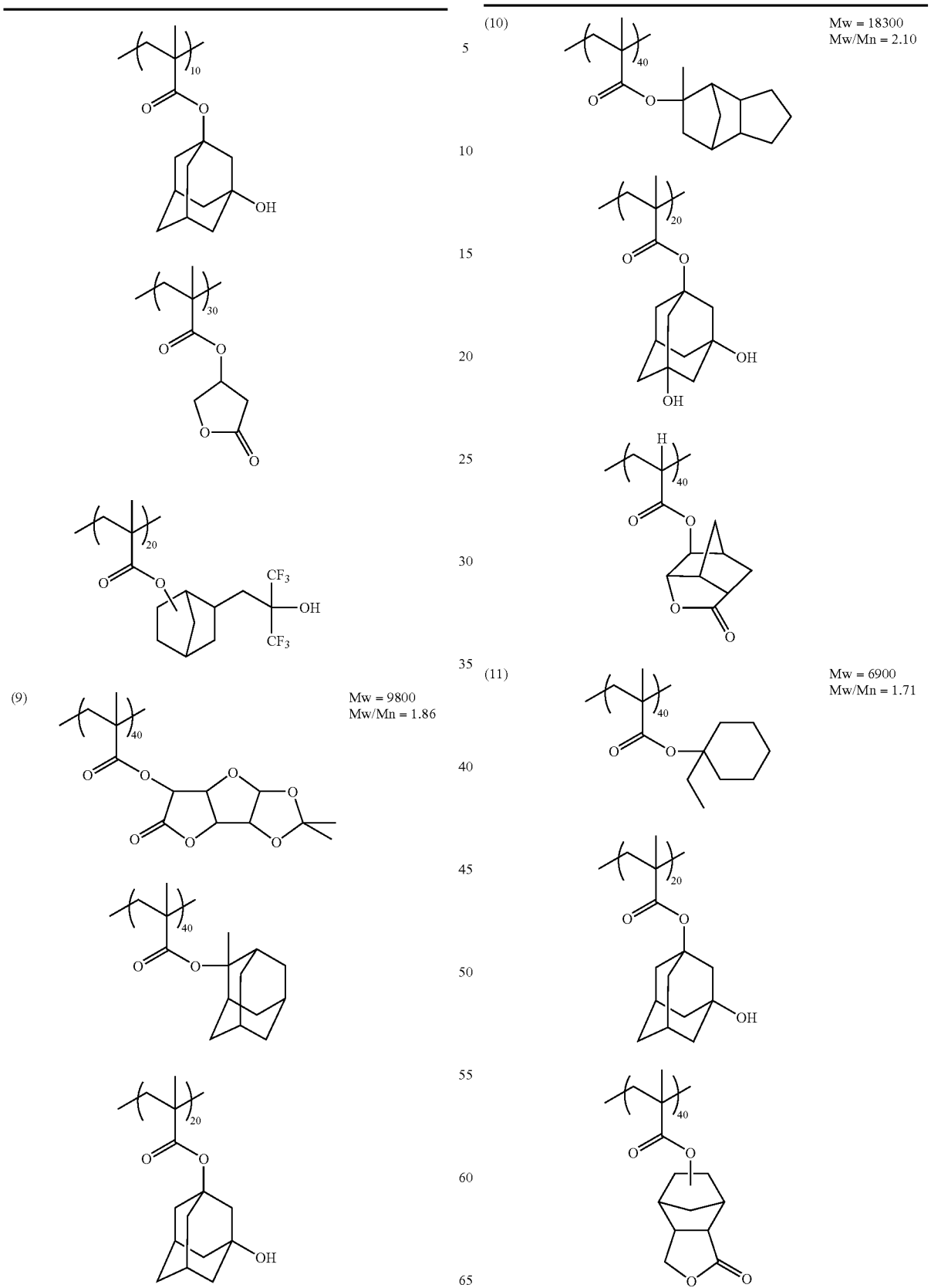

(12) 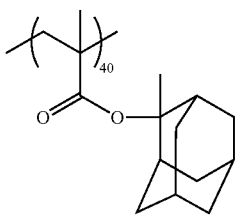 Mw = 8300
Mw/Mn = 1.81
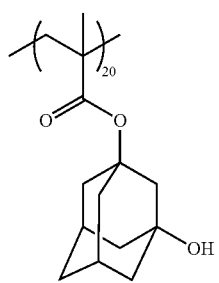
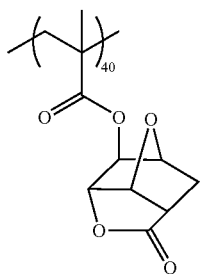
(13) 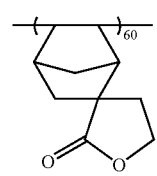 Mw = 9600
Mw/Mn = 1.81
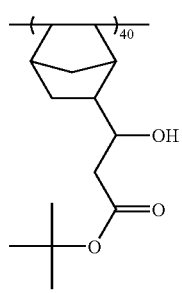
(14) 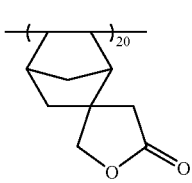 Mw = 5800
Mw/Mn = 1.69
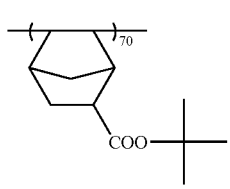
(15) 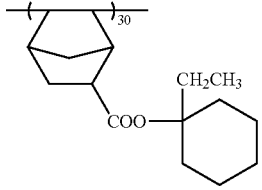 Mw = 4700
Mw/Mn = 1.70
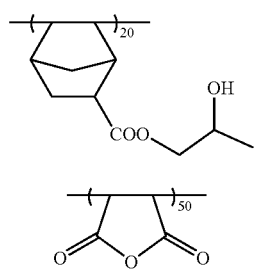
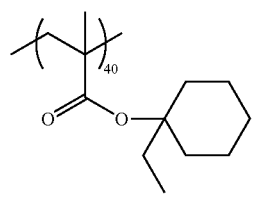
(16) 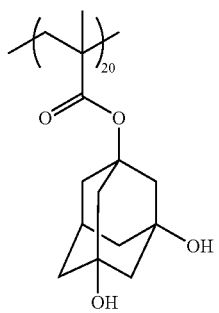 Mw = 8900
Mw/Mn = 1.81
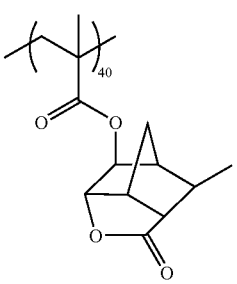
(17) 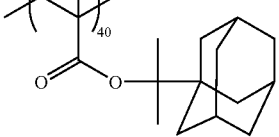 Mw = 13900
Mw/Mn = 1.98

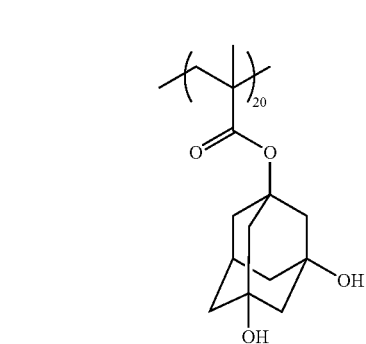
(18)
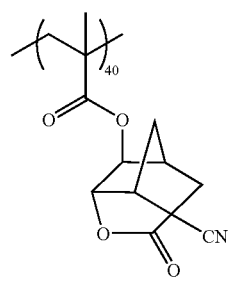
Mw = 12700
Mw/Mn = 1.99
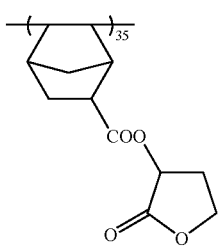
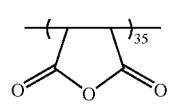
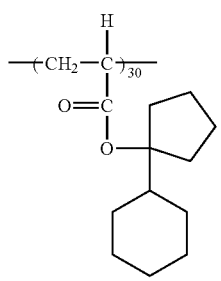
(19)
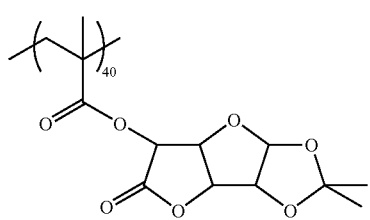
Mw = 9300
Mw/Mn = 1.81
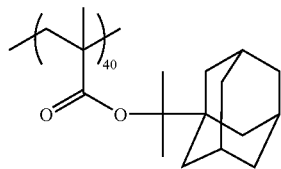
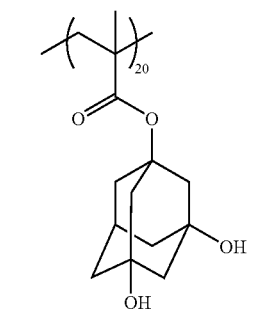
(20)
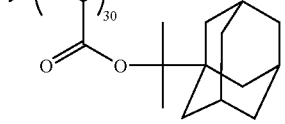
Mw = 7600
Mw/Mn = 1.76
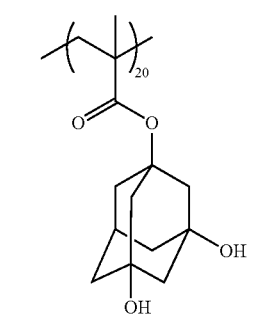
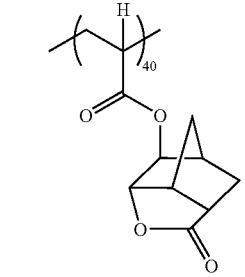
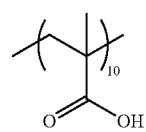
(21)
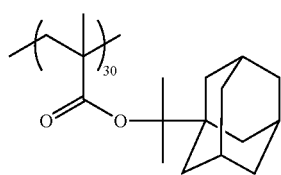
Mw = 12700
Mw/Mn = 1.86

-continued
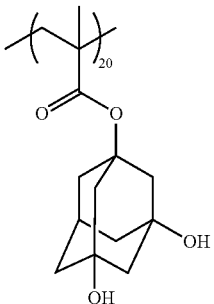
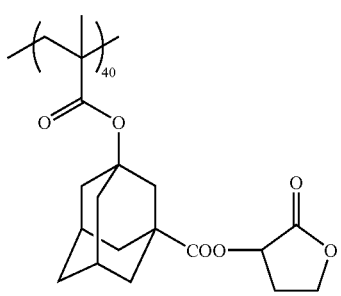
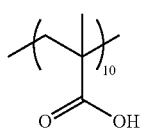
(22)
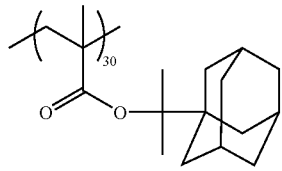
Mw = 8200
Mw/Mn = 1.68
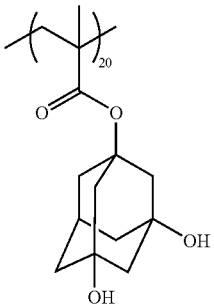
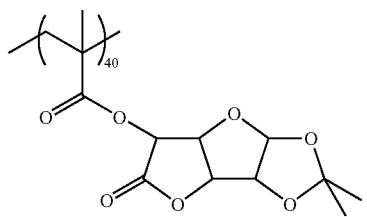
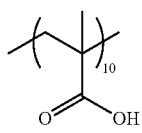
-continued
(23)
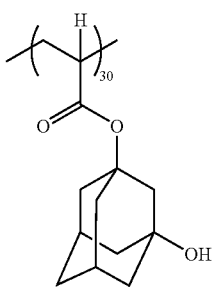
Mw = 8500
Mw/Mn = 1.77
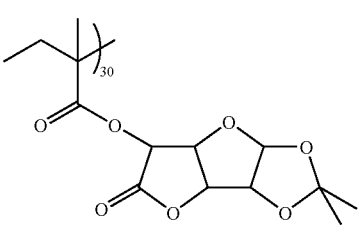
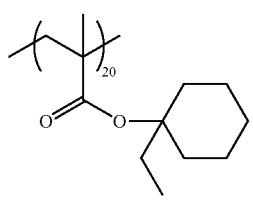
(24)
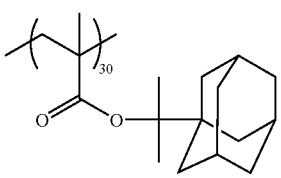
Mw = 8200
Mw/Mn = 1.75
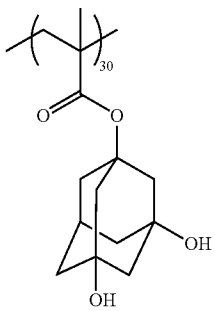
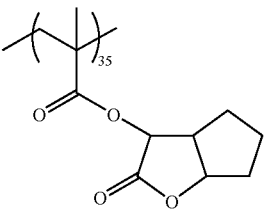
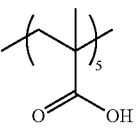

-continued
(25) 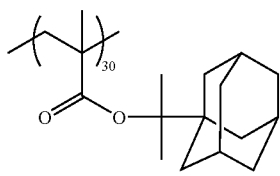 Mw = 9200
Mw/Mn = 1.92
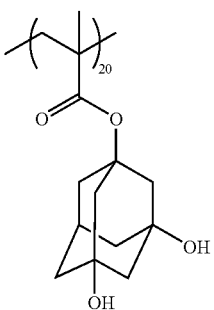
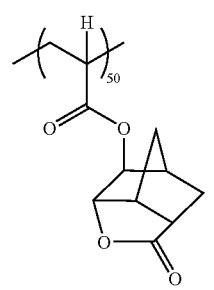
(26) 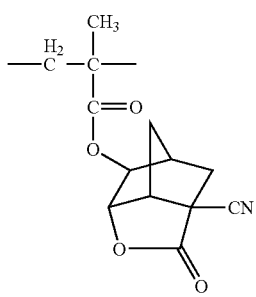 Mw = 8200
Mw/Mn = 1.65
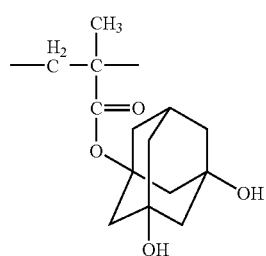
-continued
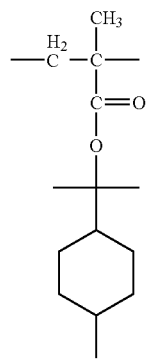
<Fluorine Group-Containing Resin>
The structures of Fluorine Group-Containing Resins (FII-1) to (FII-10) used in Examples are shown below.
Also, the weight average molecular weight and the like of each of Fluorine Group-Containing Resins (FII-1) to (FII-10) are shown in Table 1 below.
TABLE 1
(FII-1)
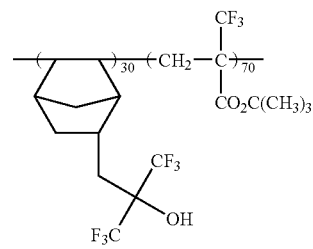
(FII-2)
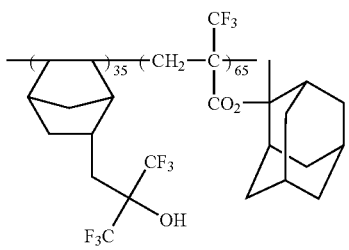
(FII-3)
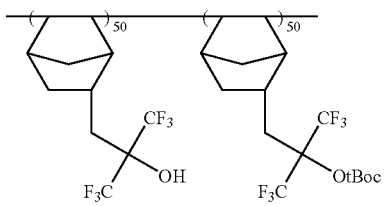
(FII-4)

TABLE 1-continued

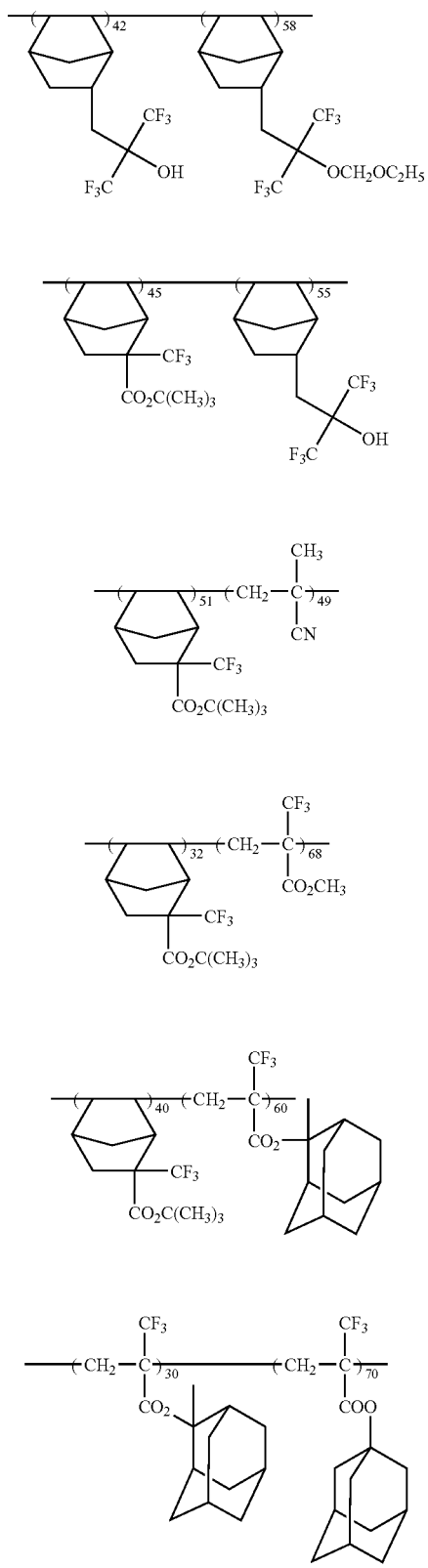

| Resin | Weight Average Molecular Weight, Mw | Dispersity | Content (%) of Oligomer Having Molecular Weight of 1,000 or Less |
|---|---|---|---|
| (FII-1) | 15200 | 1.45 | 5 |
| (FII-2) | 24000 | 1.75 | 8 |
| (FII-3) | 18200 | 1.85 | 7 |
| (FII-4) | 16500 | 1.46 | 6 |
| (FII-5) | 9500 | 1.58 | 8 |
| (FII-6) | 19500 | 2.02 | 8 |
| (FII-7) | 6500 | 1.85 | 7 |
| (FII-8) | 28400 | 1.68 | 9 |
| (FII-9) | 28600 | 1.44 | 5 |
| (FII-10) | 12800 | 1.65 | 8 |

Examples AR-1 to AR-30 and Comparative Examples ar1 to ar5

Preparation of Resist

The components shown in Table 2 below were dissolved in a solvent to prepare a solution having a solid content concentration of 6 mass %, and the obtained solution was filtered through a 0.1-μm polytetrafluoroethylene filter or polyethylene filter to prepare a positive resist solution. The positive resist solutions prepared were evaluated by the following methods, and the results are shown in Table 2.

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 160-nm resist film. The obtained wafer was exposed using an ArF excimer laser scanner (PAS5500/1100, manufactured by ASML, NA: 0.75, σo/σi: 0.85/0.55) and immediately after the exposure, heated (PEB) on a hot plate at 120° C. for 60 seconds. Furthermore, the resist film was developed with an aqueous 2.38 mass % tetramethylammonium hydroxide solution at 23° C. for 60 seconds, rinsed with pure water for 30 seconds and then dried to obtain a resist pattern.

<Focus Margin (μm)>

The resist pattern used for the evaluation is a dense pattern with a 90-nm line and space ratio of 1:1. The exposure amount (Eopt) for reproducing the mask size above was determined by a length-measuring SEM (S-9260) manufactured by Hitachi, Ltd., the depth of focus (referred to as "DOF") allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 90-nm pattern was exposed at 78 portions in the wafer plane with the above-described exposure amount of Eopt by the same method as above. At this time, the area of exposure was 205 cm$^2$ in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm$^2$).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

TABLE 2

| | | (A) Acid Generator | | (B) Resin | | (C) Basic Compound Ia | | (C) Basic Compound Ib | |
|---|---|---|---|---|---|---|---|---|---|
| | | Compound No. | (parts by weight) | Compound No. | (parts by weight) | Compound No. | (parts by weight) | Compound No. | (parts by weight) |
| Example | AR-1 | Z-2 | 4.0 | (1) | 95.4 | PEA | 0.24 | DIA | 0.27 |
| | AR-1 | Z-2 | 4.0 | (1) | 94.9 | PEA | 0.24 | DIA | 0.27 |
| | AR-3 | Z-2 | 4.0 | (6) | 95.5 | TEA | 0.26 | TBA | 0.27 |
| | AR-4 | Z-40 | 6.0 | (6) | 93.5 | TMEA | 0.20 | DHA | 0.24 |
| | AR-5 | Z-2 | 4.0 | (16) | 95.6 | NCEA | 0.23 | DBA | 0.20 |
| | AR-6 | Z-40 | 6.0 | (7) | 93.5 | CEA | 0.21 | DCMA | 0.29 |
| | AR-7 | Z-2 | 4.0 | (15) | 95.5 | TEA | 0.28 | TPA | 0.20 |
| | AR-8 | Z-40 | 6.0 | (16) | 93.4 | TMEA | 0.23 | DIA | 0.29 |
| | AR-9 | Z-2 | 4.0 | (17) | 95.5 | PEA | 0.40 | TOA | 0.10 |
| | AR-10 | Z-40 | 6.0 | (24) | 93.5 | CEA | 0.23 | TBA | 0.23 |
| | AR-11 | Z-2 | 4.0 | (25) | 95.5 | TEA | 0.25 | DHA | 0.24 |
| | AR-12 | Z-40 | 6.0 | (23) | 93.4 | TMEA | 0.10 | DBA | 0.40 |
| | AR-13 | Z-2 | 4.0 | (22) | 95.4 | PEA | 0.28 | DCMA | 0.26 |
| | AR-14 | Z-40 | 6.0 | (20) | 93.4 | CEA | 0.24 | TPA | 0.30 |
| | AR-15 | Z-2 | 4.0 | (19) | 95.5 | TEA | 0.23 | DIA | 0.22 |
| | AR-16 | Z-40 | 6.0 | (6) | 93.3 | TMEA | 0.29 | TOA | 0.29 |
| | AR-17 | Z-2 | 4.0 | (8) | 95.5 | NCEA | 0.24 | TBA | 0.26 |
| | AR-18 | Z-40 | 6.0 | (18) | 93.4 | CEA | 0.29 | DHA | 0.25 |
| | AR-19 | Z-2 | 4.0 | (25) | 95.5 | TEA | 0.28 | DBA | 0.22 |
| | AR-20 | Z-40 | 6.0 | (20) | 93.5 | TMEA | 0.20 | DCMA | 0.29 |
| | AR-21 | Z-2 | 4.0 | (13) | 95.4 | PEA | 0.24 | TPA | 0.26 |
| | AR-22 | Z-40 | 6.0 | (7) | 93.4 | CEA | 0.28 | DIA | 0.23 |
| | AR-23 | Z-2 | 4.0 | (11) | 95.4 | TEA | 0.27 | TOA | 0.29 |
| | AR-24 | Z-40 | 6.0 | (7) | 93.5 | TMEA | 0.28 | TBA | 0.22 |
| | AR-25 | Z-2 | 4.0 | (24) | 95.5 | PEA | 0.22 | DHA | 0.27 |
| | AR-26 | Z-40 | 6.0 | (17) | 93.4 | CEA | 0.30 | DBA | 0.22 |
| | AR-27 | Z-2 | 4.0 | (4) | 95.5 | TEA | 0.28 | DCMA | 0.22 |
| | AR-28 | Z-40 | 6.0 | (17) | 93.4 | TMEA | 0.30 | TPA | 0.26 |
| | AR-29 | Z-2 | 4.0 | (2) | 95.5 | PEA | 0.27 | DCMA | 0.22 |
| | AR-30 | Z-40 | 6.0 | (3) | 93.5 | PEA | 0.20 | DIA | 0.24 |
| Comparative Example | ar-1 | Z-2 | 4.0 | (1) | 95.7 | PEA | 0.24 | | |
| | ar-2 | Z-2 | 4.0 | (1) | 95.6 | | | DIA | 0.27 |
| | ar-3 | Z-2 | 4.0 | (1) | 95.5 | PEA | 0.24 | DIA | 0.27 |
| | ar-4 | Z-2 | 4.0 | (1) | 95.4 | PEA | 0.24 | DIA | 0.27 |
| | ar-5 | Z-2 | 4.0 | (1) | 95.4 | PEA | 0.24 | DIA | 0.27 |

| | | (D) Surfactant | | | | | Evaluation Results | |
|---|---|---|---|---|---|---|---|---|
| | | Compound No. | (parts by weight) | Solvent 1 | Solvent 2 | Solvent (mixing ratio by mass) | Development Defects (pieces) | Focus Margin (μm) |
| Example | AR-1 | W-2 | 0.10 | SL-1 | SL-4 | 70/30 | 0.27 | 0.60 |
| | AR-1 | W-2 | 0.55 | SL-1 | SL-4 | 70/30 | 0.75 | 0.55 |
| | AR-3 | W-2 | 0.02 | SL-1 | SL-3 | 60/40 | 0.26 | 0.50 |
| | AR-4 | W-2 | 0.07 | SL-1 | SL-4 | 70/30 | 0.46 | 0.50 |
| | AR-5 | W-2 | 0.02 | SL-1 | SL-5 | 60/40 | 0.39 | 0.60 |
| | AR-6 | W-2 | 0.05 | SL-1 | SL-6 | 90/10 | 0.58 | 0.60 |
| | AR-7 | W-2 | 0.05 | SL-1 | SL-5 | 70/30 | 0.27 | 0.55 |
| | AR-8 | W-2 | 0.03 | SL-1 | SL-5 | 70/30 | 0.58 | 0.50 |
| | AR-9 | W-2 | 0.03 | SL-1 | SL-5 | 70/30 | 0.58 | 0.65 |
| | AR-10 | W-2 | 0.03 | SL-1 | SL-5 | 70/30 | 0.24 | 0.65 |
| | AR-11 | W-2 | 0.03 | SL-1 | SL-4 | 70/30 | 0.45 | 0.45 |
| | AR-12 | W-2 | 0.06 | SL-1 | SL-2 | 60/40 | 0.38 | 0.45 |
| | AR-13 | W-2 | 0.04 | SL-1 | SL-4 | 60/40 | 0.81 | 0.55 |
| | AR-14 | W-2 | 0.03 | SL-5 | SL-4 | 60/40 | 0.40 | 0.50 |
| | AR-15 | W-4 | 0.06 | SL-1 | SL-3 | 90/10 | 0.44 | 0.45 |
| | AR-16 | W-1 | 0.06 | SL-1 | SL-4 | 70/30 | 0.53 | 0.50 |

TABLE 2-continued

| | | | | | ArF | | | |
|---|---|---|---|---|---|---|---|---|
| | AR-17 | W-4 | 0.05 | SL-1 | SL-5 | 70/30 | 0.35 | 0.65 |
| | AR-18 | W-3 | 0.05 | SL-1 | SL-6 | 60/40 | 0.39 | 0.65 |
| | AR-19 | W-3 | 0.02 | SL-1 | SL-5 | 60/40 | 0.24 | 0.45 |
| | AR-20 | W-1 | 0.04 | SL-5 | SL-4 | 90/10 | 0.58 | 0.45 |
| | AR-21 | W-2 | 0.06 | SL-2 | SL-4 | 60/40 | 0.38 | 0.60 |
| | AR-22 | W-3 | 0.07 | SL-1 | SL-5 | 70/30 | 0.78 | 0.50 |
| | AR-23 | W-1 | 0.03 | SL-1 | SL-6 | 60/40 | 0.90 | 0.50 |
| | AR-24 | W-1 | 0.03 | SL-1 | SL-4 | 60/40 | 0.64 | 0.50 |
| | AR-25 | W-4 | 0.03 | SL-1 | SL-5 | 70/30 | 0.68 | 0.65 |
| | AR-26 | W-2 | 0.04 | SL-1 | SL-6 | 60/40 | 0.62 | 0.65 |
| | AR-27 | W-1 | 0.02 | SL-1 | SL-4 | 60/40 | 0.85 | 0.50 |
| | AR-28 | W-3 | 0.06 | SL-1 | SL-4 | 60/40 | 0.76 | 0.55 |
| | AR-29 | W-4 | 0.05 | SL-5 | SL-4 | 90/10 | 0.26 | 0.55 |
| | AR-30 | W-1 | 0.02 | SL-1 | SL-5 | 70/30 | 0.87 | 0.65 |
| Comparative | ar-1 | W-2 | 0.10 | SL-1 | SL-4 | 70/30 | 1.26 | 0.40 |
| Example | ar-2 | W-2 | 0.10 | SL-1 | SL-4 | 70/30 | 1.31 | 0.25 |
| | ar-3 | | | SL-1 | SL-4 | 70/30 | 2.8 | 0.40 |
| | ar-4 | W-5 | 0.10 | SL-1 | SL-4 | 70/30 | 1.30 | 0.35 |
| | ar-5 | W-6 | 0.10 | SL-1 | SL-4 | 70/30 | 1.25 | 0.35 |

The abbreviations common in respective Tables are shown together below.

Amine:

<Compound (B1)>
PEA: N-Phenyldiethanolamine
CEA: N-Cyanoethylaniline
TEA: Triethanolamine
TMEA: Tris(methoxyethoxy)ethylamine
NCEA: N-(2-Cyanoethyl)-N-ethylaniline <Compound (B2)>
DBA: N,N-Dibutylaniline
DHA: N,N-Dihexylaniline
DIA: 2,6-Diisopropylaniline
TBA: Tributylamine
TOA: Trioctylamine
DCMA: Dicyclohexylmethylamine
TPA: Tripentylamine <Surfactant>
W-1: PF636 (produced by OMNOVA)
W-2: PF6320 (produced by OMNOVA)
W-3: PF656 (produced by OMNOVA)
W-4: PF6520 (produced by OMNOVA)
W-5: Mega F176 (produced by Dainippon Ink & Chemicals, Inc.)
W-6: Florad FC430 (produced by Sumitomo 3M Inc.)

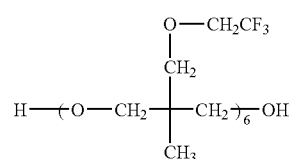

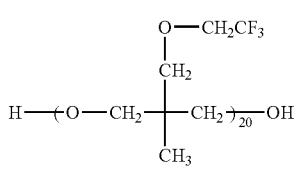

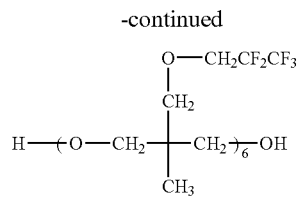

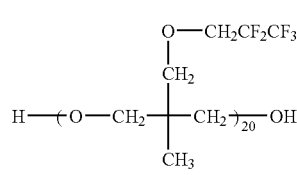

PAG:

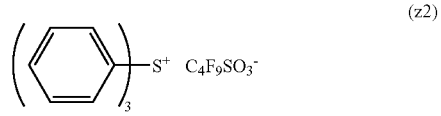

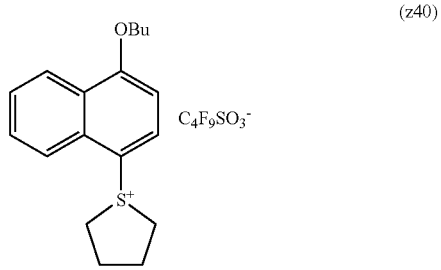

<Solvent>
SL-1: Propylene glycol monomethyl ether acetate
SL-2: 2-Heptanone
SL-3: Ethyl lactate
SL-4: Propylene glycol monomethyl ether
SL-5: Cyclohexanone
SL-6: γ-Butyrolactone It is seen from the results in Table 2 that the photosensitive composition of the present invention has excellent performance ensuring less development defect and wide focus margin in the ArF exposure.

Examples SI-1 to SI-7 and Comparative Examples si-1 to si-5

(1) Formation of Lower Resist Layer

FHi-028DD Resist (resist for i-line, produced by Fujifilm Electronic Materials Co., Ltd.) was coated on a 6-inch silicon wafer by using a spin coater, Mark 8, manufactured by Tokyo Electron Ltd. and baked at 90° C. for 90 seconds to obtain a uniform film having a thickness of 0.55 μm. This film was further heated at 200° C. for 3 minutes to form a lower resist layer having a thickness of 0.40 μm.

(2) Formation of Upper Resist Layer

The components shown in Table 3 below were dissolved in a solvent to prepare a solution having a solid content concentration of 11 mass %, and this solution was microfiltered through a membrane filter having a pore size of 0.1 μm to prepare an upper resist composition.

This upper resist composition was coated on the lower resist layer in the same manner and heated at 130° C. for 90 seconds to form an upper resist layer having a thickness of 0.20 μm.

Resins (SI-1) to (SI-5) in Table 3 are shown below.

|  |  | Molecular weight |
|---|---|---|
| (SI-1) | 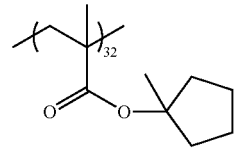 | 15000 |
| (SI-2) | 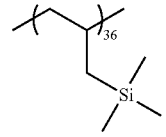 | 14500 |
| (SI-3) | 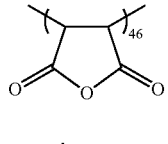 | 9600 |
| (SI-4) | 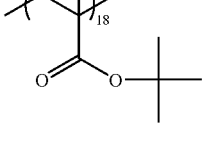 | 8900 |

-continued

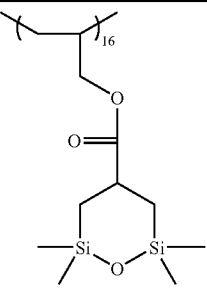

(SI-5) Molecular weight 10800

(3) Evaluation of Resist

The obtained wafer was exposed using an ArF excimer laser scanner (PAS5500/1100, manufactured by ASML, NA: 0.75, σo/σi: 0.85/0.55). Thereafter, the resist film was heated at 120° C. for 90 seconds, developed with a tetrahydro-ammonium hydroxide developer (2.38 mass %) for 60 seconds, rinsed with distilled water and dried to form an upper layer pattern, and the pattern formed was evaluated as follows.

<Focus Margin (μm)>

The resist pattern used for the evaluation is a dense pattern with a 90-nm line and space ratio of 1:1. The exposure amount (Eopt) for reproducing the mask size above was determined by a length-measuring SEM (S-9260) manufactured by Hitachi, Ltd., the depth of focus (referred to as "DOF") allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 90-nm pattern was exposed at 78 portions in the wafer plane with the above-described exposure amount of Eopt by the same method as above. At this time, the area of exposure was 205 cm$^2$ in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm$^2$).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

The results are shown in Table 3.

TABLE 3

| | | ArF (containing Si) | | | | | | | |
|---|---|---|---|---|---|---|---|---|---|
| | | (A) Acid Generator | | (B) Resin | | (C) Basic Compound Ia | | (C) Basic Compound Ib | |
| | | Compound No. | (parts by weight) | Compound No. | (parts by weight) | Compound No. | (parts by weight) | Compound No. | (parts by weight) |
| Example | Si-1 | Z-2 | 4.0 | Si-1 | 95.4 | PEA | 0.24 | DIA | 0.27 |
| | Si-2 | Z-2 | 4.0 | Si-2 | 94.9 | PEA | 0.24 | DIA | 0.27 |
| | Si-3 | Z-2 | 4.0 | Si-3 | 95.5 | TEA | 0.26 | TBA | 0.27 |
| | Si-4 | Z-2 | 4.0 | Si-4 | 95.4 | TMEA | 0.40 | DHA | 0.10 |
| | Si-5 | Z-2 | 4.0 | Si-5 | 95.6 | PEA | 0.23 | DBA | 0.20 |
| | Si-1 | Z-2 | 4.0 | Si-1 | 95.4 | NCEA | 0.10 | DBA | 0.40 |
| | Si-2 | Z-2 | 4.0 | Si-2 | 95.0 | CEA | 0.21 | DCMA | 0.29 |
| Comparative Example | si-1 | Z-2 | 4.0 | Si-1 | 95.7 | PEA | 0.24 | | |
| | si-2 | Z-2 | 4.0 | Si-1 | 95.6 | | | DIA | 0.27 |
| | si-3 | Z-2 | 4.0 | Si-1 | 95.5 | PEA | 0.24 | DIA | 0.27 |
| | si-4 | Z-2 | 4.0 | Si-1 | 95.4 | PEA | 0.24 | DIA | 0.27 |
| | si-5 | Z-2 | 4.0 | Si-1 | 95.4 | PEA | 0.24 | DIA | 0.27 |

TABLE 3-continued

| | | (D) Surfactant | | Solvent | | | Evaluation Results | |
|---|---|---|---|---|---|---|---|---|
| | | Compound No. | (parts by weight) | Solvent 1 | Solvent 2 | (mixing ratio by mass) | Development Defects (pieces) | Focus Margin (μm) |
| | | | | ArF (containing Si) | | | | |
| Example | Si-1 | W-2 | 0.10 | SL-1 | SL-4 | 70/30 | 0.42 | 0.60 |
| | Si-2 | W-2 | 0.55 | SL-1 | SL-4 | 70/30 | 0.61 | 0.60 |
| | Si-3 | W-2 | 0.02 | SL-1 | SL-3 | 60/40 | 0.59 | 0.55 |
| | Si-4 | W-2 | 0.07 | SL-1 | SL-4 | 70/30 | 0.46 | 0.50 |
| | Si-5 | W-4 | 0.02 | SL-1 | SL-5 | 60/40 | 0.55 | 0.55 |
| | Si-1 | W-1 | 0.10 | SL-1 | SL-4 | 70/30 | 0.52 | 0.55 |
| | Si-2 | W-3 | 0.55 | SL-1 | SL-4 | 70/30 | 0.49 | 0.50 |
| Comparative Example | si-1 | W-2 | 0.10 | SL-1 | SL-4 | 70/30 | 1.15 | 0.35 |
| | si-2 | W-2 | 0.10 | SL-1 | SL-4 | 70/30 | 1.30 | 0.30 |
| | si-3 | | | SL-1 | SL-4 | 70/30 | 2.5 | 0.25 |
| | si-4 | W-5 | 0.10 | SL-1 | SL-4 | 70/30 | 1.35 | 0.30 |
| | si-5 | W-6 | 0.10 | SL-1 | SL-4 | 70/30 | 1.30 | 0.30 |

It is seen from the results in Table 3 that the photosensitive composition of the present invention has excellent performance ensuring less development defect and wide focus margin when used as a two-layer resist.

Examples F2-1 to F2-13 and Comparative Examples f2-1 to f2-5

Preparation and Evaluation of Resist

The components shown in Table 4 were dissolved in a solvent to prepare a solution having a solid content concentration of 5 mass %, and this solution was filtered through a 0.1-μm polyethylene filter to prepare a resist solution. The prepared resist solutions each was coated by a spin coater on a silicone wafer treated with hexamethyl-disilazane, and dried under heating on a vacuum contact-type hot plate at 120° C. for 90 seconds to form a resist film having a thickness of 120 nm. The resist film obtained was pattern-exposed using an $F_2$ excimer laser stepper (157 nm) and immediately after the exposure, heated on a hot plate at 120° C. for 90 seconds. Furthermore, the resist film was developed with an aqueous 2.38 mass % tetramethylammonium hydroxide solution for 60 seconds and rinsed with pure water to form a line pattern, and the pattern formed was evaluated as follows.

<Focus Margin (μm)>

The resist pattern used for the evaluation is a dense pattern with a 90-nm line and space ratio of 1:1. The exposure amount (Eopt) for reproducing the mask size above was determined by a length-measuring SEM (S-9260) manufactured by Hitachi, Ltd., the depth of focus (referred to as "DOF") allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 90-nm pattern was exposed at 78 portions in the wafer plane with the above-described exposure amount of Eopt by the same method as above. At this time, the area of exposure was 205 cm² in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm²).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

The results are shown in Table 4.

TABLE 4

| | | (A) Acid Generator | | (B) Resin | | (C) Basic Compound Ia | | (C) Basic Compound Ib | |
|---|---|---|---|---|---|---|---|---|---|
| | | | | | $F_2$ | | | | |
| | | Compound No. | (parts by weight) | Compound No. | (parts by weight) | Compound No. | (parts by weight) | Compound No. | (parts by weight) |
| Example | F2-1 | Z-2 | 4.0 | FII-1 | 95.4 | PEA | 0.24 | DIA | 0.27 |
| | F2-2 | Z-2 | 4.0 | FII-2 | 94.9 | PEA | 0.24 | DIA | 0.27 |
| | F2-3 | Z-2 | 4.0 | FII-3 | 95.5 | TEA | 0.26 | TBA | 0.27 |
| | F2-4 | Z-40 | 6.0 | FII-4 | 93.5 | TMEA | 0.20 | DHA | 0.24 |
| | F2-5 | Z-2 | 4.0 | FII-5 | 95.6 | PEA | 0.23 | DBA | 0.20 |
| | F2-6 | Z-2 | 4.0 | FII-6 | 95.4 | NCEA | 0.24 | DIA | 0.27 |
| | F2-7 | Z-2 | 4.0 | FII-7 | 95.0 | PEA | 0.40 | DIA | 0.10 |
| | F2-8 | Z-40 | 6.0 | FII-8 | 93.5 | PEA | 0.23 | DBA | 0.20 |

TABLE 4-continued

| | | | | | F$_2$ | | | | |
|---|---|---|---|---|---|---|---|---|---|
| | F2-9 | Z-2 | 4.0 | FII-9 | 95.5 | CEA | 0.21 | DCMA | 0.29 |
| | F2-10 | Z-40 | 6.0 | FII-10 | 93.4 | TMEA | 0.26 | DBA | 0.28 |
| | F2-1 | Z-2 | 4.0 | FII-1 | 95.4 | NCEA | 0.28 | DCMA | 0.26 |
| | F2-2 | Z-40 | 6.0 | FII-2 | 93.5 | TEA | 0.28 | DBA | 0.22 |
| | F2-3 | Z-2 | 4.0 | FII-3 | 95.0 | TMEA | 0.20 | DCMA | 0.29 |
| Comparative | f2-1 | Z-2 | 4.0 | FII-1 | 95.7 | PEA | 0.24 | | |
| Example | f2-2 | Z-2 | 4.0 | FII-1 | 95.6 | | | DIA | 0.27 |
| | f2-3 | Z-2 | 4.0 | FII-1 | 95.5 | PEA | 0.24 | DIA | 0.27 |
| | f2-4 | Z-2 | 4.0 | FII-1 | 95.4 | PEA | 0.24 | DIA | 0.27 |
| | f2-5 | Z-2 | 4.0 | FII-1 | 95.4 | PEA | 0.24 | DIA | 0.27 |

| | | (D) Surfactant | | | | | Evaluation Results | |
|---|---|---|---|---|---|---|---|---|
| | | Compound No. | (parts by weight) | Solvent 1 | Solvent 2 | Solvent (mixing ratio by mass) | Development Defects (pieces) | Focus Margin (μm) |
| Example | F2-1 | W-2 | 0.10 | SL-1 | SL-4 | 70/30 | 0.34 | 0.55 |
| | F2-2 | W-2 | 0.55 | SL-1 | SL-4 | 70/30 | 0.27 | 0.50 |
| | F2-3 | W-2 | 0.02 | SL-1 | SL-3 | 60/40 | 0.30 | 0.55 |
| | F2-4 | W-2 | 0.07 | SL-1 | SL-4 | 70/30 | 0.49 | 0.50 |
| | F2-5 | W-4 | 0.02 | SL-1 | SL-5 | 60/40 | 0.54 | 0.55 |
| | F2-6 | W-1 | 0.10 | SL-1 | SL-4 | 70/30 | 0.54 | 0.55 |
| | F2-7 | W-3 | 0.55 | SL-1 | SL-4 | 70/30 | 0.39 | 0.50 |
| | F2-8 | W-2 | 0.04 | SL-1 | SL-2 | 60/40 | 0.29 | 0.50 |
| | F2-9 | W-2 | 0.03 | SL-1 | SL-4 | 60/40 | 0.22 | 0.55 |
| | F2-10 | W-4 | 0.06 | SL-5 | SL-4 | 60/40 | 0.51 | 0.55 |
| | F2-1 | W-1 | 0.06 | SL-1 | SL-3 | 90/10 | 0.80 | 0.50 |
| | F2-2 | W-4 | 0.05 | SL-1 | SL-4 | 70/30 | 0.52 | 0.50 |
| | F2-3 | W-3 | 0.55 | SL-1 | SL-5 | 70/30 | 0.85 | 0.55 |
| Comparative | f2-1 | W-2 | 0.10 | SL-1 | SL-4 | 70/30 | 1.27 | 0.25 |
| Example | f2-2 | W-2 | 0.10 | SL-1 | SL-4 | 70/30 | 1.48 | 0.25 |
| | f2-3 | | | SL-1 | SL-4 | 70/30 | 2.3 | 0.25 |
| | f2-4 | W-5 | 0.10 | SL-1 | SL-4 | 70/30 | 1.29 | 0.20 |
| | f2-5 | W-6 | 0.10 | SL-1 | SL-4 | 70/30 | 1.15 | 0.20 |

It is seen from the results in Table 4 that the photosensitive composition of the present invention has excellent performance ensuring less development defect and wide focus margin also in the exposure with an F$_2$ excimer laser.

Examples KrP-1 to KrP-14 and Comparative Examples krp-1 to krp-5

Preparation of Resist

The components shown in Table 6 below were dissolved in a solvent, and the obtained solution was filtered through a 0.1-μm polytetrafluoroethylene filter to prepare a positive resist solution having a solid content concentration of 14 mass %. The positive resist solutions prepared were evaluated by the following methods, and the results are shown in Table 6.

The molar ratio and weight average molecular weight of each of Resins (R-2) to (R-27) in Table 6 are shown in Table 5 below. The repeating units constituting each of Resins (R-2) to (R-27) are those exemplified above.

TABLE 5

| Resin | Molar Ratio of Repeating Units (corresponding in order from left) | Weight Average Molecular Weight |
|---|---|---|
| R-2 | 60/40 | 12000 |
| R-7 | 60/30/10 | 18000 |
| R-8 | 60/20/20 | 12000 |
| R-9 | 10/50/40 | 13000 |
| R-14 | 75/25 | 12000 |
| R-17 | 10/70/20 | 15000 |
| R-19 | 10/70/20 | 11000 |

TABLE 5-continued

| Resin | Molar Ratio of Repeating Units (corresponding in order from left) | Weight Average Molecular Weight |
|---|---|---|
| R-22 | 70/30 | 12000 |
| R-23 | 10/60/30 | 8000 |
| R-24 | 50/20/30 | 16000 |
| R-25 | 10/70/20 | 13000 |
| R-27 | 70/10/20 | 12000 |

<Evaluation of Resist>

The prepared positive resist solution was uniformly coated by a spin coater on a silicon substrate treated with hexamethyldisilazane, and dried under heating on a hot plate at 120° C. for 90 seconds to form a resist film having a thickness of 0.4 μm. This resist film was pattern-exposed using a KrF excimer laser scanner (PAS5500/850C, manufactured by ASML, wavelength: 248 nm, NA: 0.75, sigma: 0.80) through a line and space mask and immediately after the exposure, heated on a hot plate at 110° C. for 90 seconds. Furthermore, the resist film was developed with an aqueous 2.38 mass % tetramethylammonium hydroxide solution at 23° C. for 60 seconds, rinsed with pure water for 30 seconds and dried to form a line pattern.

<Focus Margin (μm)>

The resist pattern used for the evaluation is a dense pattern with a 200-nm line and space ratio of 1:1. The exposure amount (Eopt) for reproducing the mask size above was determined by a length-measuring SEM (S-9260) manufactured by Hitachi, Ltd., the depth of focus (referred to as "DOF")

allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 200-nm pattern was exposed at 78 portions in the wafer plane with the above-described exposure amount of Eopt by the same method as above. At this time, the area of exposure was 205 cm$^2$ in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm$^2$).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

The results are shown in Table 6.

TABLE 6

KrF

| | | (A) Acid Generator | | (B) Resin | | (C) Basic Compound Ia | | (C) Basic Compound Ib | |
|---|---|---|---|---|---|---|---|---|---|
| | | Compound No. | (parts by weight) | Compound No. | (parts by weight) | Compound No. | (parts by weight) | Compound No. | (parts by weight) |
| Example | KrP-1 | Z-2 | 4.0 | R-7 | 95.4 | PEA | 0.24 | DIA | 0.27 |
| | KrP-2 | Z-2 | 4.0 | R-8 | 94.9 | PEA | 0.24 | DIA | 0.27 |
| | KrP-3 | Z-2 | 4.0 | R-9 | 95.5 | TEA | 0.26 | TBA | 0.27 |
| | KrP-4 | Z-40 | 6.0 | R-14 | 93.5 | TMEA | 0.20 | DHA | 0.24 |
| | KrP-5 | Z-2 | 4.0 | R-17 | 95.6 | PEA | 0.23 | DBA | 0.20 |
| | KrP-6 | Z-40 | 6.0 | R-27 | 93.4 | CEA | 0.21 | DCMA | 0.29 |
| | KrP-7 | Z-2 | 4.0 | R-23 | 95.0 | TEA | 0.28 | TPA | 0.20 |
| | KrP-8 | Z-40 | 6.0 | R-24 | 93.4 | TMEA | 0.23 | DIA | 0.29 |
| | KrP-9 | Z-2 | 4.0 | R-25 | 95.5 | NCEA | 0.45 | TOA | 0.05 |
| | KrP-10 | Z-40 | 6.0 | R-22 | 93.5 | CEA | 0.23 | TBA | 0.23 |
| | KrP-11 | Z-2 | 4.0 | R-7 | 95.5 | TEA | 0.25 | DHA | 0.24 |
| | KrP-12 | Z-40 | 6.0 | R-8 | 93.4 | TMEA | 0.26 | DBA | 0.28 |
| | KrP-13 | Z-2 | 4.0 | R-9 | 94.9 | PEA | 0.28 | DCMA | 0.26 |
| | KrP-14 | Z-40 | 6.0 | R-7 | 93.4 | CEA | 0.24 | TPA | 0.30 |
| Comparative Example | krp-1 | z-2 | 4.0 | R-7 | 95.7 | PEA | 0.24 | | |
| | krp-2 | Z-2 | 4.0 | R-7 | 95.6 | | | DIA | 0.27 |
| | krp-3 | Z-2 | 4.0 | R-7 | 95.5 | PEA | 0.24 | DIA | 0.27 |
| | krp-4 | Z-2 | 4.0 | R-7 | 95.4 | PEA | 0.24 | DIA | 0.27 |
| | krp-5 | Z-2 | 4.0 | R-7 | 95.4 | PEA | 0.24 | DIA | 0.27 |

| | | (D) Surfactant | | Solvent | | | Evaluation Results | |
|---|---|---|---|---|---|---|---|---|
| | | Compound No. | (parts by weight) | Solvent 1 | Solvent 2 | (mixing ratio by mass) | Development Defects (pieces) | Focus Margin (μm) |
| Example | KrP-1 | W-2 | 0.10 | SL-1 | SL-4 | 70/30 | 0.24 | 0.65 |
| | KrP-2 | W-2 | 0.55 | SL-1 | SL-4 | 70/30 | 0.53 | 0.70 |
| | KrP-3 | W-2 | 0.02 | SL-1 | SL-3 | 60/40 | 0.69 | 0.65 |
| | KrP-4 | W-2 | 0.07 | SL-1 | SL-4 | 70/30 | 0.86 | 0.60 |
| | KrP-5 | W-4 | 0.02 | SL-1 | SL-5 | 60/40 | 0.76 | 0.60 |
| | KrP-6 | W-1 | 0.10 | SL-1 | SL-6 | 90/10 | 0.80 | 0.60 |
| | KrP-7 | W-3 | 0.55 | SL-1 | SL-5 | 70/30 | 0.72 | 0.65 |
| | KrP-8 | W-2 | 0.04 | SL-1 | SL-5 | 70/30 | 0.34 | 0.70 |
| | KrP-9 | W-2 | 0.03 | SL-1 | SL-5 | 70/30 | 0.56 | 0.65 |
| | KrP-10 | W-4 | 0.06 | SL-1 | SL-5 | 70/30 | 0.73 | 0.65 |
| | KrP-11 | W-1 | 0.06 | SL-1 | SL-4 | 70/30 | 0.95 | 0.60 |
| | KrP-12 | W-4 | 0.05 | SL-1 | SL-2 | 60/40 | 0.25 | 0.55 |
| | KrP-13 | W-3 | 0.55 | SL-1 | SL-4 | 60/40 | 0.48 | 0.70 |
| | KrP-14 | W-2 | 0.03 | SL-5 | SL-4 | 60/40 | 0.83 | 0.60 |
| Comparative Example | krp-1 | W-2 | 0.10 | SL-1 | SL-4 | 70/30 | 1.56 | 0.40 |
| | krp-2 | W-2 | 0.10 | SL-1 | SL-4 | 70/30 | 1.45 | 0.35 |
| | krp-3 | | | SL-1 | SL-4 | 70/30 | 2 | 0.35 |
| | krp-4 | W-5 | 0.10 | SL-1 | SL-4 | 70/30 | 1.27 | 0.35 |
| | krp-5 | W-6 | 0.10 | SL-1 | SL-4 | 70/30 | 1.69 | 0.40 |

It is seen from the results in Table 6 that the photosensitive composition of the present invention has excellent performance ensuring less development defect and wide focus margin also as a positive resist composition in the exposure with a KrF excimer laser.

Examples KrN-1 to KrN-14 and Comparative Examples krn-1 to krn-5

Preparation of Resist

The components shown in Table 7 were dissolved in a solvent, and the resulting solution was filtered through a 0.1-μm polytetrafluoroethylene filter to prepare a negative resist solution having a solid content concentration of 14 mass %. The prepared negative resist solutions were evaluated by the same methods as in Example KrP-1, and the results are shown in Table 7.

The structure, molecular weight and molecular weight distribution of each of the alkali-soluble resins in Table 7 are shown below.

| | | | Mw | Mw/Mn |
|---|---|---|---|---|
| P-1 | (structure) | (structure) | 17000 | 2.15 |
| P-2 | (structure) | (structure) | 16000 | 2.30 |
| P-3 | (structure) | | 19000 | 2.2 |
| P-4 | (structure) | | 12000 | 1.2 |
| P-5 | (structure) | (structure) | 21000 | 2.1 |
| P-6 | (structure) | | 6000 | 1.2 |

VP-5000 produced by Nippon Soda Co. Ltd.

The structures of the crosslinking agents in Table 7 are shown below.

TABLE 7

Negative (KrF)

CL-1

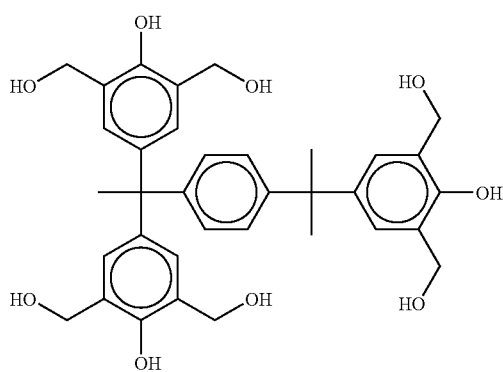

TABLE 7-continued
CL-2
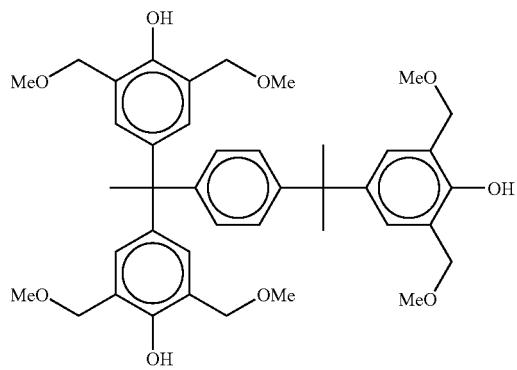
CL-3
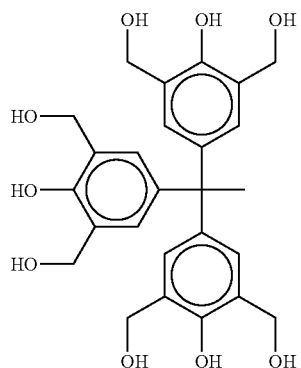
CL-4
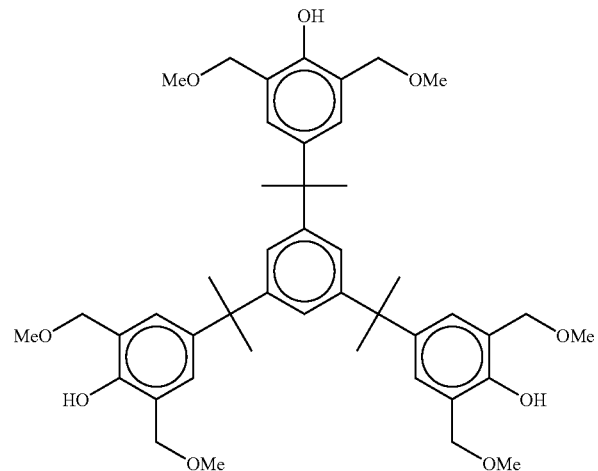
CL-5
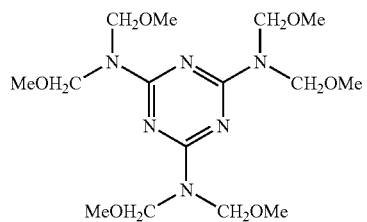

TABLE 7-continued

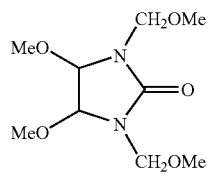
CL-6

| | | (A) Acid Generator | | (B) Resin | | (C) Basic Compound Ia | | (C) Basic Compound Ib | |
|---|---|---|---|---|---|---|---|---|---|
| | | Compound No. | (parts by weight) | Compound No. | (parts by weight) | Compound No. | (parts by weight) | Compound No. | (parts by weight) |
| Example | KrN-1 | Z-2 | 4.0 | P-1 | 75.4 | PEA | 0.24 | DIA | 0.27 |
| | KrN-2 | Z-2 | 4.0 | P-2 | 64.9 | PEA | 0.24 | DIA | 0.27 |
| | KrN-3 | Z-2 | 4.0 | P-3 | 70.5 | TEA | 0.26 | TBA | 0.27 |
| | KrN-4 | Z-40 | 6.0 | P-4 | 73.5 | TMEA | 0.20 | DHA | 0.24 |
| | KrN-5 | Z-2 | 4.0 | P-5 | 72.6 | PEA | 0.23 | DBA | 0.20 |
| | KrN-6 | Z-40 | 6.0 | P-6 | 61.4 | CEA | 0.35 | DCMA | 0.15 |
| | KrN-7 | Z-2 | 4.0 | P-6 | 71.0 | TEA | 0.28 | TPA | 0.20 |
| | KrN-8 | Z-40 | 6.0 | P-5 | 75.4 | TMEA | 0.23 | DIA | 0.29 |
| | KrN-9 | Z-2 | 4.0 | P-6 | 80.4 | NCEA | 0.28 | TOA | 0.25 |
| | KrN-10 | Z-40 | 6.0 | P-6 | 72.5 | CEA | 0.23 | TBA | 0.23 |
| | KrN-11 | Z-2 | 4.0 | P-1 | 75.5 | TEA | 0.25 | DHA | 0.24 |
| | KrN-12 | Z-40 | 6.0 | P-2 | 68.5 | NCEA | 0.15 | DBA | 0.35 |
| | KrN-13 | Z-2 | 4.0 | P-3 | 70.9 | PEA | 0.28 | DCMA | 0.26 |
| | KrN-14 | Z-40 | 6.0 | P-1 | 70.4 | CEA | 0.24 | TPA | 0.30 |
| Comparative Example | krn-1 | z-2 | 4.0 | P-1 | 75.7 | PEA | 0.24 | | |
| | krn-2 | Z-2 | 4.0 | P-1 | 74.6 | | | DIA | 0.27 |
| | krn-3 | Z-2 | 4.0 | P-1 | 72.5 | PEA | 0.24 | DIA | 0.27 |
| | krn-4 | Z-2 | 4.0 | P-1 | 71.4 | PEA | 0.24 | DIA | 0.27 |
| | krn-5 | Z-2 | 4.0 | P-1 | 70.4 | PEA | 0.24 | DIA | 0.27 |

| | | (D) Surfactant | | Crosslinking Agent | | Solvent | | | Evaluation Results | |
|---|---|---|---|---|---|---|---|---|---|---|
| | | | | | | | | | | Focus |
| | | Compound No. | (parts by weight) | Compound No. | (parts by weight) | Solvent 1 | Solvent 2 | (mixing ratio by mass) | Development Defects (pieces) | Margin (μm) |
| Example | KrN-1 | W-2 | 0.10 | CL-1 | 20.0 | SL-1 | SL-4 | 70/30 | 0.30 | 0.65 |
| | KrN-2 | W-2 | 0.55 | CL-2 | 30.0 | SL-1 | SL-4 | 70/30 | 0.36 | 0.65 |
| | KrN-3 | W-2 | 0.02 | CL-3 | 25.0 | SL-1 | SL-3 | 60/40 | 0.77 | 0.60 |
| | KrN-4 | W-2 | 0.07 | CL-4 | 20.0 | SL-1 | SL-4 | 70/30 | 0.41 | 0.55 |
| | KrN-5 | W-4 | 0.02 | CL-5 | 23.0 | SL-1 | SL-5 | 60/40 | 0.36 | 0.60 |
| | KrN-6 | W-1 | 0.10 | CL-6 | 32.0 | SL-1 | SL-6 | 90/10 | 0.35 | 0.55 |
| | KrN-7 | W-3 | 0.55 | CL-1 | 24.0 | SL-1 | SL-5 | 70/30 | 0.32 | 0.70 |
| | KrN-8 | W-2 | 0.04 | CL-2 | 18.0 | SL-1 | SL-5 | 70/30 | 0.56 | 0.70 |
| | KrN-9 | W-2 | 0.03 | CL-2 | 15.0 | SL-1 | SL-5 | 70/30 | 0.72 | 0.65 |
| | KrN-10 | W-4 | 0.06 | CL-4 | 21.0 | SL-1 | SL-5 | 70/30 | 0.45 | 0.60 |
| | KrN-11 | W-1 | 0.06 | CL-4 | 20.0 | SL-1 | SL-4 | 70/30 | 0.58 | 0.55 |
| | KrN-12 | W-4 | 0.05 | CL-1 | 25.0 | SL-1 | SL-2 | 60/40 | 0.48 | 0.60 |
| | KrN-13 | W-3 | 0.55 | CL-1 | 24.0 | SL-1 | SL-4 | 60/40 | 0.76 | 0.55 |
| | KrN-14 | W-2 | 0.03 | CL-5 | 23.0 | SL-5 | SL-4 | 60/40 | 0.69 | 0.60 |
| Comparative Example | krn-1 | W-2 | 0.10 | CL-1 | 20.0 | SL-1 | SL-4 | 70/30 | 1.80 | 0.35 |
| | krn-2 | W-2 | 0.10 | CL-1 | 21.0 | SL-1 | SL-4 | 70/30 | 1.20 | 0.35 |
| | krn-3 | | | CL-1 | 23.0 | SL-1 | SL-4 | 70/30 | 2.5 | 0.40 |
| | krn-4 | W-5 | 0.10 | CL-1 | 24.0 | SL-1 | SL-4 | 70/30 | 1.22 | 0.35 |
| | krn-5 | W-6 | 0.10 | CL-1 | 25.0 | SL-1 | SL-4 | 70/30 | 1.30 | 0.40 |

It is seen from the results in Table 7 that the photosensitive composition of the present invention has excellent performance ensuring less development defect and wide focus margin also as a negative resist composition in the exposure with a KrF excimer laser.

Examples EBP-1 to EBP-14 and Comparative Examples ebp-1 to ebp-5

Preparation of Resist

The components shown in Table 6 were dissolved in a solvent, and the obtained solution was filtered through a 0.1- μm polytetrafluoroethylene filter to prepare a positive resist solution having a solid content concentration of 12 mass %. The positive resist solutions prepared were evaluated by the following methods, and the results are shown in Table 8.

<Evaluation of Resist>

The prepared positive resist solution was uniformly coated by a spin coater on a silicon substrate treated with hexamethyldisilazane, and dried under heating on a hot plate at 120° C. for 60 seconds to form a resist film having a thickness of 0.3 μm. This resist film was irradiated using an electron beam projection lithography system (accelerating voltage: 100 keV) manufactured by Nikon Corp. and immediately after the irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern.

<Focus Margin (μm)>

The resist pattern used for the evaluation is a dense pattern with a 100-nm line and space ratio of 1:1. The exposure amount (Eopt) for reproducing the mask size above was determined by a length-measuring SEM (S-9260) manufactured by Hitachi, Ltd., the depth of focus (referred to as "DOF") allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 100-nm pattern was exposed at 78 portions in the wafer plane with the above-described exposure amount of Eopt by the same method as above. At this time, the area of exposure was 205 cm$^2$ in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm$^2$).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

TABLE 8

| | | EB (Positive) | |
|---|---|---|---|
| | | Evaluation Results | |
| | | Development Defect (pieces) | Focus Margin (μm) |
| Example | EBP-1 | 0.76 | 0.55 |
| | EBP-2 | 0.76 | 0.60 |
| | EBP-3 | 0.33 | 0.55 |
| | EBP-4 | 0.38 | 0.70 |
| | EBP-5 | 0.74 | 0.70 |
| | EBP-6 | 0.63 | 0.60 |
| | EBP-7 | 0.29 | 0.55 |
| | EBP-8 | 0.56 | 0.60 |
| | EBP-9 | 0.63 | 0.65 |
| | EBP-10 | 0.68 | 0.60 |
| | EBP-11 | 0.33 | 0.55 |
| | EBP-12 | 0.54 | 0.60 |
| | EBP-13 | 0.52 | 0.60 |
| | EBP-14 | 0.66 | 0.60 |
| Comparative Example | ebp-1 | 1.2 | 0.40 |
| | ebp-2 | 1.3 | 0.35 |
| | ebp-3 | 1.4 | 0.40 |
| | ebp-4 | 1.9 | 0.35 |
| | ebp-5 | 1.2 | 0.3 |

It is seen from the results in Table 8 that the photosensitive composition of the present invention has excellent performance ensuring less development defect and wide focus margin also as a positive resist composition in the irradiation with an electron beam.

Examples EBN-1 to EBN-14 and Comparative Examples ebn-1 to ebn-5

Preparation of Resist

The components shown in Table 7 were dissolved in a solvent, and the resulting solution was filtered through a 0.1-μm polytetrafluoroethylene filter to prepare a negative resist solution having a solid content concentration of 12 mass %. The prepared negative resist solutions were evaluated by the following methods, and the results are shown in Table 9.

<Evaluation of Resist>

The prepared negative resist solution was uniformly coated by a spin coater on a silicon substrate treated with hexamethyldisilazane, and dried under heating on a hot plate at 120° C. for 60 seconds to form a resist film having a thickness of 0.3 μm. This resist film was irradiated using an electron beam projection lithography system (accelerating voltage: 100 keV) manufactured by Nikon Corp. and immediately after the irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern.

<Focus Margin (μm)>

The resist pattern used for the evaluation is a dense pattern with a 100-nm line and space ratio of 1:1. The exposure amount (Eopt) for reproducing the mask size above was determined by a length-measuring SEM (S-9260) manufactured by Hitachi, Ltd., the depth of focus (referred to as "DOF") allowing for reproduction of a line width of 90 nm±10% with the Eopt above at the fluctuation of focus was measured, and the range thereof was used as the DOF value (μm). Also, when the pattern film thickness was decreased by 5% or more from the film thickness (160 nm) at the resist coating, this was judged as film loss and even if the pattern line width was within 90 nm±10%, it was decided that the target pattern line width was not reproduced.

<Development Defect>

A 100-nm pattern was exposed at 78 portions in the wafer plane with the above-described exposure amount of Eopt by the same method as above. At this time, the area of exposure was 205 cm$^2$ in total. The number of development defects in the obtained wafer with a pattern was measured by KLA-2360 manufactured by KLA-Tencor Corp., and the value obtained by dividing the measured numerical value by the area of exposure was defined as the number of development defects (pieces/cm$^2$).

When the number of development defects is 1 or more, this is in the impractical level. The value of 1 or less denotes the improvement. The improvement level of 1 or less indicates that the improvement increases in the order of a value from 0.8 to less than 1, a value from 0.6 to less than 0.8, a value from 0.4 to less than 0.6, and a value from 0.2 to less than 0.4.

TABLE 9

| | | EB (Negative) | |
|---|---|---|---|
| | | Evaluation Results | |
| | | Development Defect (pieces) | Focus Margin (μm) |
| Example | EBN-1 | 0.74 | 0.60 |
| | EBN-2 | 0.56 | 0.55 |
| | EBN-3 | 0.88 | 0.70 |

TABLE 9-continued

EB (Negative)

| | | Evaluation Results | |
|---|---|---|---|
| | | Development Defect (pieces) | Focus Margin (μm) |
| | EBN-4 | 0.63 | 0.70 |
| | EBN-5 | 0.35 | 0.60 |
| | EBN-6 | 0.23 | 0.70 |
| | EBN-7 | 0.59 | 0.60 |
| | EBN-8 | 0.89 | 0.55 |
| | EBN-9 | 0.59 | 0.70 |
| | EBN-10 | 0.23 | 0.70 |
| | EBN-11 | 0.33 | 0.55 |
| | EBN-12 | 0.38 | 0.60 |
| | EBN-13 | 0.63 | 0.60 |
| | EBN-14 | 0.24 | 0.60 |
| Comparative Example | ebn-1 | 1.6 | 0.40 |
| | ebn-2 | 1.6 | 0.35 |
| | ebn-3 | 1.2 | 0.35 |
| | ebn-4 | 1.6 | 0.40 |
| | ebn-5 | 1.3 | 0.35 |

It is seen from the results in Table 9 that the photosensitive composition of the present invention has excellent performance ensuring less development defect and wide focus margin also as a negative resist composition in the irradiation with an electron beam.

Examples EUVP-1 to EUVP-14 and Comparative Examples euvp-1 to euvp-5

The components shown in Table 6 were dissolved in a solvent, and the resulting solution was filtered through a 0.1-μm polytetrafluoroethylene filter to prepare a positive resist solution having a solid content concentration of 8 mass %. The prepared negative resist solutions were evaluated as follows.

<Evaluation of Resist>

The prepared positive resist solution was uniformly coated by a spin coater on a silicon substrate treated with hexamethyldisilazane, and dried under heating on a hot plate at 120° C. for 60 seconds to form a resist film of 0.15 μm. The resist film obtained was subjected to surface exposure using EUV light (wavelength: 13 nm) by changing the exposure amount in steps of 0.5 mJ in the range from 0 to 10.0 mJ and then baked at 110° C. for 90 seconds. Thereafter, the dissolution rate at each exposure amount was measured using an aqueous 2.38 mass % tetramethylammonium hydroxide (TMAH) solution to obtain a sensitivity curve. The exposure amount when the dissolution rate of the resist was saturated on this sensitivity curve was defined as the sensitivity and also, the dissolution contrast (γ value) was calculated from the gradient in the straight line part of the sensitivity curve. As the γ value is larger, the dissolution contrast is more excellent.

The evaluation results are shown in Table 10 below.

TABLE 10

EUV

| | | Evaluation Results | |
|---|---|---|---|
| | | Sensitivity (mJ/cm$^2$) | γ Value |
| Example | EUVP-1 | 2.1 | 11.4 |
| | EUVP-2 | 1.9 | 10.1 |
| | EUVP-3 | 2.3 | 11.9 |
| | EUVP-4 | 2.1 | 11.6 |
| | EUVP-5 | 2.4 | 10.5 |
| | EUVP-6 | 2.3 | 12.2 |
| | EUVP-7 | 2.4 | 11.3 |
| | EUVP-8 | 2.1 | 11.2 |
| | EUVP-9 | 2.3 | 11.1 |
| | EUVP-10 | 2.0 | 12.0 |
| | EUVP-11 | 2.4 | 12.5 |
| | EUVP-12 | 1.9 | 10.0 |
| | EUVP-13 | 2.0 | 12.3 |
| | EUVP-14 | 2.0 | 12.7 |
| Comparative Example | euvp-1 | 3.5 | 7.30 |
| | euvp-2 | 3.6 | 7.00 |
| | euvp-3 | 3.0 | 9.50 |
| | euvp-4 | 3.0 | 9.50 |
| | euvp-5 | 3.2 | 9.50 |

It is seen from the results in Table 10 that in the characteristic evaluation by the irradiation with EUV light, the composition of the present invention exhibits high sensitivity and high contrast and is excellent as compared with the compositions of Comparative Examples.

(Immersion Exposure)

<Preparation of Resist>

The resist components of each of Examples Ar-1 to Ar-30 were dissolved in a solvent to prepare a solution having a solid content concentration of 7 mass %, and this solution was filtered through a 0.1-μm polyethylene filter to prepare a positive resist solution. The prepared positive resist solutions were evaluated by the following methods.

<Evaluation of Resolution>

An organic antireflection film ARC29A (produced by Nissan Chemical Industries, Ltd.) was coated on a silicon wafer and baked at 205° C. for 60 seconds to form a 78-nm antireflection film. On this film, the resist composition prepared was coated and baked at 115° C. for 60 seconds to form a 130-nm resist film. The thus-obtained wafer was subjected to two-beam interference exposure (wet exposure) using pure water as the immersion liquid. In the two-beam interference exposure (wet exposure), as shown in the drawing, the wafer 10 with an antireflection film and a resist film was exposed through a prism 8 and an immersion liquid (pure water) 9 by using a laser 1, a diaphragm 2, a shutter 3, three reflecting mirrors 4, 5 and 6, and a condenser lens 7. The wavelength of the laser 1 used was 193 nm, and a prism 8 of forming a 65-nm line-and-space pattern was used. Immediately after the exposure, the resist film was heated at 115° C. for 90 seconds. Furthermore, the resist film was developed with an aqueous tetramethylammonium hydroxide solution (2.38 mass %) for 60 seconds, rinsed with pure water and spin-dried. The obtained resist pattern was observed by a scanning electron microscope (S-9260, manufactured by Hitachi Ltd.), as a result, a 65-nm line-and-space pattern was resolved.

It is apparent that the photosensitive composition of the present invention exhibits a good image-forming capability also in the exposure through an immersion liquid.

This application is based on Japanese Patent application JP 2006-263216, filed Sep. 27, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A photosensitive composition comprising:
a compound capable of generating an acid upon irradiation with actinic rays or radiation;
a basic compound represented by the following formula (I-a);
a basic compound represented by the following formula (I-b); and
a surfactant represented by the following formula (II):

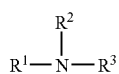
(I-a)

wherein $R^1$, $R^2$ and $R^3$ each independently represents a hydrogen atom, an alkyl group, a cycloalkyl group, an aryl group or a heteroaryl group, and at least one of $R^1$, $R^2$ and $R^3$ have a polar group;

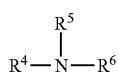
(I-b)

wherein $R^4$, $R^5$ and $R^6$ each independently represents a hydrogen atom, an alkyl group, a cycloalkyl group or an aryl group, and all of $R^4$, $R^5$ and $R^6$ have no polar group;

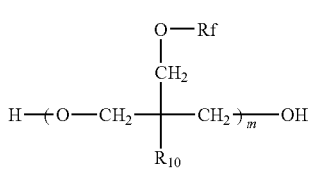
(II)

wherein $R_{10}$ represents a hydrogen atom or an alkyl group, Rf represents a fluoroalkyl group or a fluoroalkyl-carbonyl group, and m represents an integer of from 1 to 50; and
a resin soluble in an alkali developer and an acid crosslinking agent capable of crosslinking with the resin soluble in an alkali developer under an action of an acid.

2. The photosensitive composition as claimed in claim 1, wherein the basic compound represented by the formula (I-a) is a compound represented by the following formula (I-a1):

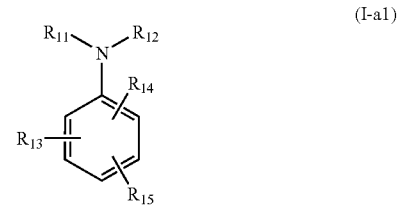
(I-a1)

wherein $R^{11}$ and $R^{12}$ each independently represents a hydrogen atom, an alkyl group, a cycloalkyl group, an aryl group or a heteroaryl group, $R^{13}$, $R^{14}$ and $R^{15}$ each independently represents a hydrogen atom, an alkyl group, a cycloalkyl group or an aryl group, and at least one of $R^{11}$, $R^{12}$, $R^{13}$, $R^{14}$ and $R^{15}$ have a polar group.

3. The photosensitive composition as claimed in claim 1, wherein the crosslinking agent is a hydroxymethyl, alkoxymethyl or acyloxymethyl form of a phenol derivative.

4. The photosensitive composition as claimed in claim 1, wherein the crosslinking agent is a compound having an N-hydroxymethyl group, an N-alkoxymethyl group or an N-acyloxymethyl group.

5. The photosensitive composition as claimed in claim 1, wherein the resin is selected from an o-polyhydroxystyrene, an m-polyhydroxystyrene, a p-polyhydroxystyrene, and a copolymer thereof.

6. A resin film, which is formed with the photosensitive composition as claimed in claim 1.

7. A pattern forming method comprising: forming a photosensitive film with the photosensitive composition as claimed in claim 1; and exposing and developing the photosensitive film.

8. A photosensitive composition comprising:
a compound capable of generating an acid upon irradiation with actinic rays or radiation;
a basic compound represented by the following formula (I-a);
a basic compound represented by the following formula (I-b); and
a surfactant represented by the following formula (II):

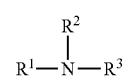
(I-a)

wherein $R^1$, $R^2$ and $R^3$ each independently represents a hydrogen atom, an alkyl group, a cycloalkyl group, an aryl group or a heteroaryl group, and at least one of $R^1$, $R^2$ and $R^3$ have a polar group;

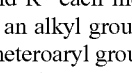
(I-b)

wherein $R^4$, $R^5$ and $R^6$ each independently represents a hydrogen atom, an alkyl group, a cycloalkyl group or an aryl group, and all of $R^4$, $R^5$ and $R^6$ have no polar group;

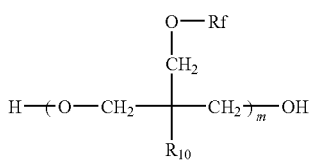

(II)

wherein $R_{10}$ represents a hydrogen atom or an alkyl group, Rf represents a fluoroalkyl group or a fluoroalkyl-carbonyl group, and m represents an integer of from 1 to 50;

a resin having a hydroxystyrene structural unit and being capable of decomposing under an action of an acid to increase a solubility in an alkali developer; and wherein the resin has 50 mol% or more of the hydroxystyrene structural unit.

9. The photosensitive composition as claimed in claim 8, wherein the content of the group capable of decomposing under the action of an acid expressed by B/(B+S) using the number (B) of acid-decomposable groups in the resin and the number (S) of alkali-soluble groups not protected by a group which desorbs by the effect of an acid is from 0.01 to 0.7.

10. The photosensitive composition as claimed in claim 8, wherein the resin has repeating unit having an acid-decomposable group, which is tertiary alkyl (meth)acrylate.

11. The photosensitive composition as claimed in claim 8, wherein the resin has acetal group as an acid-decomposable group.

12. A resist film, is formed with the photosensitive composition as claimed in claim 8.

13. A pattern forming method comprising: forming a photosensitive film with the photosensitive composition as claimed in claim 8; and exposing and developing the photosensitive film.

* * * * *